(12) United States Patent
Hata et al.

(10) Patent No.: US 7,376,166 B2
(45) Date of Patent: May 20, 2008

(54) SEMICONDUCTOR LASER APPARATUS AND OPTICAL PICKUP APPARATUS

(75) Inventors: Masayuki Hata, Kadoma (JP); Yasuyuki Bessho, Uji (JP); Yasuhiko Nomura, Moriguchi (JP); Masayuki Shono, Hirakata (JP); Seiji Kajiyama, Gifu (JP); Yoichi Tsuchiya, Hashima (JP)

(73) Assignee: Sanyo Electric Co., Ltd., Osaka (JP)

( * ) Notice: Subject to any disclaimer, the term of this patent is extended or adjusted under 35 U.S.C. 154(b) by 63 days.

(21) Appl. No.: 11/387,061

(22) Filed: Mar. 23, 2006

(65) Prior Publication Data

US 2006/0251138 A1    Nov. 9, 2006

(30) Foreign Application Priority Data

Mar. 25, 2005    (JP)    ............... 2005-089784

(51) Int. Cl.
*H01S 5/00*    (2006.01)
(52) U.S. Cl. ............... 372/50.121; 372/50.12
(58) Field of Classification Search ............ 372/43.01, 372/50.121, 75, 44.011, 50.12, 36; 369/44.23
See application file for complete search history.

(56) References Cited

U.S. PATENT DOCUMENTS

| | | | |
|---|---|---|---|
| 5,493,554 A | | 2/1996 | Sasaki et al. |
| 5,987,043 A | * | 11/1999 | Brown et al. .................. 372/36 |
| 6,038,243 A | * | 3/2000 | Mogi ..................... 372/50.121 |
| 6,893,888 B2 | * | 5/2005 | Nemoto ........................ 438/22 |
| 6,956,322 B2 | | 10/2005 | Ikeda |
| 2001/0050531 A1 | | 12/2001 | Ikeda |
| 2004/0109481 A1 | | 6/2004 | Ikeda |
| 2005/0254391 A1 | | 11/2005 | Nagatomi et al. |
| 2005/0286590 A1 | | 12/2005 | Lee |
| 2006/0083147 A1 | | 4/2006 | Nagatomi et al. |

FOREIGN PATENT DOCUMENTS

JP    06-131688    5/1994

(Continued)

OTHER PUBLICATIONS

"World First CD/DVD/Blue-ray Disc Compatible Three-Wavelength Laser" CX-PAL vol. 62, pp. 8-11.
Hashizu, T., et al., "Three-Wavelength Semiconductor Laser for Optical Disc System" Digest of Technical Papers—25th Annual Meeting of the Laser Society of Japan, Jan. 20-21, 2005, pp. 232-233.

*Primary Examiner*—Minsun Oh Harvey
*Assistant Examiner*—Tuan N Nguyen
(74) *Attorney, Agent, or Firm*—McDermott Will & Emery LLP

(57) ABSTRACT

A blue-violet emission point, an infrared emission point, and a red emission point in a semiconductor laser apparatus are arranged so as to be arranged in this order on a substantially straight line along a first direction. A blue-violet laser beam emitted from the blue-violet emission point and a red laser beam emitted from the red emission point are incident on an optical disk by an optical system comprising a polarizing beam splitter, a collimator lens, a beam expander, a λ/4 plate, an objective lens, a cylindrical lens, and an optical disk, is returned from the optical disk, and is introduced into an photodetector. The infrared laser beam emitted from the infrared emission point is incident on the optical disk by the optical system, is returned from the optical disk, and is introduced into the photodetector.

11 Claims, 23 Drawing Sheets

FOREIGN PATENT DOCUMENTS

| JP | 2001-230502 | 8/2001 |
| JP | 2005-327387 | 11/2005 |
| JP | 2006-13414 | 1/2006 |
| JP | 2006-120189 | 5/2006 |

* cited by examiner

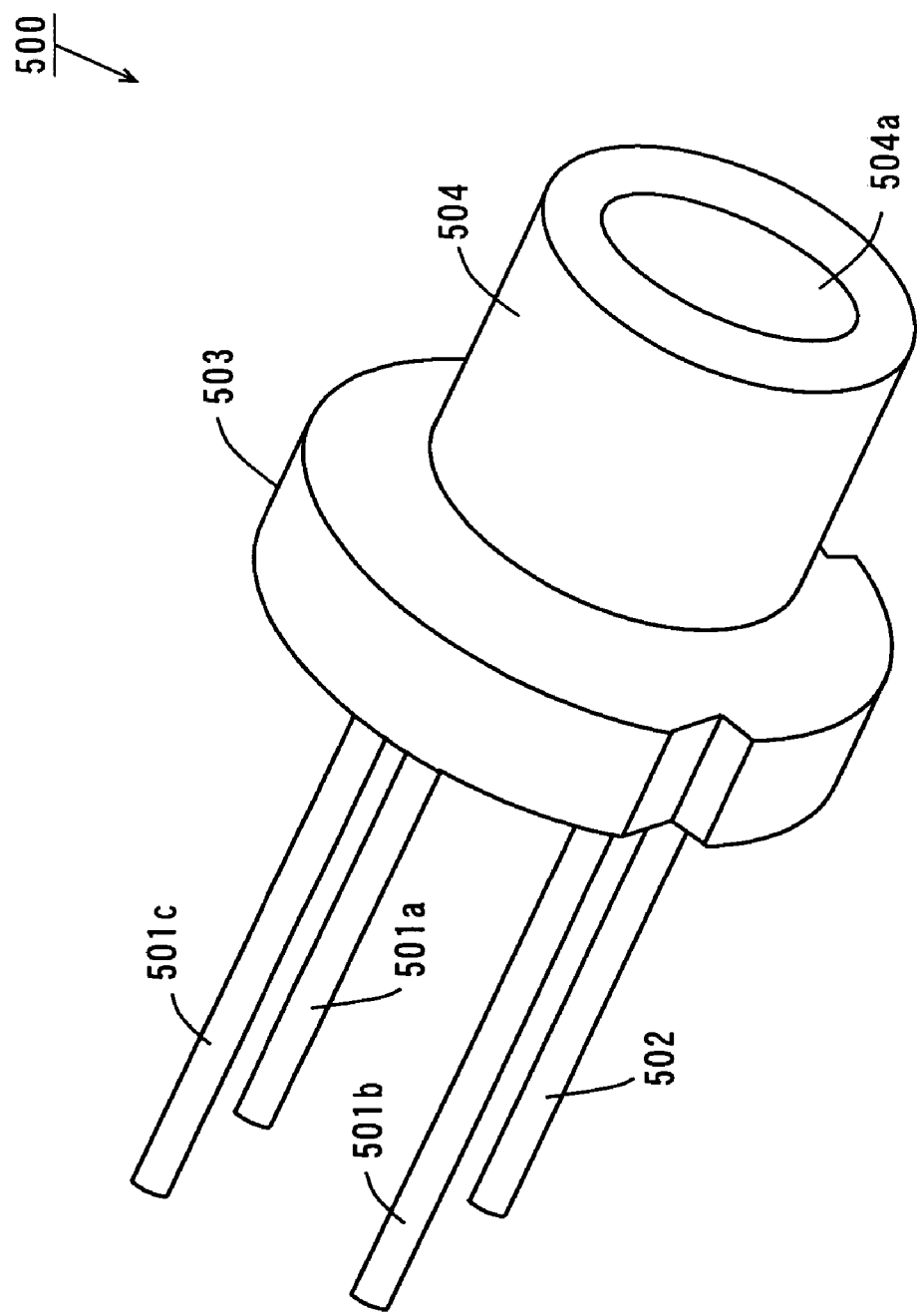
F I G. 3

FIG. 14
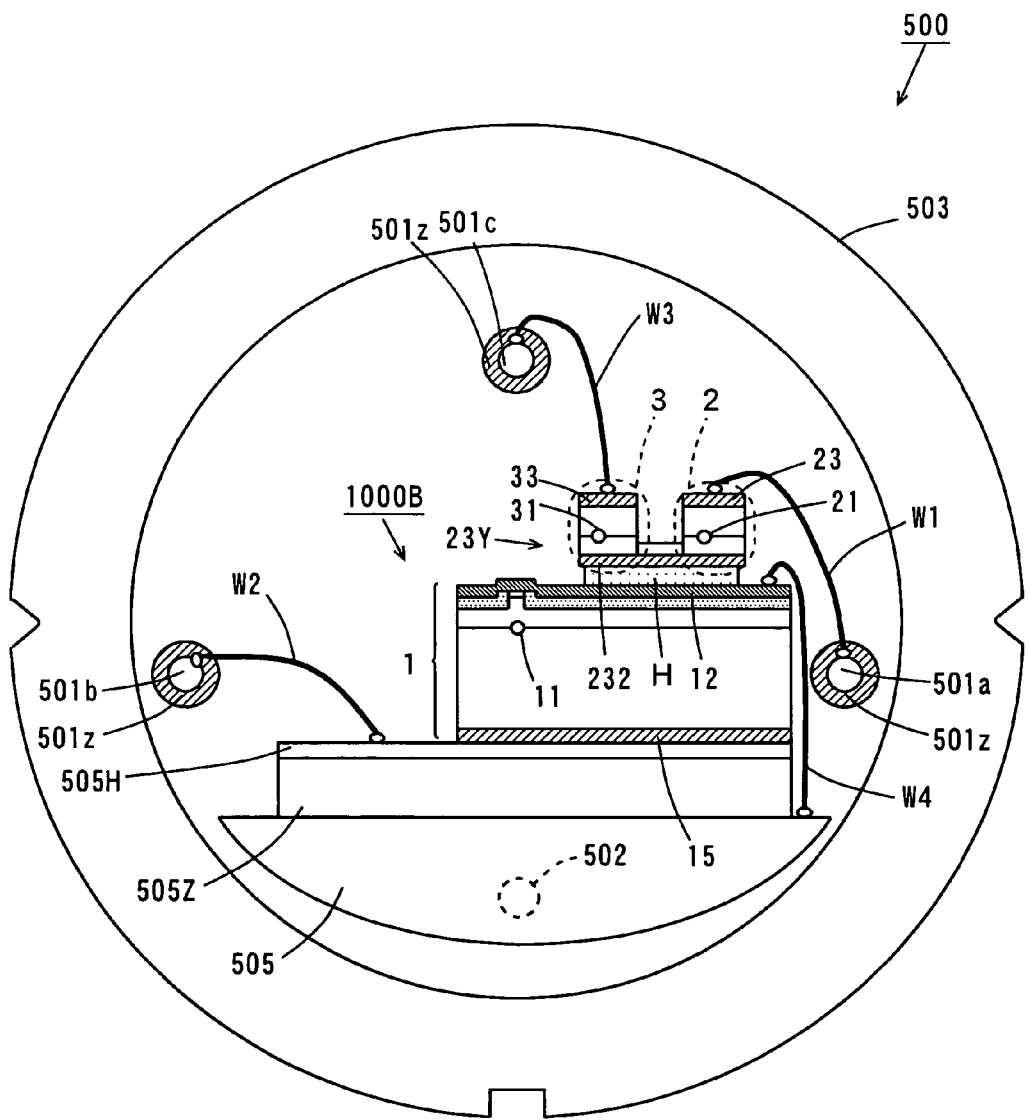
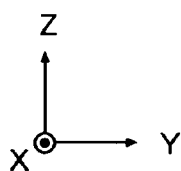

SEMICONDUCTOR LASER APPARATUS AND OPTICAL PICKUP APPARATUS

BACKGROUND OF THE INVENTION

1. Field of the Invention

The present invention relates to a semiconductor laser apparatus capable of emitting a plurality of light beams respectively having different wavelengths and an optical pickup apparatus comprising the same.

2. Description of the Background Art

Conventionally, semiconductor laser devices that emit infrared light beams having wavelengths of approximately 780 nm (infrared semiconductor laser devices) have been used as light sources for compact disk (CD) drives. Further, semiconductor laser devices that emit red light beams having wavelengths of approximately 650 nm as light sources (red semiconductor laser devices) have been used for conventional digital versatile disk (DVD) drives.

On the other hand, DVDs capable of recording and reproduction using blue-violet light beams having wavelengths of approximately 405 nm have been developed in recent years. In order to record and reproduce such DVDs, DVD drives using semiconductor laser devices that emit blue-violet light beams having wavelengths of approximately 405 nm (blue-violet semiconductor laser devices) have been also simultaneously developed. In these DVD drives, compatibilities with conventional CDs and DVDs are required.

In this case, compatibilities with conventional CDs, DVDs, and new DVDs are realized by a method of providing a plurality of optical pickup apparatuses that respectively emit an infrared light beam, a red light beam, and a blue-violet light beam to the DVD drives or a method of providing an infrared semiconductor laser device, a red semiconductor laser device and a blue-violet semiconductor laser device within one optical pickup apparatus. Since the number of components is increased in these methods, however, it is difficult to miniaturize the DVD drives, simplify the configurations, and reduce the costs.

In order to thus prevent the number of components from being increased, semiconductor laser devices in which infrared semiconductor laser devices and red semiconductor laser devices are integrated into one chips have been put to practical use.

Both the infrared semiconductor laser devices and the red semiconductor laser devices can be integrated into one chips because they are formed on GaAs substrates. On the other hand, the blue-violet semiconductor laser devices are not formed on GaAs substrates, so that it is significantly difficult to integrate both the blue-violet semiconductor laser devices, together with the infrared semiconductor laser devices and the red the semiconductor laser devices, into one chips.

Therefore, a light emitting apparatus having a configuration in which an infrared semiconductor laser device and a red semiconductor laser device are formed on the same chip to manufacture a monolithic red/infrared semiconductor laser device, a blue-violet semiconductor laser device is formed into separate chips, and the chips of the blue-violet semiconductor laser device and the chips of the monolithic red/infrared semiconductor laser device are stacked has been proposed (see JP 2001-230502 A, for example).

In a case where the light emitting apparatus is mounted within an optical pickup apparatus, spaces respectively occupied by the blue-violet semiconductor laser device, the infrared semiconductor laser device, and the red semiconductor laser device in the optical pickup apparatus are reduced.

In the above-mentioned light emitting apparatus, respective emission points of the semiconductor laser devices are spaced apart from one another. Consequently, it is preferable that the optical pickup apparatus containing the plurality of semiconductor laser devices is provided with an optical system and a photodetector corresponding to each of the semiconductor laser devices. In this case, it is possible to accurately introduce light beams emitted from the plurality of semiconductor laser devices into the optical recording medium as well as to accurately introduce light beams reflected from the optical recording medium into the light receiving device. When the optical pickup apparatus is provided with the optical system and the photodetector corresponding to each of the semiconductor laser devices, however, the size of the optical pickup apparatus is increased.

In JP 2001-230502 A, an example in which a light emitting apparatus comprising a blue-violet semiconductor laser device, an infrared semiconductor laser device, and a red semiconductor laser device is mounted within an optical disk recording/reproducing apparatus provided with an optical system and a photodetector that are common among the three semiconductor laser devices is illustrated.

However, optical paths of laser beams respectively emitted from the blue-violet semiconductor laser device, the red semiconductor laser device, and the infrared semiconductor laser device do not coincide with one another. In order to carry out accurate signal reproduction, tracking control, focus control, and tilt control, therefore, an optical disk recording/reproducing apparatus must be actually provided with three photodetectors respectively corresponding to three laser beams. Consequently, it is difficult to miniaturize the optical disk recording/reproducing apparatus.

SUMMARY OF THE INVENTION

An object of the present invention is to provide a semiconductor laser apparatus capable of miniaturizing an optical pickup apparatus.

Another object of the present invention is to provide an optical pickup apparatus that can be miniaturized.

(1)

A semiconductor laser apparatus according to an aspect of the present invention comprises a first semiconductor laser device having a first emission point emitting a light beam having a first wavelength in a direction substantially parallel to a first direction; a second semiconductor laser device having a second emission point emitting a light beam having a second wavelength different from a natural number times the first wavelength in the direction substantially parallel to the first direction; and a third semiconductor laser device having a third emission point emitting a light beam having a third wavelength substantially equal to a natural number times the first wavelength in the direction substantially parallel to the first direction, the distance between the first emission point and the third emission point being shorter than at least one of the distance between the first emission point and the second emission point and the distance between the second emission point and the third emission point on a first plane perpendicular to the first direction.

In the semiconductor laser apparatus, the light beam having the first wavelength is emitted in the direction substantially parallel to the first direction from the first emission point in the first semiconductor laser device, the light beam having the second wavelength different from the natural number times the first wavelength in the direction substantially parallel to the first direction from the second emission point in the second semiconductor laser device, and the light beam having the third wavelength nearly equal to the natural number times the first wavelength in the direction substantially parallel to the first direction from the third emission point in the third semiconductor laser device.

Because the third wavelength is substantially equal to the natural number times the first wavelength, a diffraction efficiency in a case where the light beam having the first wavelength is incident on a diffraction grating and a diffraction efficiency in a case where the light beam having the third wavelength is incident on a diffraction grating can substantially be equalized. Then, because the second wavelength differs from the natural number times the first wavelength, a diffraction efficiency in a case where the light beam having the first wavelength is incident on a diffraction grating and a diffraction efficiency in a case where the light beam having the second wavelength is incident on a diffraction grating differ from each other. Therefore, when a first-order diffracted light beam of the second semiconductor laser beam is enhanced, zeroth-order diffracted light beams of the first semiconductor laser beam and the third semiconductor laser beam can simultaneously be enhanced by adjustment of height of the diffraction grating.

Here, the first emission point and the third emission point exist at different positions, so that an optical path of the light beam having the first wavelength and an optical path of the light beam having the third wavelength do not accurately coincide with each other.

In a case where the semiconductor laser apparatus is used for an optical pickup apparatus, therefore, the optical pickup apparatus must be provided with a first photodetector that receives the light beam having the first wavelength and a second photodetector that receives the light beam having the third wavelength.

On the other hand, the light beam having the second wavelength is incident on the diffraction grating, so that the light beam having the second wavelength is introduced into one of the first and second photodetectors. Consequently, the light beams respectively having the first, second, and third wavelengths can be received by the first and second photodetectors.

In this case, on the first plane, the distance between the first emission point and the third emission point is shorter than at least one of the distance between the first emission point and the second emission point and the distance between the second emission point and the third emission point, so that the distance between the optical path of the light beam having the first wavelength and the optical path of the light beam having the third wavelength is shorter than at least one of the distance between the optical path of the light beam having the first wavelength and the optical path of the light beam having the second wavelength and the distance between the optical path of the light beam having the second wavelength and the optical path of the light beam having the third wavelength.

Thus, within the optical pickup apparatus, the first and second photodetectors can be arranged in close proximity to each other. As a result, an arrangement space of the first and second photodetectors in the optical pickup apparatus is reduced, so that the optical pickup apparatus can be miniaturized.

(2)

The first, second, and third emission points may be arranged along a second direction crossing the first direction, and the third emission point may be positioned between the first emission point and the second emission point. In this case, the first, third, and second emission points are arranged in this order on a substantially straight line along the second direction. In a case where the semiconductor laser apparatus is used for the optical pickup apparatus, therefore, the optical pickup apparatus is easy to design.

(3)

The first semiconductor laser device may comprise a first substrate, and the second direction may be substantially parallel to one surface of the first substrate. In this case, the first emission point, the third emission point, and the second emission point are arranged along a straight line substantially parallel to one surface of the first substrate. In a case where the semiconductor laser apparatus is used for the optical pickup apparatus, therefore, the optical pickup apparatus is easy to design.

(4)

The second and third semiconductor laser devices may be joined to the first semiconductor laser device. In this case, the first, second, and third semiconductor laser devices can be integrated. Thus, the semiconductor laser apparatus can be miniaturized.

(5)

The first semiconductor laser device may comprise a first semiconductor layer having the first emission point and a first electrode formed on the first semiconductor layer, the second semiconductor laser device may comprise a second semiconductor layer having the second emission point and a second electrode formed on the second semiconductor layer, the third semiconductor laser device may comprise a third semiconductor layer having the third emission point and a third electrode formed on the third semiconductor layer, and the second and third electrodes may be joined to the first electrode.

In this case, the respective distances between the first emission point and the second and third emission points can be shortened in a direction perpendicular to the first semiconductor layer. As a result, the first, second, and third emission points are easy to arrange on a substantially straight line in a direction parallel to the first semiconductor layer.

(6)

The second and third electrodes may be joined to the first electrode with an insulating layer sandwiched therebetween. This allows the first, second, and third electrodes to be electrically isolated from one another. Thus, arbitrary voltages can be respectively applied to the first, second, and third electrodes. Consequently, a system for driving the first, second, and third semiconductor laser devices can be arbitrarily selected.

(7)

There may be provided a connecting portion that connects the second semiconductor laser device and the third semiconductor laser device to each other. In this case, the second semiconductor laser device and the third semiconductor laser device are connected to each other by the connecting portion, so that the second and third emission points are easy to position with respect to the first emission point.

(8)

There may be provided a submount having one surface parallel to the second direction, and the first, second, and third semiconductor laser devices may be joined to one surface of the submount. In this case, the first, second, and third semiconductor laser devices are joined to one surface of the submount, so that the first, second, and third emission points can be easily arranged on a substantially straight line on the one surface of the submount. In a case where the semiconductor laser apparatus is used for the optical pickup apparatus, therefore, the optical pickup apparatus is easy to design.

(9)

The light beam having the first wavelength may be a blue-violet light beam, the light beam having the second wavelength may be a red light beam, and the light beam having the third wavelength may be an infrared light beam. In this case, the respective light beams in a plurality of colors (wavelengths) can be emitted from the one semiconductor laser apparatus.

(10)

The first semiconductor layer may be composed of a nitride based semiconductor. In this case, the first semiconductor laser device may emit the blue-violet light beam.

The second semiconductor layer may be composed of a gallium indium tin based semiconductor. In this case, the second semiconductor laser device can emit the red light beam.

The third semiconductor layer may be composed of a gallium indium phosphide based semiconductor. In this case, the third semiconductor laser device can emit the infrared light beam.

(11)

An optical pickup apparatus according to another aspect of the present invention is an optical pickup apparatus that irradiates a light beam onto an optical recording medium and detects the light beam returned from the optical recording medium, comprising a semiconductor laser apparatus comprising a first semiconductor laser device having a first emission point emitting a light beam having a first wavelength in a direction substantially parallel to a first direction, a second semiconductor laser device having a second emission point emitting a light beam having a second wavelength different from a natural number times the first wavelength in the direction substantially parallel to the first direction, and a third semiconductor laser device having a third emission point emitting a light beam having a third wavelength substantially equal to a natural number times the first wavelength in the direction substantially parallel to the first direction, the distance between the first emission point and the third emission point being shorter than at least one of the distance between the first emission point and the second emission point and the distance between the second emission point and the third emission point on a first plane perpendicular to the first direction.

In the optical pickup apparatus, the light beam having the first, second, or third wavelength is selectively emitted from the semiconductor laser apparatus. Here, the semiconductor laser apparatus allows the light beams respectively having the first, second, and third wavelengths to be introduced into two photodetectors. Consequently, the optical pickup apparatus need not be provided with three photodetectors respectively corresponding to the light beams having the first, second, and third wavelengths. As a result, an arrangement space of the photodetectors in the optical pickup apparatus is reduced, so that the optical pickup apparatus can be miniaturized.

(12)

The optical pickup apparatus may further comprise first and second photodetectors, and an optical system that introduces the light beam having the first, second, or third wavelength emitted from the semiconductor laser apparatus to the optical recording medium and introduces the light beam having the first, second, or third wavelength returned from the optical recording medium to the first or second photodetector.

In this case, each of the light beams respectively having the first, second, and third wavelengths returned from the optical recording medium is introduced into either one of the first and second photodetectors. As a result, an arrangement space of the photodetectors in the optical pickup apparatus can be reduced, so that the optical pickup apparatus can be miniaturized.

(13)

The optical system may comprise a diffraction grating that transmits the light beams respectively having the first, second, and third wavelengths so as to introduce the light beams having the first and third wavelengths to the first and second photodetectors respectively and introduce the light beam having the second wavelength to one of the first and second photodetectors.

In this case, the light beam having the first, second, or third wavelength is selectively emitted from the semiconductor laser apparatus. The light beam having the first wavelength emitted from the semiconductor laser apparatus is introduced into the optical recording medium by the optical system, is returned from the optical recording medium, and is introduced into the first photodetector.

The light beam having the third wavelength emitted from the semiconductor laser apparatus is introduced into the optical recording medium by the optical system, is returned from the optical recording medium, and is introduced into the second photodetector. Further, the light beam having the second wavelength emitted from the semiconductor laser apparatus is introduced into the optical recording medium by the optical system, is returned from the optical recording medium, and is introduced into one of the first and second photodetectors.

Because the third wavelength is substantially equal to the natural number times the first wavelength, a diffraction efficiency in a case where the light beam having the first wavelength is transmitted through the diffraction grating and a diffraction efficiency in a case where the light beam having the third wavelength is transmitted through the diffraction grating can substantially be equalized. Then, because the second wavelength differs from the natural number times the first wavelength, a diffraction efficiency in a case where the light beam having the first wavelength is transmitted through the diffraction grating and a diffraction efficiency in a case where the light beam having the second wavelength is transmitted through the diffraction grating differ from each other. Therefore, when a first-order diffracted light beam of the second semiconductor laser beam is enhanced, zeroth-order diffracted light beams of the first semiconductor laser beam and the third semiconductor laser beam can simultaneously be enhanced by adjustment of height of the diffraction grating.

Here, the first emission point and the third emission point respectively exist at different positions, so that an optical path of the light beam having the first wavelength and an optical path of the light beam having the third wavelength do not accurately coincide with each other.

Therefore, the optical pickup apparatus according to the present invention may be provided with the first photodetector that receives the light beam having the first wavelength and the second photodetector that receives the third wavelength.

On the other hand, the light beam having the second wavelength is transmitted through the diffraction grating, so that the light beam having the second wavelength is introduced into one of the first and second photodetectors. Consequently, the light beams respectively having the first, second, and third wavelengths can be received by the first and second photodetectors. As a result, the optical pickup apparatus according to the present invention is provided with the two photodetectors for receiving the light beams respectively having the three wavelengths, i.e., the first, second, and third wavelengths, so that the miniaturization thereof is realized.

On the first plane, the distance between the first emission point and the third emission point is shorter than at least one of the distance between the first emission point and the second emission point and the distance between the second emission point and the third emission point, so that the distance between the optical path of the light beam having the first wavelength and the optical path of the light beam having the third wavelength is shorter than at least one of the distance between the optical path of the light beam having the first wavelength and the optical path of the light beam having the second wavelength and the distance between the optical path of the light beam having the second wavelength and the optical path of the light beam having the third wavelength.

Thus, within the optical pickup apparatus, the first and second photodetectors can be arranged in close proximity to each other. As a result, an arrangement space of the first and second photodetectors in the optical pickup apparatus is reduced, so that the optical pickup apparatus can be miniaturized.

(14)

The semiconductor laser apparatus may be arranged such that the axis of the light beam having the first wavelength emitted from the first semiconductor laser device coincides with the optical axis of the optical system. In this case, the light beam having the first wavelength in the semiconductor laser apparatus is emitted along the optical axis of the optical system. Thus, efficiency in a case where the light beam having the first wavelength passes through the optical system can be improved, as compared with efficiency in a case where the light beams respectively having the second and third wavelengths pass through the optical system.

Other features, elements, characteristics, and advantages of the present invention will become more apparent from the following description of preferred embodiments of the present invention with reference to the attached drawings.

BRIEF DESCRIPTION OF THE DRAWINGS

FIG. 3 is a perspective view showing the appearance of a substantially round-shaped can package for laser devices on which the semiconductor laser apparatus shown in FIG. 1 is mounted;

FIG. 14 is a schematic front view showing a state where the semiconductor laser apparatus shown in FIG. 13 is mounted within the substantially round-shaped can package for laser devices shown in FIG. 3 to remove the cover;

DESCRIPTION OF THE PREFERRED EMBODIMENTS

A semiconductor laser apparatus according to an embodiment of the present invention and an optical pickup apparatus comprising the same will be described.

(1) First Embodiment

A semiconductor laser apparatus according to an embodiment of the present invention comprises a semiconductor laser device emitting a laser beam having a wavelength of approximately 405 nm (hereinafter referred to as a blue-violet semiconductor laser device), a semiconductor laser device emitting a laser beam having a wavelength of approximately 650 nm (hereinafter referred to as a red semiconductor laser device), and a semiconductor laser device emitting a laser beam having a wavelength of approximately 780 nm (hereinafter referred to as an infrared semiconductor laser device).

(a) Configuration of Semiconductor Laser Apparatus

Figure 1:
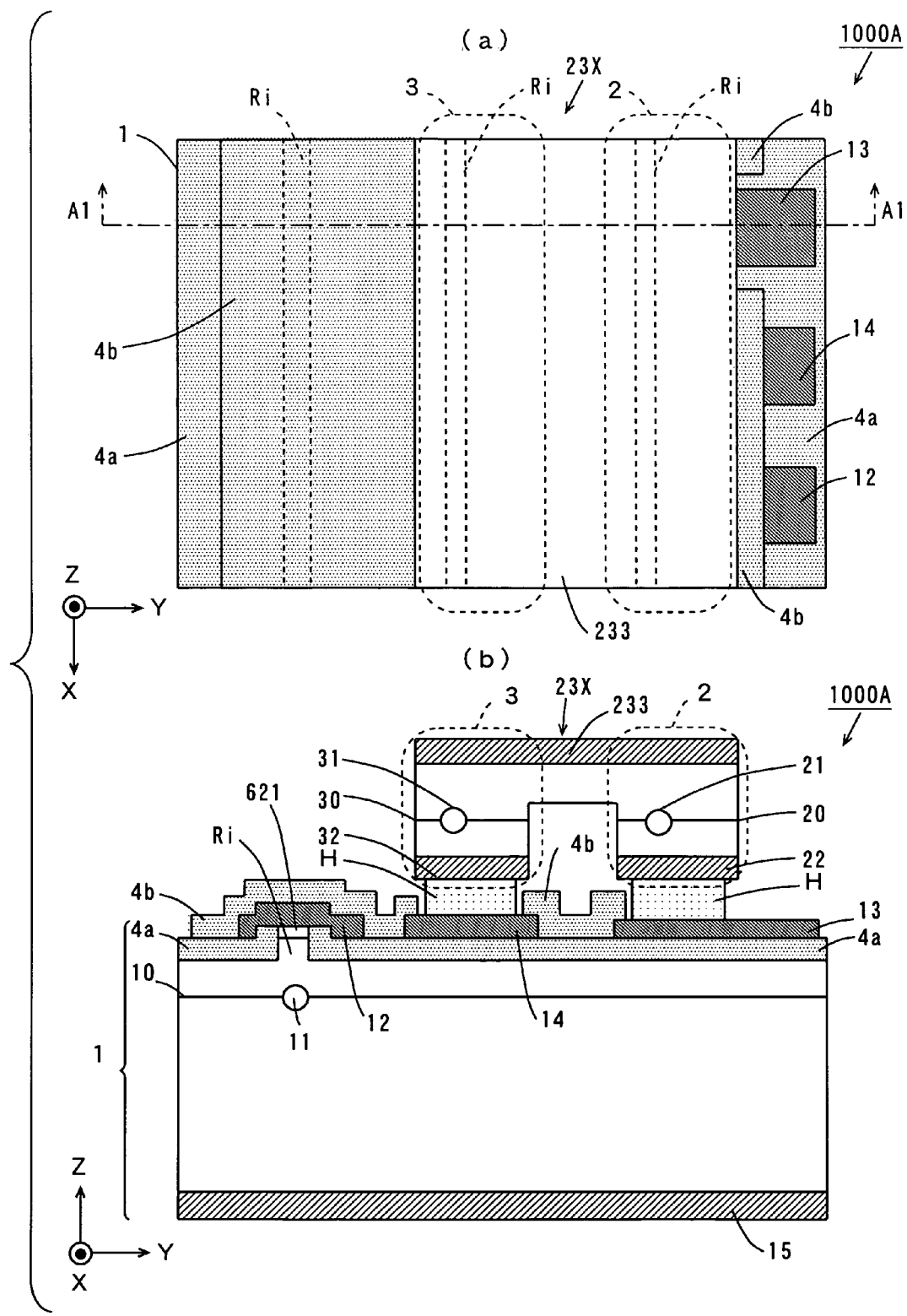
FIG. 1 is a schematic view for explaining the configuration of a semiconductor laser apparatus according to a first embodiment.
Figure 2:
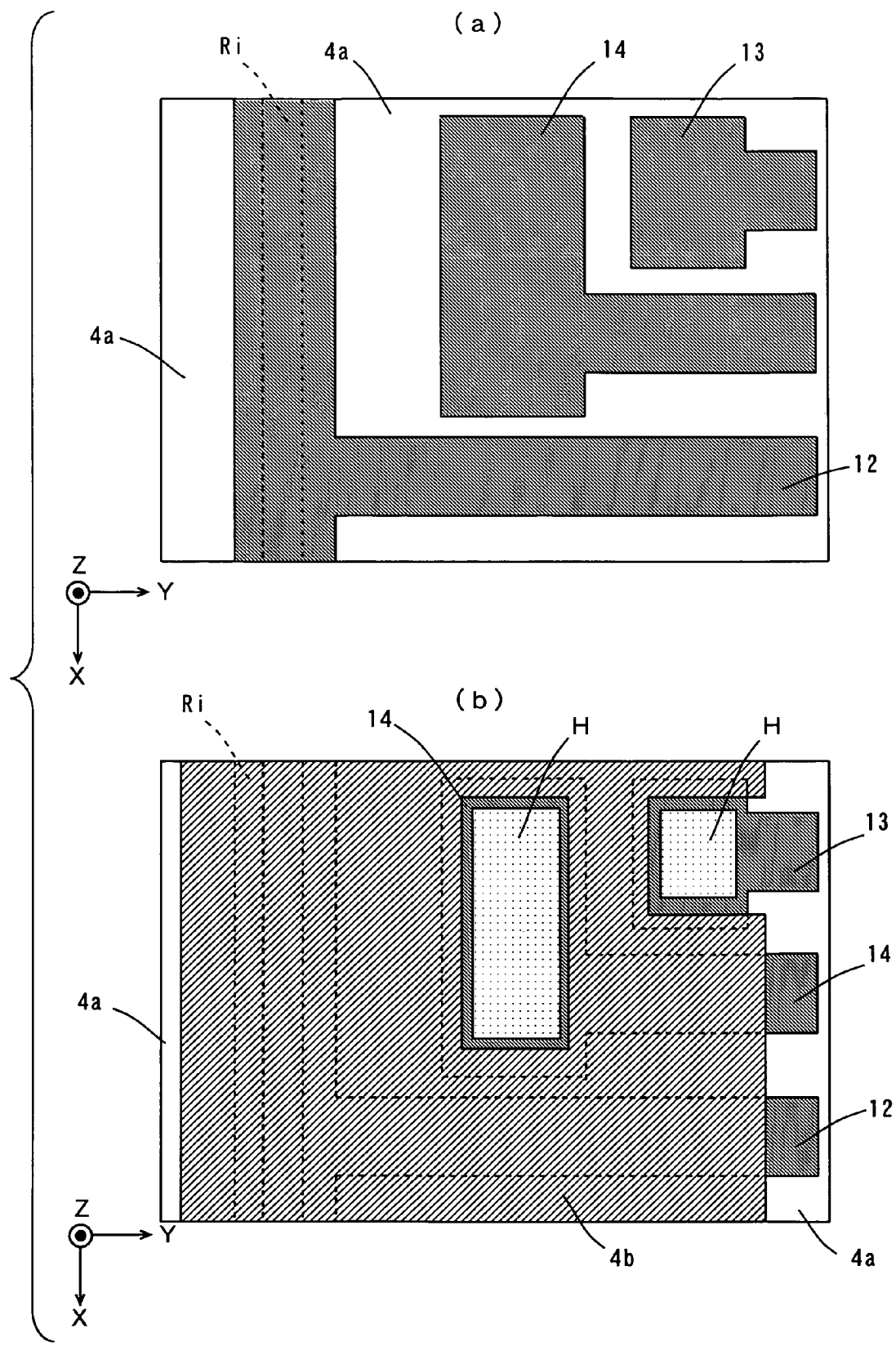
FIG. 2 is a schematic view of a junction plane of a blue-violet semiconductor laser device, a red semiconductor laser device, and an infrared semiconductor laser device in the semiconductor laser apparatus shown in FIG. 1.

FIG. 1 is a schematic view for explaining the configuration of a semiconductor laser apparatus according to a first embodiment. FIG. 1 (a) is a top view showing an example of the semiconductor laser apparatus according to the first embodiment, and FIG. 1 (b) is a cross-sectional view taken along a line A1-A1 shown in FIG. 1 (a). FIG. 2 is a schematic view of a junction plane of the blue-violet semiconductor laser device, the red semiconductor laser device, and the infrared semiconductor laser device in the semiconductor laser apparatus shown in FIG. 1.

In FIGS. 1 and 2, three directions that are perpendicular to one another, as indicated by arrows X, Y, and Z, are respectively taken as an X-direction, a Y-direction, and a Z-direction. The X-direction and the Y-direction are directions parallel to respective p-n junction interfaces 10, 20, and 30 of the blue-violet semiconductor laser device 1, the red semiconductor laser device 2, and the infrared semiconductor laser device 3, described later. The Z-direction is a direction perpendicular to the respective p-n junction interfaces 10, 20, and 30 of the blue-violet semiconductor laser device 1, the red semiconductor laser device 2, and the infrared semiconductor laser device 3.

As shown in FIGS. 1 (a) and 1 (b), a striped ridge Ri extending in the X-direction is formed on an upper surface of the blue-violet semiconductor laser device 1. The ridge Ri is positioned in an area offset from the center of the blue-violet semiconductor laser device 1 in the Y-direction. An insulating film 4a is formed so as to cover the upper surface of the blue-violet semiconductor laser device 1 on a side surface of the ridge Ri and on both sides of the ridge Ri. A p-type ohmic electrode 621 is formed on an upper surface of the ridge Ri.

A p-side pad electrode 12 is formed so as to cover an upper surface of the p-type ohmic electrode 621 and the insulating film 4a in the vicinity of the ridge Ri. An n-electrode 15 is formed on a lower surface of the blue-violet semiconductor laser device 1. A p-n junction interface 10 serving as a junction interface of a p-type semiconductor and an n-type semiconductor is formed in the blue-violet semiconductor laser device 1.

In the present embodiment, the red semiconductor laser device 2 and the infrared semiconductor laser device 3 are integrally formed. The red semiconductor laser device 2 and the infrared semiconductor laser device 3 that are integrally formed are referred to as a monolithic red/infrared semiconductor laser device 23X.

In the monolithic red/infrared semiconductor laser device 23X, the red semiconductor laser device 2 and the infrared semiconductor laser device 3 are formed on a common substrate. The details will be described later.

A common n-electrode 233 is formed on respective upper surfaces of the red semiconductor laser device 2 and the infrared semiconductor laser device 3. A p-side pad electrode 22 is formed on a lower surface of the red semiconductor laser device 2. The p-n junction interface 20 serving as a junction interface of a p-type semiconductor and an n-type semiconductor is formed in the red semiconductor laser device 2. A p-side pad electrode 32 is formed on a lower surface of the infrared semiconductor laser device 3. The p-n junction interface 30 serving as a junction interface of a p-type semiconductor and an n-type semiconductor is formed in the infrared semiconductor laser device 3.

As shown in FIG. 1 (b), a striped ridge extending in the X-direction is also formed in each of the red semiconductor laser device 2 and the infrared semiconductor laser 3, which is not illustrated. Consequently, a p-type ohmic electrode (not shown) is also formed on each of the ridges.

In the Y-direction, the monolithic red/infrared semiconductor laser device 23X is joined to the blue-violet semiconductor laser device 1 such that the infrared semiconductor laser device 3 is positioned in a substantially central portion of the blue-violet semiconductor laser device 1 and the red semiconductor laser device 2 is positioned on the opposite side of the ridge Ri in the blue-violet semiconductor laser device 1 with the infrared semiconductor laser device 3 used as a basis.

A junction of the blue-violet semiconductor laser device 1 and the monolithic red/infrared semiconductor laser device 23X will be described.

As shown in FIG. 2 (a), p-side pad electrodes 13 and 14 are formed in addition to the above-mentioned p-side pad electrode 12 on the insulating film 4a in the blue-violet semiconductor laser device 1.

The p-side pad electrode 12 extends in the X-direction along the ridge Ri in the blue-violet semiconductor laser device 1, and its part extends in the Y-direction.

The p-side pad electrode 14 is formed so as to be adjacent to the p-side pad electrode 12. The p-side pad electrode 14 extends in the X-direction in a substantially central portion of the blue-violet semiconductor laser device 1, and its part extends in the Y-direction, similarly to the p-side pad electrode 12.

The p-side pad electrode 13 is formed so as to be adjacent to the p-side pad electrode 14. The p-side pad electrode 13 extends in the X-direction in the vicinity of a corner of the blue-violet semiconductor laser device 1, and its part extends in the Y-direction, similarly to the p-side pad electrode 12.

The p-side pad electrodes 12, 13, and 14 are formed so as to be spaced apart from one another on the insulating film 4a. Thus, the p-side pad electrodes 12, 13, and 14 are electrically isolated from one another.

As shown in FIG. 2 (b), an insulating film 4b is formed in a predetermined pattern on the insulating film 4a and the p-side pad electrodes 12, 13 and 14. The insulating film 4b is formed such that respective one ends of the p-side pad electrodes 12, 13, and 14 extending in the Y-direction are exposed. Wires for driving the semiconductor laser devices are respectively bonded to the exposed one ends of the p-side pad electrodes 12, 13, and 14. Regions each having a width of approximately 100 μm and having a length of approximately 100 μm at the respective one ends of the p-side pad electrodes 12, 13, and 14 extending in the Y-direction are exposed.

The insulating film 4b is formed such that a portion of the p-side pad electrode 14 is exposed in the substantially central portion of the blue-violet semiconductor laser device 1. A solder film H composed of Au—Sn is formed in the exposed portion of the p-side pad electrode 14.

Furthermore, the insulating film 4b is formed such that a substantially central portion of the p-side pad electrode 13 is exposed. A solder film H composed of Au—Sn is also formed in the exposed portion of the p-side pad electrode 13.

The monolithic red/infrared semiconductor laser device 23X is joined to the blue-violet semiconductor laser device 1 shown in FIG. 1 such that the p-side pad electrode 22 in the red semiconductor laser device 2 is joined to the p-side pad electrode 13 with the solder film H sandwiched therebetween and the p-side pad electrode 32 in the infrared semiconductor laser device 3 is joined to the p-side pad electrode 14 with the solder film H sandwiched therebetween.

Thus, the p-side pad electrode 22 in the red semiconductor laser device 2 is electrically connected to the p-side pad electrode 13, and the p-side pad electrode 32 in the infrared semiconductor laser device 3 is electrically connected to the p-side pad electrode 14.

Since the monolithic red/infrared semiconductor laser device 23X is joined to the patterned insulating film 4b in the foregoing, the p-side pad electrode 32 in the infrared semiconductor laser device 3 is prevented from coming into contact with the p-side pad electrodes 12 and 13, and the p-side pad electrode 22 in the red semiconductor laser device 2 is prevented from coming into contact with the p-side pad electrodes 12 and 14.

A voltage is applied between the p-side pad electrode 12 and the n-electrode 15 in the blue-violet semiconductor laser device 1 so that a laser beam having a wavelength of approximately 405 nm is emitted in the X-direction from a region (hereinafter referred to as a blue-violet emission point) 11 below the ridge Ri on the p-n junction interface 10.

A voltage is applied between the p-side pad electrode 22 in the red semiconductor laser device 2 (the p-side pad electrode 13 on the blue-violet semiconductor laser device 1) and the common n-electrode 233 so that a laser beam having a wavelength of approximately 650 nm is emitted in the X-direction from a predetermined region (hereinafter referred to as a red emission point) 21 on the p-n junction interface 20.

A voltage is applied between the p-side pad electrode 32 in the infrared semiconductor laser device 3 (the p-side pad electrode 14 on the blue-violet semiconductor laser device 1) and the common n-electrode 233 so that a laser beam having a wavelength of approximately 780 nm is emitted in the X-direction from a predetermined region (hereinafter referred to as an infrared emission point) 31 on the p-n junction interface 30.

In the present embodiment, the infrared semiconductor laser device 3 and the red semiconductor laser device 2 are arranged in this order beside the ridge Ri in the blue-violet semiconductor laser device 1 in the Y-direction. Thus, the distance between the blue-violet emission point 11 and the red emission point 21 is longer than both the distance between the blue-violet emission point 11 and the infrared emission point 31 and the distance between the infrared emission point 31 and the red emission point 21. Further, in the Y-direction, the infrared emission point 31 is positioned between the blue-violet emission point 11 and the red emission point 21.

In the present embodiment, the distance between the blue-violet emission point 11 and the infrared emission point 31 in the Y-direction is adjusted to approximately 110 µm, for example. Further, the distance between the red emission point 21 and the infrared emission point 31 in the Y-direction is adjusted to approximately 90 µm, for example.

The width of the blue-violet semiconductor laser device 1 in the Y-direction is approximately 400 µm, for example. The width of the monolithic red/infrared semiconductor laser device 23X in the Y-direction is approximately 200 µm, for example.

The cross-sectional view of FIG. 1 (b) is enlarged in the Z-direction. Actually, the distance between the emission points in the Z-direction is significantly shorter than the distance between the emission points in the Y-direction. In the actual semiconductor laser apparatus 1000A, therefore, the blue-violet emission point 11, the red emission point 21, and the infrared emission point 31 are positioned on a substantially straight line along an axis parallel to the Y-direction.

(b) Effect of Semiconductor Laser Apparatus

As shown in FIG. 1 (a), in the semiconductor laser apparatus 1000A according to the present embodiment, respective one ends of the p-side pad electrodes 12, 13, and 14 extending in the Y-direction are exposed, projecting from a side surface of the monolithic red/infrared semiconductor laser device 23X in the Y-direction through an area between the blue-violet semiconductor laser device 1 and the monolithic red/infrared semiconductor laser device 23X on the insulating film 4a in the blue-violet semiconductor laser device 1. Thus, the respective exposed portions of the p-side pad electrodes 12, 13, and 14 extending in the Y-direction are arranged on a substantially straight line in the X-direction, so that the width in the Y-direction of the blue-violet semiconductor laser device 1 can be reduced.

The exposed portions of the p-side pad electrodes 12, 13, and 14 extending in the Y-direction are arranged on the substantially straight line in the X-direction, so that an arrangement space of the monolithic red/infrared semiconductor laser device 23X on the blue-violet semiconductor laser device 1 in the Y-direction can be increased. Consequently, the width of the monolithic red/infrared semiconductor laser device 23X in the Y-direction can be increased.

Furthermore, the arrangement position of the monolithic red/infrared semiconductor laser device 23X on the blue-violet semiconductor laser device 1 can be brought near the ridge Ri in the blue-violet semiconductor laser device 1. In this case, the distance between the blue-violet emission point 11 and the infrared emission point 31 can be reduced.

As described above, the exposed portions of the p-side pad electrodes 12, 13, and 14 in the semiconductor laser apparatus 1000A must respectively have predetermined sizes for bonding wires. In a case where the exposed portions of the p-side pad electrodes 12, 13, and 14 are arranged between the ridge Ri in the blue-violet semiconductor laser device 1 and the monolithic red/infrared semiconductor laser device 23X, therefore, the distance between the blue-violet emission point 11 and the infrared emission point 31 cannot be reduced.

Here, each of the p-side pad electrodes 12, 13, and 14 may be exposed on the opposite side of the monolithic red/infrared semiconductor laser device 23X with respect to the ridge Ri in the blue-violet semiconductor laser device 1 in the Y-direction. In this case, however, the p-side pad electrode 14 in the infrared semiconductor laser device 3 cross the p-side pad electrode 12 extending in the X-direction. The p-side pad electrode 13 in the red semiconductor laser device 2 cross the p-side pad electrodes 12 and 14 extending in the X-direction. In this case, an insulating film must be newly provided at an intersection of the p-side pad electrodes.

On the other hand, in the semiconductor laser apparatus 1000A according to the present embodiment, the p-side pad electrodes 12, 13, and 14 do not cross one another on the insulating film 4a in the blue-violet semiconductor laser device 1. Consequently, the p-side pad electrodes 12, 13, and 14 can be simultaneously formed on the insulating film 4a. As a result, the manufacturing processes are simplified, and the configuration is simplified.

In the semiconductor laser apparatus 1000A, the p-side pad electrode 12 formed on a semiconductor layer it in the blue-violet semiconductor laser device 1 and the p-side pad electrodes 22 and 32 formed on semiconductor layers 2t and 3t in the monolithic red/infrared semiconductor laser device 23X are respectively joined to each other through the solder film H. Thus, the distance between the blue-violet emission point 11 and the red emission point 21 and the distance between the blue-violet emission point 11 and the infrared emission point 31 can be reduced in the Z-direction. As a result, the blue-violet emission point 11, the red emission point 21, and the infrared emission point 31 are easy to arrange on a substantially straight line in the Y-direction.

(c) State where Semiconductor Laser Apparatus is Mounted on Package for Laser Devices The semiconductor laser apparatus 1000A shown in FIG. 1 is mounted within a package for laser devices. FIG. 3 is a perspective view showing the appearance of a substantially round-shaped can package for laser devices 500 on which the semiconductor laser apparatus 1000A shown in FIG. 1 is mounted.

In FIG. 3, the substantially round-shaped can package for laser devices 500 comprises a substantially round-shaped can package main body 503 having electrically conductive properties, power feed pins 501a, 501b, 501c, and 502, and a cover 504.

The substantially round-shaped can package main body 503 is provided with the semiconductor laser apparatus 1000A shown in FIG. 1, and is sealed with the cover 504. The cover 504 is provided with an extraction window 504a. The extraction window 504a is composed of a material that transmits a laser beam. The power feed pin 502 is mechanically and electrically connected to the substantially round-shaped can package main body 503. The power feed pin 502 is used as a ground terminal.

Respective one ends of the power feed pins 501a, 501b, 501c, and 502 extending outward from the substantially round-shaped can package main body 503 are connected to driving circuits (not shown).

Wiring using wires in the semiconductor laser apparatus 1000A mounted within the substantially round-shaped can package for laser devices 500 will be described. Description is made, taking the side on which a laser beam from a semiconductor laser device is emitted as a front.

Figure 4:
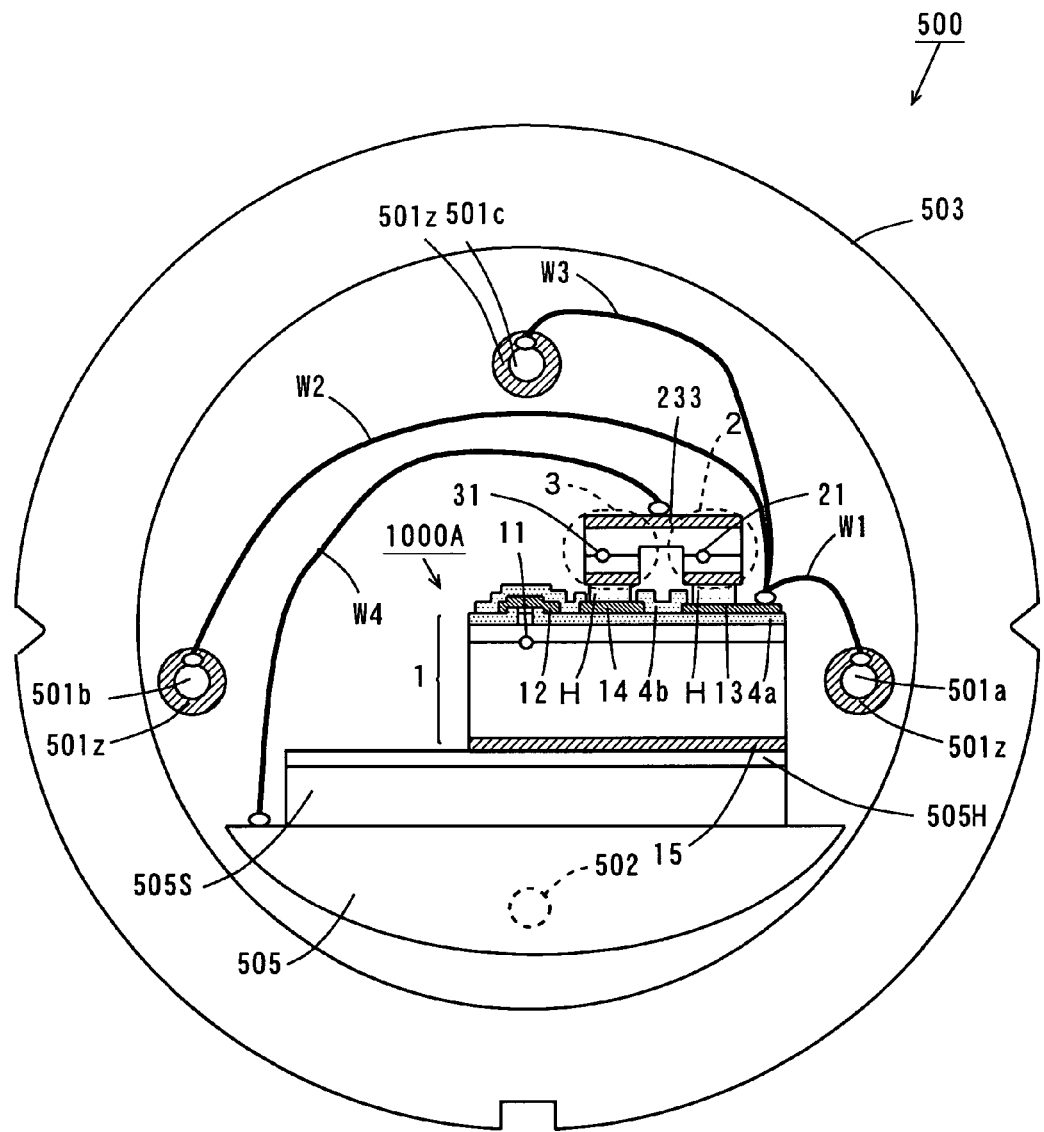
FIG. 4 is a schematic front view showing a state where a cover in the substantially round-shaped can package for laser devices shown in FIG. 3 is removed.
Figure 5:
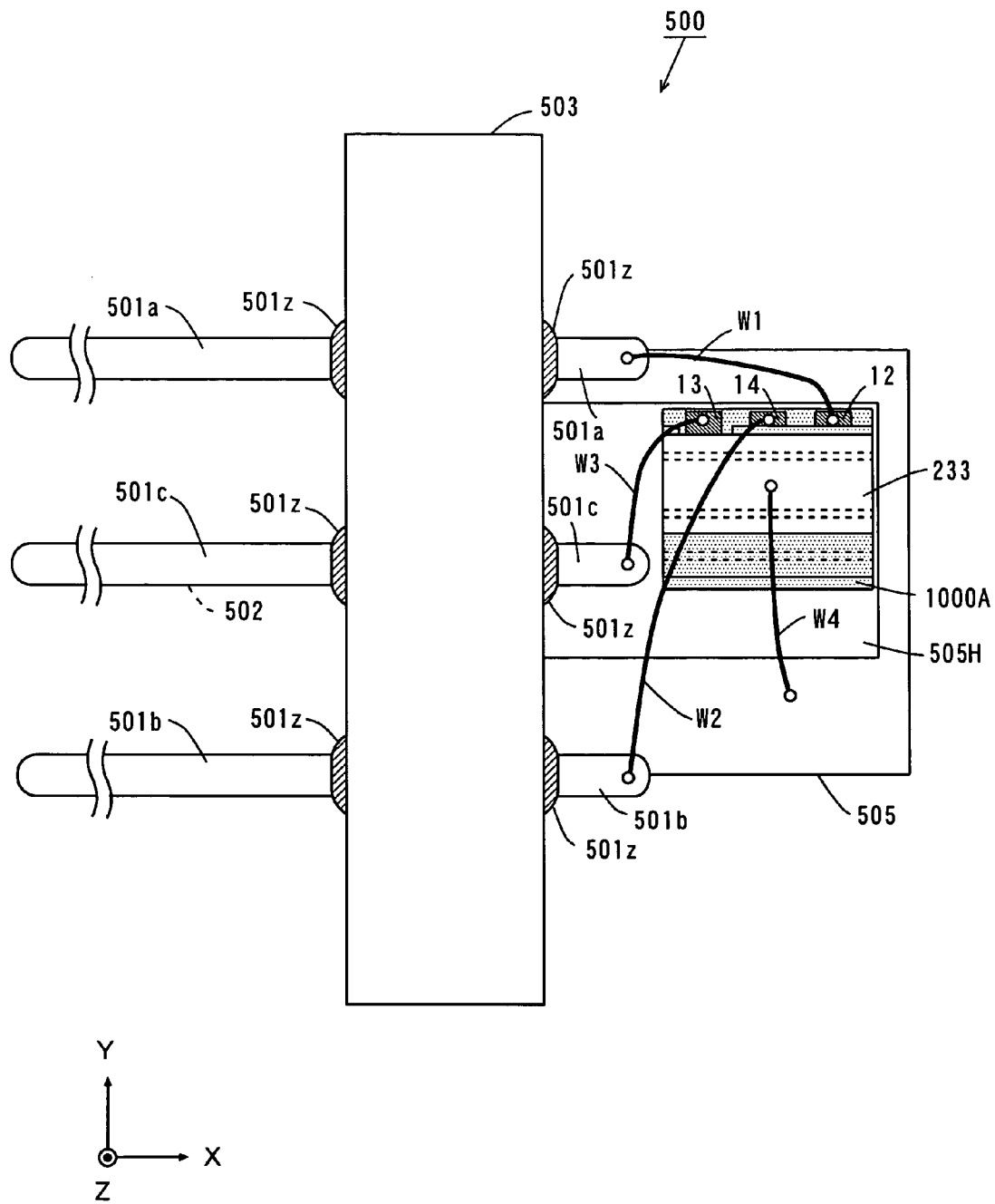
FIG. 5 is a schematic top view showing a state where a cover in a semiconductor laser apparatus is removed.

FIG. 4 is a schematic front view showing a state where the cover 504 in the substantially round-shaped can package for laser devices shown in FIG. 3 is removed, and FIG. 5 is a schematic top view showing a state where the cover 504 in the substantially round-shaped can package for laser devices 500 shown in FIG. 3 is removed. In FIG. 4, the semiconductor laser apparatus 1000A provided in the substantially round-shaped can package for laser devices 500 is indicated by a cross section taken along a line A1-A1 shown in FIG. 1 (a). In FIGS. 4 and 5, an X-direction, a Y-direction, and a Z-direction are defined, as in FIG. 1.

As shown in FIG. 4, a submount 505S having electrically conductive properties is provided on a supporting member 505 having electrically conductive properties that is integrated with the substantially round-shaped can package main body 503. The supporting member 505 and the submount 50S are composed of a material superior in electrically conductive properties and thermally conductive properties.

The semiconductor laser apparatus 1000A shown in FIG. 1 is joined to the submount 505S with an adhesion layer 505H sandwiched therebetween. The semiconductor laser apparatus 1000A adheres to the submount 505S (the adhesion layer (solder) 505H) such that the blue-violet emission point 11 in the blue-violet semiconductor laser device 1 is positioned in a substantially central portion of the substantially round-shaped can package for laser devices 500 on a Y-Z plane, i.e., at the center of the extraction window 504a in the cover 504 (see FIG. 3).

As shown in FIGS. 4 and 5, the power feed pins 501a, 501b, and 501c are respectively electrically insulated from the substantially round-shaped can package main body 503 by insulating rings 501z.

The power feed pin 501a is connected to one end of the p-side pad electrode 12 in the semiconductor laser apparatus 1000A through a wire W1. The power feed pin 501b is connected to one end of the p-side pad electrode 14 in the semiconductor laser apparatus 1000A through a wire W2. The power feed pin 501c is connected to one end of the p-side pad electrode 13 in the semiconductor laser apparatus 1000A through a wire W3.

On the other hand, the exposed upper surface of the supporting member 505 and the common n-electrode 233 in the semiconductor laser apparatus 1000A are electrically connected to each other through a wire W4.

Here, the supporting member 505 is electrically connected through the submount 505S and the adhesion layer 505H. Thus, the power feed pin 502 is electrically connected to the n-electrode 15 in the blue-violet semiconductor laser device 1 and the n-electrode 233 that is common between the red semiconductor laser device 2 and the infrared semiconductor laser device 3. That is, common cathode wire connection of the blue-violet semiconductor laser device 1, the red semiconductor laser device 2, and the infrared semiconductor laser device 3 is implemented.

The blue-violet semiconductor laser device 1 can be driven by applying a voltage between the power feed pin 501a and the power feed pin 502. The infrared semiconductor laser device 3 can be driven by applying a voltage between the power feed pin 501b and the power feed pin 502. The red semiconductor laser device 2 can be driven by applying a voltage between the power feed pin 501c and the power feed pin 502. Thus, the blue-violet semiconductor laser device 1, the red semiconductor laser device 2, and the infrared semiconductor laser device 3 can be independently driven.

In the semiconductor laser apparatus 1000A according to the present embodiment, the p-side pad electrodes 12, 13, and 14 are electrically isolated from one another, as described above. Thus, arbitrary voltages can be respectively applied to the p-side pad electrodes 12, 13, and 14 in the blue-violet semiconductor laser device 1, the red semiconductor laser device 2, and the infrared semiconductor laser device 3. Consequently, a system for driving the blue-violet semiconductor laser device 1, the red semiconductor laser device 2, and the infrared semiconductor laser device 3 can be arbitrary selected.

(d) Effect in State where Semiconductor Laser Apparatus is Mounted on Package for Laser Devices The intensity of a laser beam from the blue-violet semiconductor laser device 1 is weaker than the respective intensities of laser beams from the red semiconductor laser device 2 and the infrared semiconductor laser device 3. In this example, the blue-violet emission point 11 in the blue-violet semiconductor laser device 1 is positioned at the center of the extraction window 504a in the cover 504. Thus, the laser beam from the blue-violet semiconductor laser device 1 is emitted from the center of the substantially round-shaped can package for laser devices 500. Even if the substantially round-shaped can package for laser devices 500 is rotated around the central axis of the substantially round-shaped can package for laser devices 500, therefore, the change in the position of the axis of the laser beam emitted from the blue-violet semiconductor laser device 1 can be reduced.

Consequently, the angle of an optical system comprising lens etc. and the angle of the substantially round-shaped can package for laser devices 500 can be easily adjusted with respect to the central axis of the substantially round-shaped can package for laser devices 500 while keeping the laser beam from the blue-violet semiconductor laser device 1 in a state of the high light extraction efficiency. As a result, the optical system is easy to design.

Generally, the laser beam from the blue-violet semiconductor laser device 1 is used for recording and reproducing a new-generation DVD, the laser beam from the red semiconductor laser device 2 is used for recording and reproducing a conventional DVD, and the laser beam from the infrared semiconductor laser device 3 is used for recording and reproducing a CD.

Here, the optical recording media differ in the respective densities of pits formed on their surfaces. For example, the respective densities of the pits formed in the new-generation and conventional DVDs are higher than the density of the pits formed in the CD. In recording and reproducing the new-generation and conventional DVDs, therefore, signal processing must be performed at higher speed as that at the time of recording and reproducing the CD.

Fast response characteristics are required for the blue-violet semiconductor laser device 1 and the red semiconductor laser device 2 that respectively correspond to the new-generation and conventional DVDs.

As shown in FIGS. 4 and 5, the p-side pad electrode 14 in the infrared semiconductor laser device 3 is connected to the power feed pin 501b positioned in the farthest area in this example. On the other hand, both the p-side pad electrodes 12 and 13 in the blue-violet semiconductor laser device 1 and the red semiconductor laser device 2 are respectively connected to the power feed pins 501a and 501c positioned close thereto.

Thus, in this example, the respective lengths of the wires W1 and W3 corresponding to the blue-violet semiconductor laser device 1 and the red semiconductor laser device 2 are reduced, so that the respective response characteristics of the blue-violet semiconductor laser device 1 and the red semiconductor laser device 2 are improved.

Furthermore, in this example, the p-side pad electrode 13 positioned in the farthest area from a laser beam emission facet of the semiconductor laser apparatus 1000A is connected to the power feed pin 501c opposed to the supporting member 505 through the wire W3, as shown in FIG. 5. In other words, the p-side pad electrode 13 closest to the substantially round-shaped can package main body 503 in the X-direction and the power feed pin 501c are connected to each other through the wire W3. Thus, the wires W1 to W3 respectively connected between the p-side pad electrodes 12, 14, and 13 and the power feed pins 501a, 501b, and 501c are prevented from crossing one another.

Although in this example, the exposed portion of the p-side pad electrode 12 in the blue-violet semiconductor laser device 1 is arranged on the side of the laser beam emission facet of the semiconductor laser apparatus 1000A in the X-direction, the exposed portion of the p-side pad electrode 12 in the blue-violet semiconductor laser device 1 may be arranged on the opposite side of the laser beam emission facet of the semiconductor laser apparatus 1000A in the X-direction. In this case, the p-side pad electrode 12 in the blue-violet semiconductor laser device 1 and the power feed pin 501c are connected to each other through a wire. Further, the p-side pad electrode 13 in the red semiconductor laser device 2 and the power feed pin 501a are connected to each other through a wire.

(e) Method of Manufacturing Semiconductor Laser Apparatus

Figure 6:
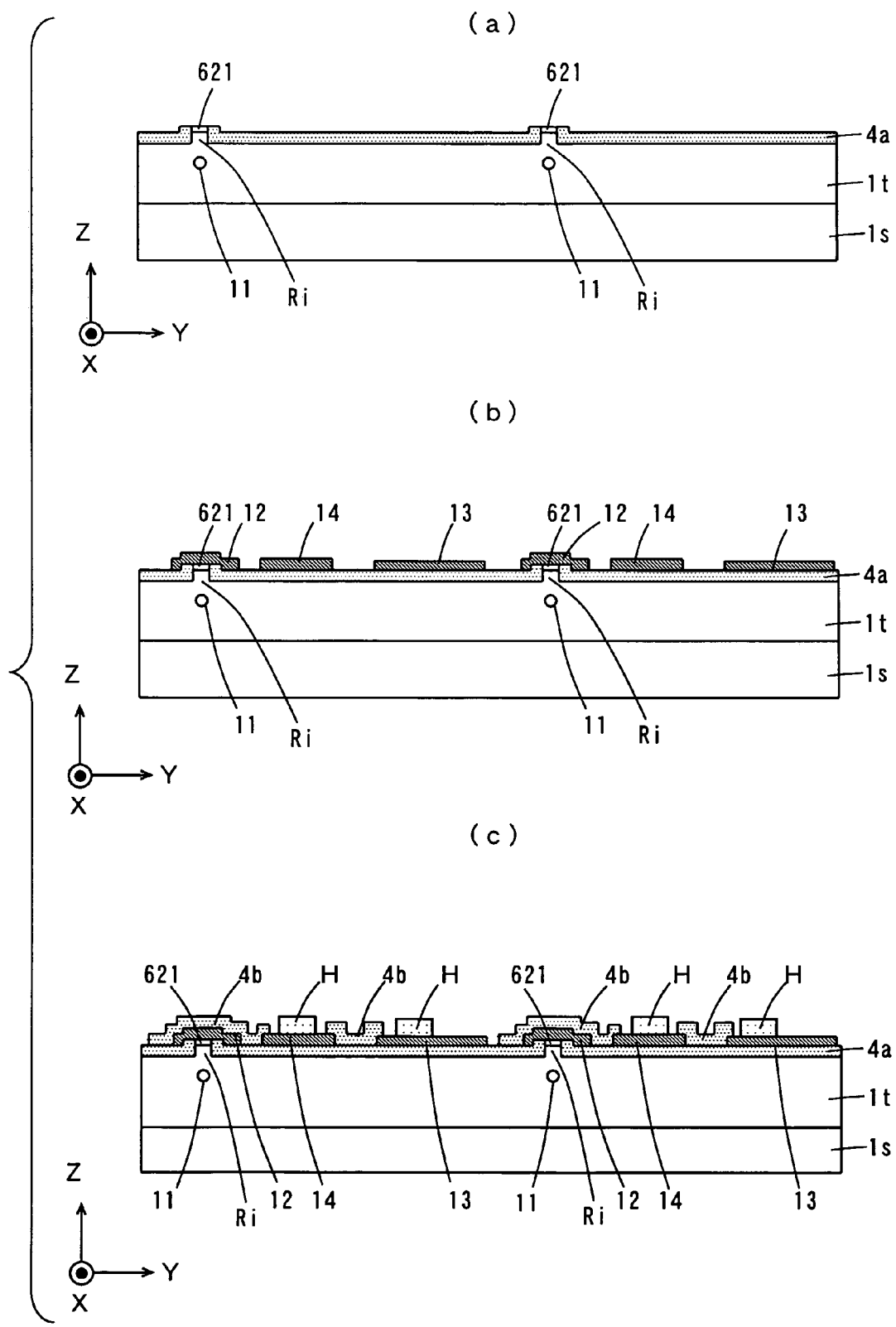
FIG. 6 is a schematic sectional view showing the steps of an example of a method of manufacturing the semiconductor laser apparatus according to the first embodiment.
Figure 7:
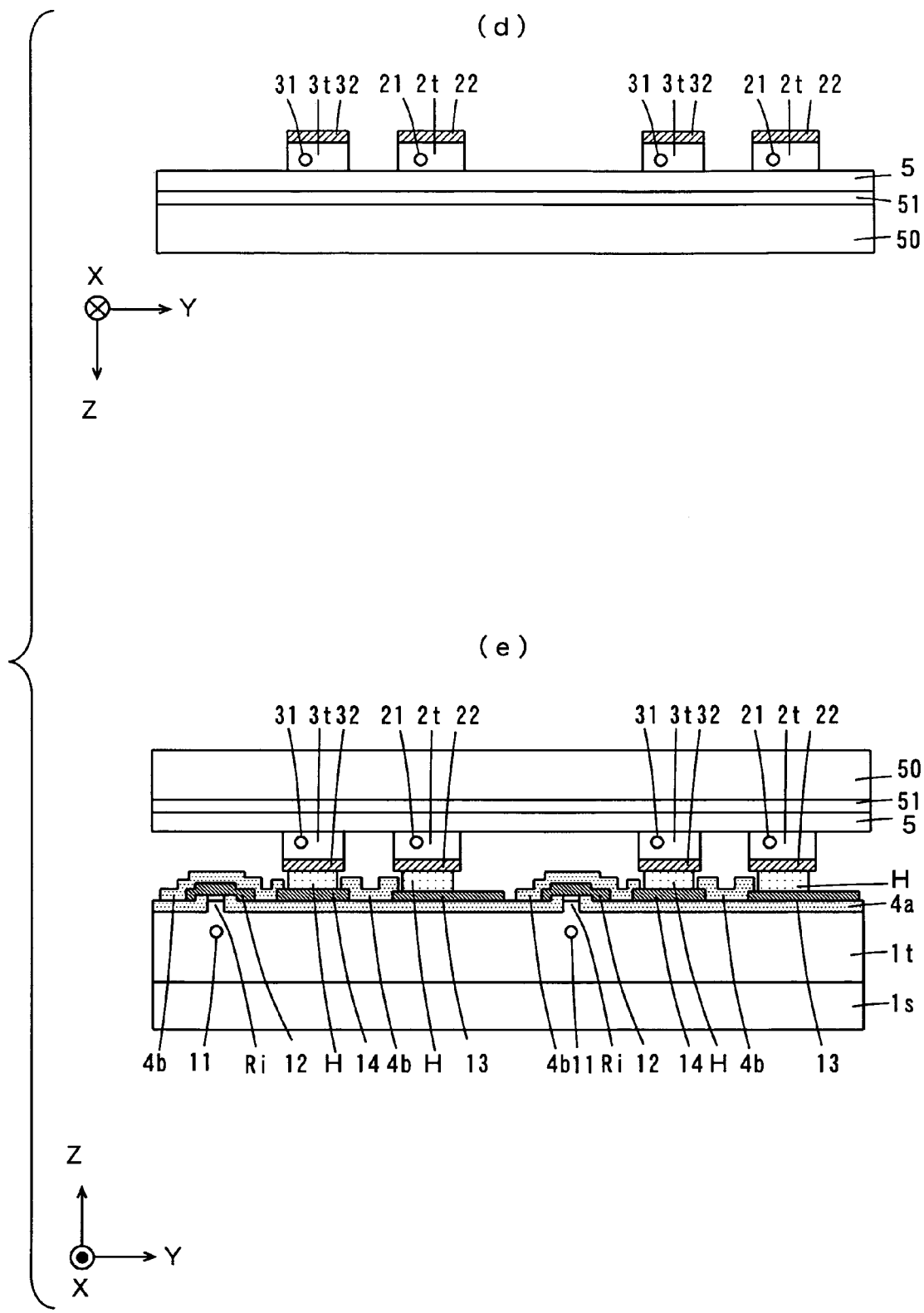
FIG. 7 is a schematic sectional view showing the steps of an example of a method of manufacturing the semiconductor laser apparatus according to the first embodiment.
Figure 8:
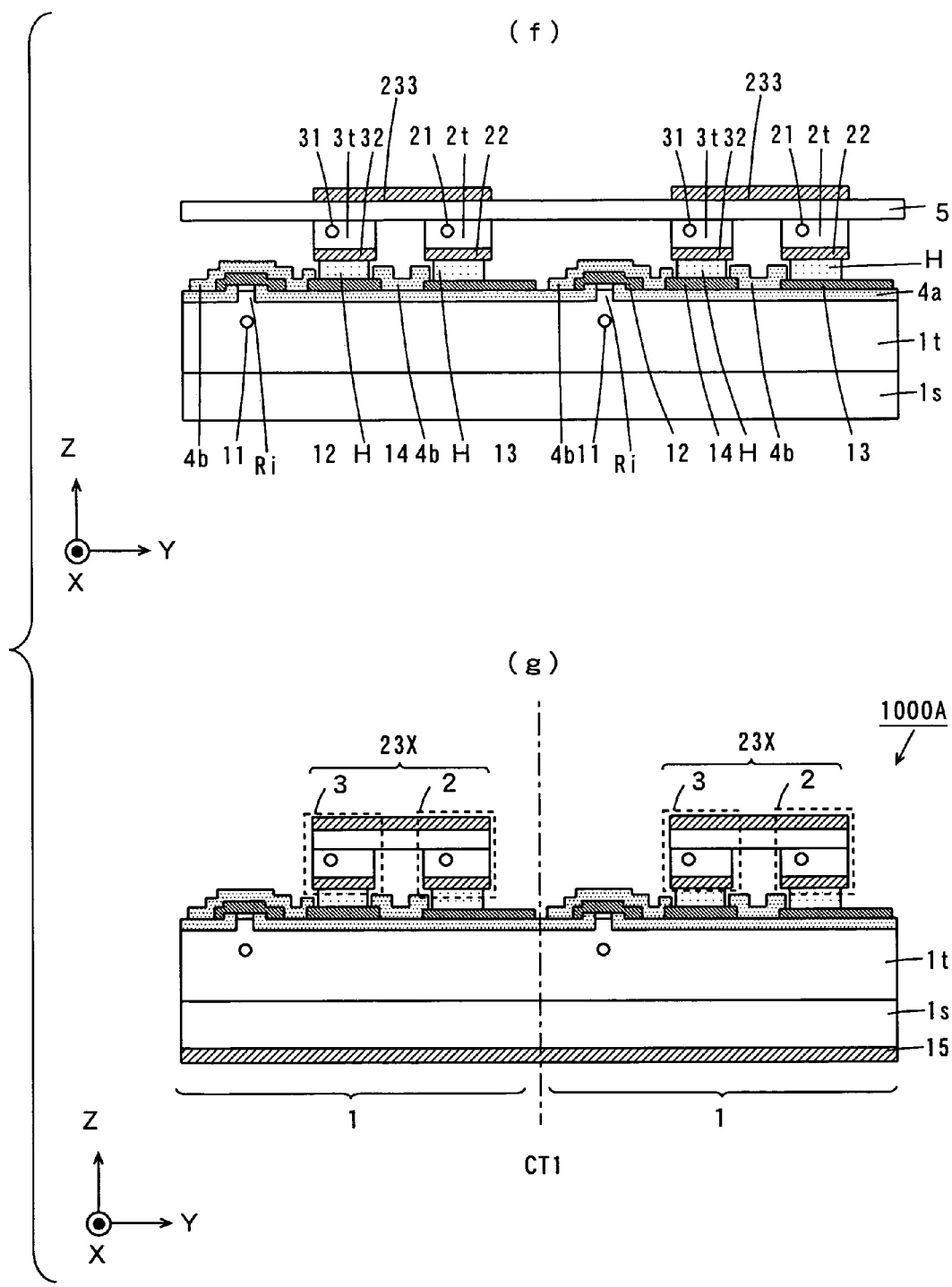
FIG. 8 is a schematic sectional view showing the steps of an example of a method of manufacturing the semiconductor laser apparatus according to the first embodiment.

A method of manufacturing the semiconductor laser apparatus 1000A according to the present embodiment will be described. FIGS. 6 to 8 are schematic sectional views showing an example of a method of manufacturing the semiconductor laser apparatus 1000A according to the first embodiment. In FIGS. 6 and 8, an X-direction, a Y-direction, and a Z-direction shown in FIG. 1 are also defined.

Respective cross sections shown in FIGS. 6 to 8 correspond to a cross section taken along the line A1-A1 shown in FIG. 1. An n-GaN substrate Is and an n-GaAs substrate 50, described later, are respectively an n-GaN wafer and an n-GaAs wafer. A plurality of blue-violet semiconductor laser devices 1 and monolithic red/infrared semiconductor laser devices 23X are respectively formed in the n-GaN wafer and the n-GaAs wafer. Consequently, respective parts of the n-GaN wafer and the n-GaAs wafer are illustrated in FIGS. 6 to 8.

As shown in FIG. 6 (a), in order to manufacture the blue-violet semiconductor laser device 1, a semiconductor layer it having a multilayer structure is formed on one surface of the n-GaN substrate is serving as a first growth substrate, to form a ridge Ri extending in the X-direction is formed in the semiconductor layer it. Thereafter, an insulating film 4a composed of $SiO_2$ is formed on an upper surface of the semiconductor layer 1t having the ridge Ri formed therein. Further, the insulating film 4a on an upper surface of the ridge Ri is removed, to form a p-type ohmic electrode 621 on the exposed ridge Ri.

As shown in FIG. 6 (b), p-side pad electrodes 12, 13, and 14 are then formed by patterning on an upper surface of the p-type ohmic electrode 621 and on the insulating film 4a on both sides of the ridge Ri (see FIG. 2 (a)).

As shown in FIG. 6 (c), an insulating film 4b is then formed by patterning in a predetermined region on each of the insulating film 4a and the p-side pad electrodes 12, 13 and 14 (see FIG. 2 (b)). Therefore, a solder film H composed of Au—Sn is formed on each of respective upper surfaces of the exposed p-side pad electrodes 13 and 14. An n-electrode 15 in the blue-violet semiconductor laser device 1 is formed in the subsequent steps.

On the other hand, as shown in FIG. 7 (d), in order to manufacture the monolithic red/infrared semiconductor laser device 23X, an etching stop layer 51 composed of AlGaAs is formed on one surface of an n-GaAs substrate 50 serving as a second growth substrate, to form an n-GaAs contact layer 5 on the etching stop layer 51.

A semiconductor layer 2t having an AlGaInP based multilayer structure and a semiconductor layer 3t having an AlGaAs based multilayer structure are formed so as be spaced apart from each other on the n-GaAs contact layer 5. Further, a p-side pad electrode 22 and a p-side pad electrode 32 are respectively formed on the semiconductor layer 2t and the semiconductor layer 3t. P-type ohmic electrodes are respectively formed between the semiconductor layer 2t and the p-side pad electrode 22 and between the semiconductor layer 3t and the p-side pad electrode 32, which are omitted in the figure. The common n-electrode 233 in the monolithic red/infrared semiconductor laser device 23X is formed in the subsequent steps. Ridges are respectively formed in the red semiconductor laser device 2 and the infrared semiconductor laser device 3, as described above, which are not illustrated in FIG. 7 (d).

As shown in FIG. 7 (e), the p-side pad electrode 13 formed on the insulating film 4a and the p-side pad electrode 22 formed on the semiconductor layer 2t are joined to each other with the solder film H sandwiched therebetween, and the p-side pad electrode 14 formed on the insulating film 4a and the p-side pad electrode 32 formed on the semiconductor layer 3t are joined to each other with the solder film H sandwiched therebetween.

At this time, both the n-GaN substrate 1s and the n-GaAs substrate 50 respectively have thicknesses of approximately 300 to 500 μm. Thus, the n-GaN substrate 1s and the n-GaAs substrate 50 are easy to handle, so that the p-side pad electrodes 22 and 32 are respectively easy to join to the p-side pad electrodes 13 and 14.

The n-GaN substrate is in the blue-violet semiconductor laser device 1 is transparent. The n-GaN substrate is has such a transmission factor and a thickness that the monolithic red/infrared semiconductor laser device 23X can be visually observed through the n-GaN substrate 1s.

Thus, positions where the p-side pad electrodes 22 and 32 are respectively joined to the p-side pad electrodes 13 and 14 can be visually recognized through the n-GaN substrate 1s. Thus, the monolithic red/infrared semiconductor laser device 23X (the red semiconductor laser device 2 and the infrared semiconductor laser device 3) on the blue-violet semiconductor laser device 1 is easy to position.

In the present embodiment, a substrate in the blue-violet semiconductor laser device 1 is not limited to the n-GaN substrate 1s. For example, another substrate having translucent properties and electrically conductive properties may be used. As the other substrate having translucent properties, an n-ZnO substrate can be used, for example. In this case, the monolithic red/infrared semiconductor laser device 23X is easy to position on the blue-violet semiconductor laser device 1, as described above.

Here, the n-GaAs substrate 50 is processed to a predetermined thickness by etching, grinding, or the like, and is then etched up to the etching stop layer 51.

For example, the n-GaAs substrate 50 is first ground until it has a predetermined thickness, and is then removed by dry etching such as reactive ion etching (RIE).

The etching stop layer 51 is further removed. For example, the etching stop layer 51 is removed by wet etching using an etchant composed of a hydrofluoric acid or a hydrochloric acid.

Thereafter, as shown in FIG. 8 (f), the etching stop layer 51 is removed, and the common n-electrode 233 is then formed by patterning in respective regions on the n-GaAs contact layer 5 above the semiconductor layers 2t and 3t and a predetermined region therebetween.

As shown in FIG. 8 (g), the n-GaAs contact layer 5 in a portion where the common n-electrode 233 is not formed is removed by dry etching. Thus, the monolithic red/infrared semiconductor laser device 23X (the red semiconductor laser device 2 and the infrared semiconductor laser device 3) is manufactured. The details of the configuration of the red semiconductor laser device 2 and the infrared semiconductor laser device 3 will be described later.

Furthermore, the n-GaN substrate 1s is thinned by grinding, and the n-electrode 15 is then formed on a lower surface of the n-GaN substrate 1s. Thus, the blue-violet semiconductor laser device 1 is manufactured. The details of the configuration of the blue-violet semiconductor laser device 1 will be described later.

Finally, a stacked substrate composed of the blue-violet semiconductor laser device 1 and the monolithic red/infrared semiconductor laser device 23X that are manufactured as described above is cleaved along a plurality of lines parallel to the Y-direction, to form cavity facets. Here, the cleavage along the Y-direction is performed such that the respective cavity lengths (in the X-direction) of the blue-violet semiconductor laser device 1 and the monolithic red/infrared semiconductor laser device 23X will be approximately 700 μm, for example.

A protective film is formed on each of the cavity facets, and is then cut along a plurality of lines parallel to the X-direction, to divide the semiconductor laser apparatus 1000A into a plurality of chips. The cutting of the stacked substrate along the X-direction is performed along a one-dot and dash line CT1 shown in FIG. 8 (g), for example.

Chips of the blue-violet semiconductor laser device 1 and chips of the monolithic red/infrared semiconductor laser device 23X may be previously individually formed, and may be affixed to one another to manufacture the semiconductor laser apparatus 1000A.

(f) Configuration of Blue-violet Semiconductor Laser Device

The details of the configuration of the blue-violet semiconductor laser device 1, together with a method of manufacturing the same, will be described on the basis of FIG. 9.

Figure 9:
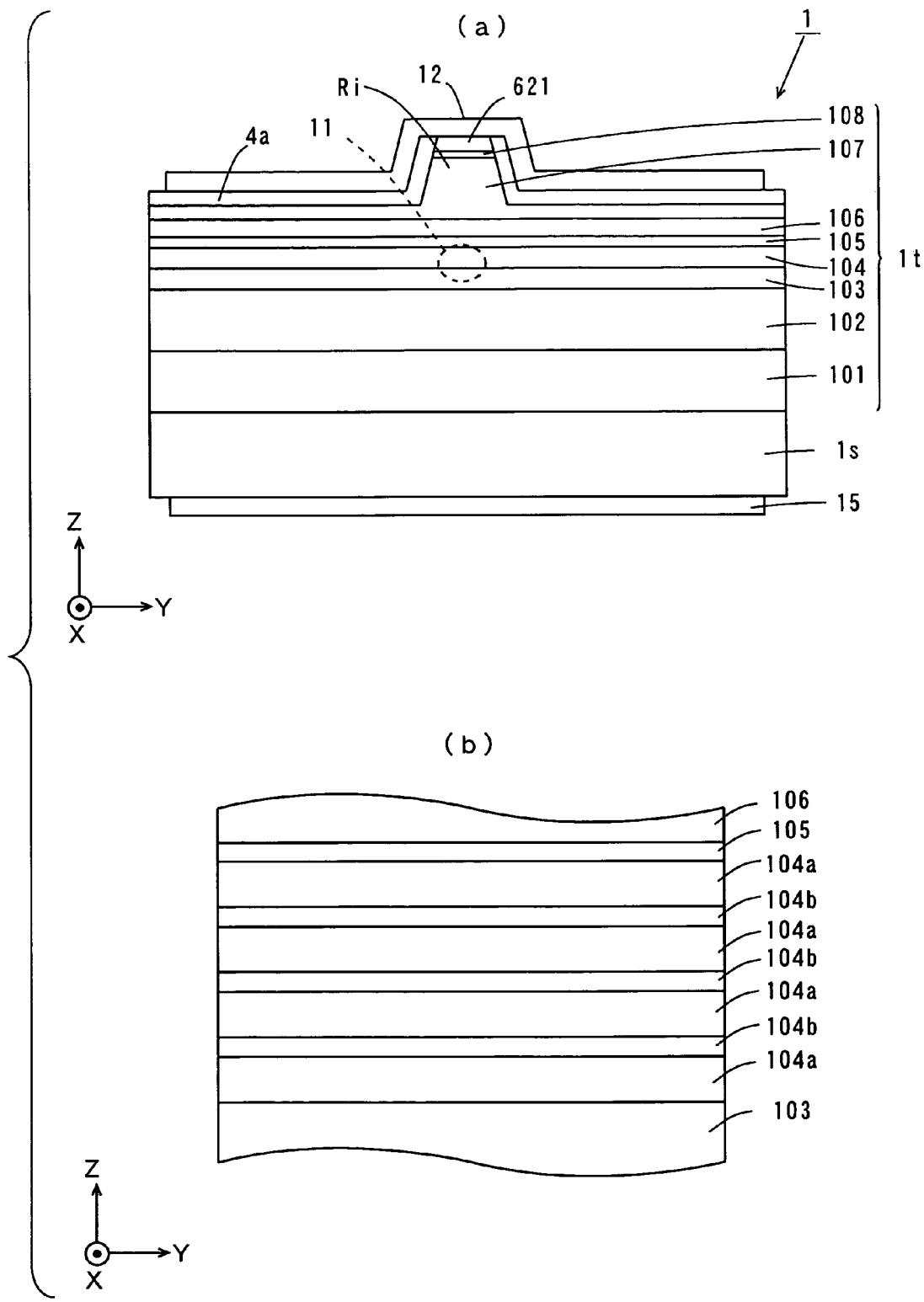
FIG. 9 is a schematic sectional view for explaining the details of the configuration of a blue-violet semiconductor laser device.

FIG. 9 is a schematic sectional view for explaining the details of the configuration of the blue-violet semiconductor laser device 1. In the following description, an X-direction, a Y-direction, and a Z-direction are also defined, as in FIG. 1.

When the blue-violet semiconductor laser device 1 is manufactured, the semiconductor layer it having a multilayer structure is formed on the n-GaN substrate is, as described above.

As shown in FIG. 9 (a), an n-GaN layer 101, an n-AlGaN cladding layer 102, an n-GaN optical guide layer 103, a multiple quantum well (MQW) active layer 104, an undoped AlGaN cap layer 105, an undoped GaN optical guide layer 106, a p-AlGaN cladding layer 107, and an undoped GaInN contact layer 108 are formed in this order as the semiconductor layer it having a multilayer structure on the n-GaN substrate is. The layers are formed by metal organic chemical vapor deposition (MOCVD), for example.

As shown in FIG. 9 (b), the MQW active layer 104 has a structure in which four undoped GaInN barrier layers 104a and three undoped GaInN well layers 104b are alternately stacked.

Here, the Al composition of the n-AlGaN cladding layer 102 is 0.15, and the Ga composition thereof is 0.85. Si is doped into the n-GaN layer 101, the n-AlGaN cladding layer 102, and the n-GaN optical guide layer 103.

The Ga composition of the undoped GaInN barrier layer 104a is 0.95, and the In composition thereof is 0.05. The Ga composition of the undoped GaInN well layer 104b is 0.90, and the In composition thereof is 0.10. The Al composition of the p-AlGaN cap layer 105 is 0.30, and the Ga composition thereof is 0.70.

Furthermore, the Al composition of the p-AlGaN cladding layer 107 is 0.15, and the Ga composition thereof is 0.85. Mg is doped in to the p-AlGaN cladding layer 107. The Ga composition of the undoped GaInN contact layer 108 is 0.95, and the In composition thereof is 0.05.

A striped ridge Ri extending in the X-direction is formed in the p-AlGaN cladding layer 107 in the semiconductor layer it. The ridge Ri in the p-AlGaN cladding layer 107 has a width of approximately 1.5 μm.

The undoped GaInN contact layer 108 is formed on an upper surface of the ridge Ri in the p-AlGaN cladding layer 107.

An insulating film 4a composed of $SiO_2$ is formed on respective upper surfaces of the p-AlGaN cladding layer 107 and the undoped GaInN contact layer 108. The insulating film 4a formed on the undoped GaInN contact layer 108 is removed by etching. A p-type ohmic electrode 621 composed of Pd/Pt/Au is formed on the undoped GaInN contact layer 108 exposed to the exterior. Further, a p-side pad electrode 12 is formed by sputtering, vacuum evaporation, or electron beam evaporation so as to cover respective upper surfaces of the p-type ohmic electrode 621 and the insulating film 4a. Here, the description of the p-side pad electrodes 13 and 14 shown in FIG. 1 is not repeated.

The semiconductor layer it having a multilayer structure is thus formed on one surface of then-GaN substrate is. Further, an n-electrode 15 composed of Ti/Pt/Au is formed on the other surface of the n-GaN substrate 1s.

In the blue-violet semiconductor laser device 1, a blue-violet emission point 11 is formed at a position of the MQW active layer 104 below the ridge Ri. In this example, the MQW active layer 104 corresponds to the p-n junction interface 10 shown in FIG. 1.

(g) Configuration of Red Semiconductor Laser Device

The details of the configuration of the red semiconductor laser device 2, together with a method of manufacturing the same, will be described on the basis of FIG. 10.

Figure 10:
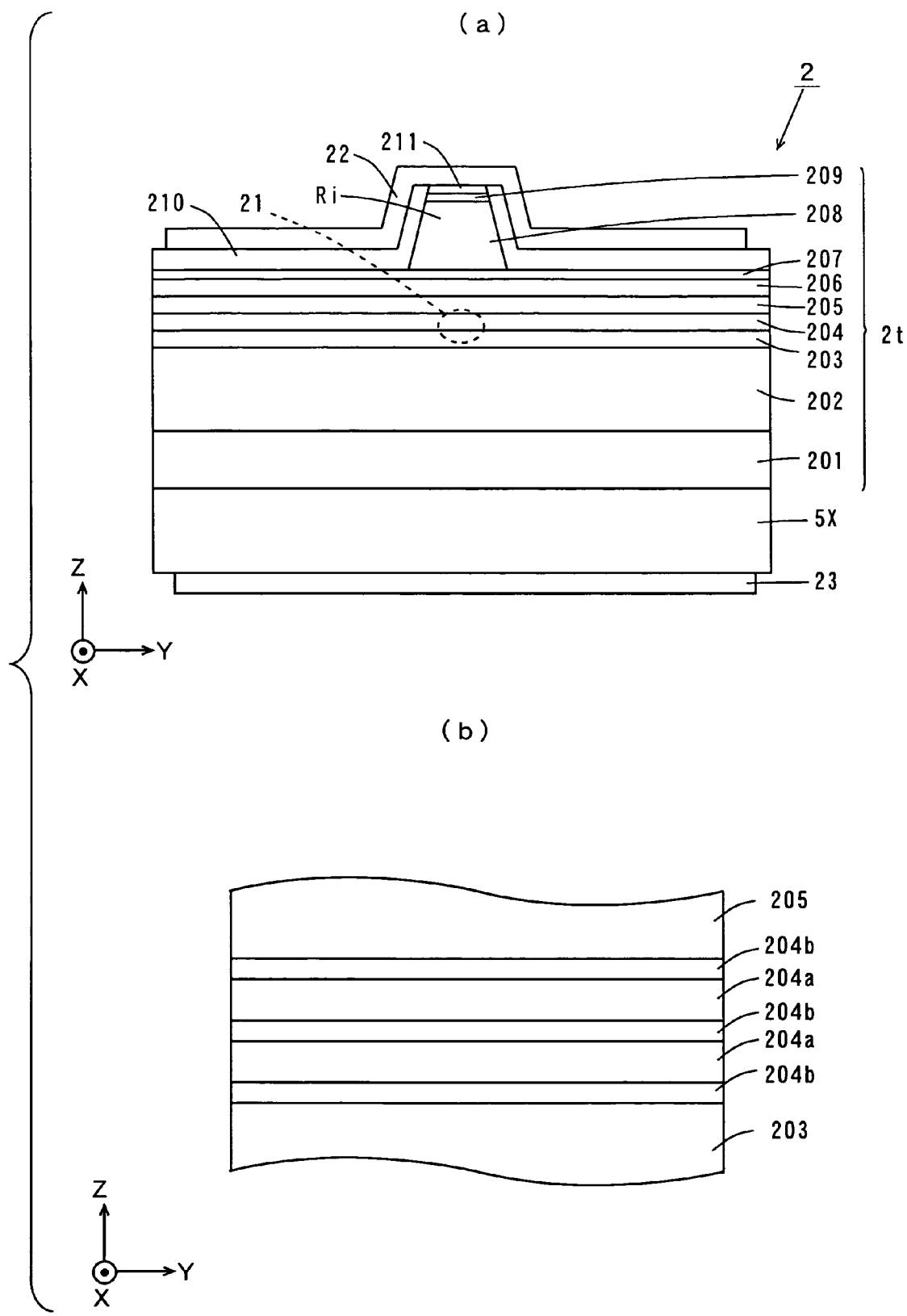
FIG. 10 is a schematic sectional view for explaining the details of the configuration of a red semiconductor laser device in a monolithic red/infrared semiconductor laser device.

FIG. 10 is a schematic sectional view for explaining the details of the configuration of the red semiconductor laser device 10 in the monolithic red/infrared semiconductor laser device 23X. In the following description, an X-direction, a Y-direction, and a Z-direction are also defined, as in FIG. 1. Although in the present embodiment, the red semiconductor laser device 2 is manufactured by forming the semiconductor layer 2t on the n-GaAs contact layer 5, the semiconductor layer 2t is formed on an n-GaAs substrate 5X in place of the n-GaAs contact layer 5. Si is doped into the n-GaAs substrate 5X.

As shown in FIG. 10 (a), an n-GaN layer 201, an n-AlGInP cladding layer 202, an undoped AlGaInP optical guide layer 203, an MQW active layer 204, an undoped AlGaInP optical guide layer 205, a p-AlGaInP first cladding layer 206, a p-InGaP etching stop layer 207, a p-AlGaInP second cladding layer 208, and a p-contact layer 209 are formed in this order on the n-GaAs substrate 5X. The layers are formed by MOCVD, for example.

As shown in FIG. 10 (b), the MQW active layer 204 has a structure in which two undoped AlGaInP barrier layers 204a and three undoped InGaP well layers 204b are alternately stacked.

Here, the Al composition of the n-AlGaInP cladding layer 202 is 0.35, the Ga composition thereof is 0.15, and the In composition thereof is 0.50. Si is doped into the n-GaAs layer 201 and the n-AlGaInP cladding layer 202.

The Al composition of the undoped AlGaInP optical guide layer 203 is 0.25, the Ga composition thereof is 0.25, and the In composition thereof is 0.50.

The Al composition of the undoped AlGaInP barrier layer 204a is 0.25, the Ga composition thereof is 0.25, and the In composition thereof is 0.50. The In composition of the undoped InGaP well layer 204b is 0.50, and the Ga composition thereof is 0.50. The Al composition of the undoped AlGaInP optical guide layer 205 is 0.25, the Ga composition thereof is 0.25, and the In composition thereof is 0.50.

Furthermore, the Al composition of the p-AlGaInP first cladding layer 206 is 0.35, the Ga composition thereof is 0.15, and the In composition thereof is 0.50. The In composition of the p-InGaP etching stop layer 207 is 0.50, and the Ga composition thereof is 0.50.

The Al composition of the p-AlGaInP second cladding layer 208 is 0.35, the Ga composition thereof is 0.15, and the In composition thereof is 0.50.

The p-contact layer 209 has a multilayer structure of a p-GaInP layer and a p-GaAs layer. The Ga composition of the p-GaInP is 0.5, and the In composition thereof is 0.5.

When the composition of the AlGaInP based material is expressed by a general formula $Al_aGa_bIn_cP$, a indicates the Al composition, b indicates the Ga composition, and c indicates the In composition.

Zn is doped into p-GaInP and p-GaAs in the p-AlGaInP first cladding layer 206, the p-InGaP etching stop layer 207, the p-AlGaInP second cladding layer 208, and the p-contact layer 209.

In the foregoing, formation of the p-AlGaInP second cladding layer 208 on the p-InGaP etching stop layer 207 is performed in only a part (at the center) of the p-InGaP etching stop layer 207. The p-contact layer 209 is formed on an upper surface of the p-AlGaInP second cladding layer 208.

Thus, the p-AlGaInP second cladding layer 208 and the p-contact layer 209 in the above-mentioned semiconductor layer 2t form a striped ridge Ri extending in the X-direction. The ridge Ri comprising the p-AlGaInP second cladding layer 208 and the p-contact layer 209 has a width of approximately 2.5 μm.

An insulating film 210 composed of $SiO_2$ is formed on an upper surface of the p-InGaP etching stop layer 207, a side surface of the p-AlGaInP second cladding layer 208, and an upper surface and a side surface of the p-contact layer 209, and the insulating film 210 formed on the p-contact layer 209 is removed by etching. A p-type ohmic electrode 211 composed of Cr/Au is formed on the p-contact layer 209 exposed to the exterior. Further, a p-side pad electrode 22 is formed by sputtering, vacuum evaporation, or electron beam evaporation so as to cover respective upper surfaces of the p-type ohmic electrode 211 and the insulating film 210.

The semiconductor layer 2t having a multilayer structure is thus formed on one surface of the n-GaAs substrate 5X. Further, an n-electrode 23 (a common n-electrode 233) composed of AuGe/Ni/Au is formed on the other surface of the n-GaAs substrate 5X.

In the red semiconductor laser device 2, a red emission point 21 is formed at a position of the MQW active layer 204 below the ridge Ri. In this example, the MQW active layer 204 corresponds to the p-n junction interface 20 shown in FIG. 1.

(h) Configuration of Infrared Semiconductor Laser Device

The details of the configuration of the infrared semiconductor laser device 3, together with a method of manufacturing the same, will be described on the basis of FIG. 11.

Figure 11:
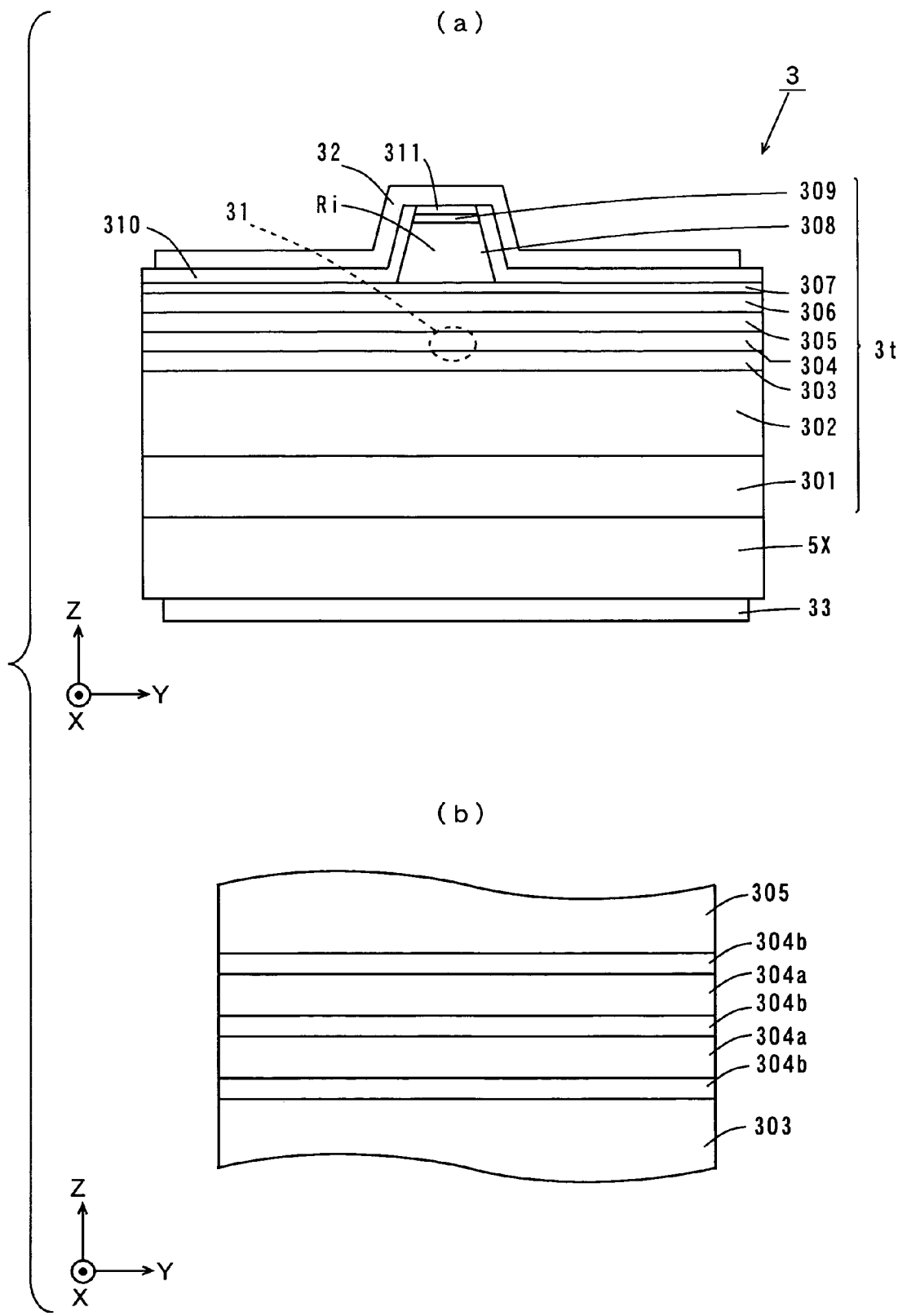
FIG. 11 is a schematic sectional view for explaining the details of the configuration of an infrared semiconductor laser device in a monolithic red/infrared semiconductor laser device.

FIG. 11 is a schematic sectional view for explaining the details of the configuration of the infrared semiconductor laser device 3 in the monolithic red/infrared semiconductor laser device 23X. In the following description, an X-direction, a Y-direction, and a Z-direction are also defined, as in FIG. 1. Although in the present embodiment, the infrared semiconductor laser device 3 is manufactured by forming the semiconductor layer 3t on the n-GaAs contact layer 5, the semiconductor layer 3t is formed on an n-GaAs substrate 5X in place of the n-GaAs contact layer 5 in the following description. Si is doped into the n-GaAs substrate 5X.

As shown in FIG. 11 (a), an n-GaAs layer 301, an n-AlGaAs cladding layer 302, an undoped AlGaAs optical guide layer 303, an MQW active layer 304, an undoped AlGaAs optical guide layer 305, a p-AlGaAs first cladding layer 306, a p-AlGaAs etching stop layer 307, a p-AlGaAs second cladding layer 308, and a p-GaAs contact layer 309 are formed in this order as the semiconductor layer 3t having a multilayer structure on the n-GaAs substrate 5X. The layers are formed by MOCVD, for example.

As shown in FIG. 11 (b), the MQW active layer 304 has a structure in which two undoped AlGaAs barrier layers 304a and three undoped AlGaAs well layers 304b are alternately stacked.

Here, the Al composition of the n-AlGaAs cladding layer 302 is 0.45, and the Ga composition thereof is 0.55, for example. Si is doped into the n-GaAs layer 301 and the n-AlGaAs cladding layer 302.

The Al composition of the undoped AlGaAs optical guide layer 303 is 0.35, and the Ga composition thereof is 0.65. The Al composition of the undoped AlGaAs barrier layer 304a is 0.35, and the Ga composition thereof is 0.65. The Al composition of the undoped AlGaAs well layer 304b is 0.10, and the Ga composition thereof is 0.90. The Al composition of the undoped AlGaAs optical guide layer 305 is 0.35, and the Ga composition thereof is 0.65.

Furthermore, the Al composition of the p-AlGaAs first cladding layer 306 is 0.45, and the Ga composition thereof is 0.55. The Al composition of the p-AlGaAs etching stop layer 307 is 0.70, and the Ga composition thereof is 0.30.

The Al composition of the p-AlGaAs second cladding layer 308 is 0.45, and the Ga composition thereof is 0.55.

Zn is doped into the p-AlGaAs first cladding layer 306, the p-AlGaAs etching stop layer 307, the p-AlGaAs second cladding layer 308, and the p-GaAs contact layer 309.

In the foregoing, formation of the p-AlGaAs second cladding layer 308 on the p-AlGaAs etching stop layer 307 is performed in only a part (at the center) of the p-AlGaAs etching stop layer 307. The p-GaAs contact layer 309 is formed on an upper surface of the p-AlGaAs second cladding layer 308.

Thus, the p-AlGaAs second cladding layer 308 and the p-GaAs contact layer 309 in the above-mentioned semiconductor layer 3t form a striped ridge Ri extending in the X-direction. The ridge Ri comprising the p-AlGaAs second cladding layer 308 and the p-GaAs contact layer 309 has a width of approximately 2.8 µm.

An insulating film 310 composed of SiN is formed on an upper surface of the p-AlGaAs etching stop layer 307, a side surface of the p-AlGaAs second cladding layer 308, and an upper surface and a side surface of the p-GaAs contact layer 309, and the insulating film 310 formed on the p-GaAs contact layer 309 is removed by etching. A p-type ohmic electrode 311 composed of Cr/Au is formed on the p-GaAs contact layer 309 exposed to the exterior. Further, a p-side pad electrode 32 is formed by sputtering, vacuum evaporation, or electron beam evaporation so as to cover respective upper surfaces of the p-type ohmic electrode 311 and the insulating film 310.

The semiconductor layer 3t having a multilayer structure is thus formed on one surface of the n-GaAs substrate 5X.

Further, an n-electrode 33 (a common n-electrode 233) composed of AuGe/Ni/Au is formed on the other surface of the n-GaAs substrate 5X.

In the infrared semiconductor laser device 3, an infrared emission point 31 is formed at a position of the MQW active layer 304 below the ridge Ri. In this example, the MQW active layer 304 corresponds to the p-n junction interface 30 shown in FIG. 1.

Figure 12:
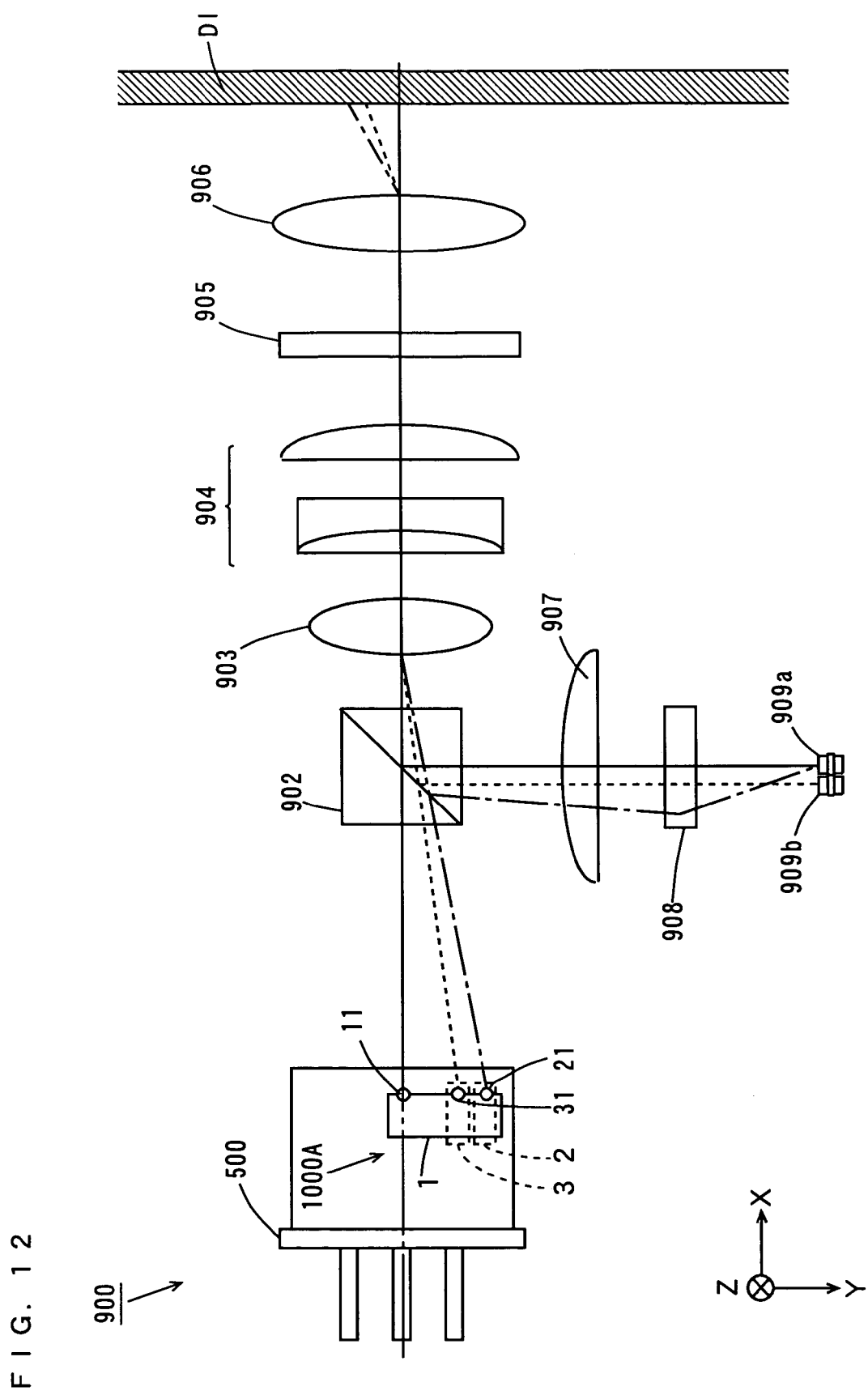
FIG. 12 is a diagram showing the configuration of an optical pickup apparatus according to the present embodiment.

(i) Configuration of Optical Pickup Apparatus Containing Semiconductor Laser Apparatus FIG. 12 is a diagram showing the configuration of an optical pickup apparatus 900 according to the present embodiment. In the following description, a laser beam having a wavelength of approximately 405 nm emitted from the blue-violet emission point 11 in the semiconductor laser apparatus 1000A is referred to as a blue-violet laser beam, a laser beam having a wavelength of approximately 650 nm emitted from the red emission point 21 is referred to as a red laser beam, and a laser beam having a wavelength of approximately 780 nm emitted from the infrared emission point 31 is referred to as an infrared laser beam. In FIG. 12, the blue-violet laser beam is indicated by a solid line, the infrared laser beam is indicated by a dotted line, and the red laser beam is indicated by a one-dot and dash line.

As shown in FIG. 12, the optical pickup apparatus 900 according to the present embodiment comprises a substantially round-shaped can package for laser devices 500 having the semiconductor laser apparatus 1000A mounted thereon, a polarizing beam splitter (hereinafter abbreviated as PBS) 902, a collimator lens 903, a beam expander 904, a λ/4 plate 905, an objective lens 906, a cylindrical lens 907, an optical axis correction element 908, and two photodetectors 909a and 909b.

In FIG. 12, three directions that are perpendicular to one another, as indicated by arrows X, Y, and Z, are respectively taken as an X-direction, a Y-direction, and a Z-direction. The X-direction is a direction perpendicular to an optical recording medium (hereinafter referred to as an optical disk) DI serving as a reproduction object. The Y-direction and the Z-direction are directions parallel to one surface of the optical disk DI and perpendicular to each other.

In the present embodiment, the substantially round-shaped can package for laser devices 500 having the semiconductor laser apparatus 1000A mounted thereon is arranged such that the blue-violet emission point 11, the red emission point 21, and the infrared emission point 31 are aligned on a substantially straight line along the Y-direction. Polarization planes of the laser beams respectively emitted from the blue-violet emission point 11, the red emission point 21, and the infrared emission point 31 are parallel to one another.

As described above, the blue-violet emission point 11 in the semiconductor laser apparatus 1000A is positioned in a substantially central portion on a Y-Z plane of the substantially round-shaped can package for laser devices 500.

In this example, the PBS 902, the collimator lens 903, the beam expander 904, the λ/4 plate 905, and the objective lens 906 that constitute an optical system are arranged in this order along the optical axis of a blue-violet laser beam emitted in the X-direction from the blue-violet emission point 11 (the center of the substantially round-shaped can package for laser devices 500). That is, the optical axis of the optical system from the PBS 902 to the objective lens 906 is aligned with the optical axis of the blue-violet laser beam.

The PBS 902 totally transmits each of the laser beams emitted from the semiconductor laser apparatus 1000A and totally reflects the laser beam returned from the optical disk DI.

The collimator lens 903 converts the blue-violet laser beam, the red laser beam, or the infrared laser beam from the semiconductor laser apparatus 1000A that has been transmitted through the PBS 902 into a parallel light beam.

The beam expander 904 comprises a concave lens, a convex lens, and an actuator (not shown). The actuator changes the distance between the concave lens and the convex lens depending on a servo signal from a servo circuit (not shown). This causes a wave front shape of each of the laser beams emitted from the semiconductor laser apparatus 1000A to be corrected.

The $\lambda/4$ plate 905 converts a linearly-polarized laser beam that has been converted into the parallel light beam by the collimator lens 903 into a circularly-polarized light beam. The $\lambda/4$ plate 905 converts the circularly-polarized laser beam returned from the optical disk DI into a linearly-polarized laser beam. The direction of polarization of the linearly-polarized laser beam in this case is perpendicular to the direction of polarization of the linearly-polarized laser beam emitted from the semiconductor laser apparatus 1000A. Thus, the laser beam returned from the optical disk DI is almost totally reflected by the PBS 902.

The objective lens 906 converges the laser beam that has been transmitted through the $\lambda/4$ plate 905 on a surface (a recording layer) of the optical disk DI.

The objective lens 906 is movable in a focusing direction, a tracking direction, and a tilt direction by an actuator (not shown) of the objective lens depending on a servo signal from a servo circuit (a tracking servo signal, a focusing servo signal, and a tilt servo signal).

The cylindrical lens 907, the optical axis correction element 908, and the photodetectors 909a and 909b are arranged along the optical axis of the laser beam totally reflected by the PBS 902.

The cylindrical lens 907 applies an astigmatism to an incident laser beam. The optical axis correction element 908 is formed by a diffraction grating. Height of the diffraction grating is determined such that first-order diffracted light beams of a blue-violet semiconductor laser beam and an infrared semiconductor laser beam and a zeroth-order diffracted light beam of a red semiconductor laser beam are weakened and such that zeroth-order diffracted light beams of a blue-violet semiconductor laser beam an infrared semiconductor laser beam and a first-order diffracted light beam of a red semiconductor laser beam is enhanced. If a binary diffraction grating is used as the diffraction grating, height of the diffraction grating is set to about $4n\lambda$, where n, and $\lambda$ is a refractive index of the diffraction grating and the wavelength of a blue-violet laser beam, respectively. The optical axis correction element 908 introduces a blue-violet laser beam (a zeroth-order diffracted light beam) that has been transmitted through the cylindrical lens 907 into the photodetector 909a. Further, the optical axis correction element 908 introduces an infrared laser beam (a zeroth-order diffracted light beam) into the photodetector 909b.

Furthermore, the optical axis correction element 908 diffracts a red laser beam that has been transmitted through the cylindrical lens 907, and introduces the diffracted red laser beam (a first-order diffracted light beam) into the photodetector 909a. In this case, the optical axis correction element 908 is positioned such that the position of a focusing spot formed on a light detecting surface of the photodetector 909a by the blue-violet laser beam and the position of a focusing spot formed on the light detecting surface of the photodetector 909a by the red laser beam coincide with each other.

Each of the photodetectors 909a and 909b outputs a reproduction signal on the basis of the intensity distribution of the received laser beam. Here, each of the photodetectors 909a and 909b has a detection region in a predetermined pattern such that a focusing error signal, a tracking error signal, and a tilt error signal, together with the reproduction signal, are obtained. An actuator of the beam expander 904 and an actuator of the objective lens are subjected to feedback control by the focusing error signal, the tracking error signal, and the tilt error signal.

(j) Effect of Optical Pickup Apparatus by Configuration of Semiconductor Laser Apparatus As shown in FIG. 12, in the optical pickup apparatus 900, the blue-violet laser beam, the infrared laser beam, or the red laser beam is incident on the optical axis correction element 908 formed by the diffraction grating.

Here, in the diffraction grating, respective diffraction efficiencies for a light beam having a certain wavelength and a light beam having a wavelength that is n times (n is a natural number) the wavelength can be equalized. That is, a diffraction efficiency in a case where the light beam having a certain wavelength is incident on the diffraction grating and a diffraction efficiency in a case where the light beam having a wavelength that is n times the wavelength can be equalized.

The blue-violet laser beam is a laser beam having a wavelength of approximately 405 nm, and the infrared laser beam is a laser beam having a wavelength of approximately 780 nm. Thus, the infrared laser beam has a wavelength that is approximately two times that of the blue-violet laser beam. A diffraction efficiency in a case where the blue-violet laser beam is incident on the diffraction grating and a diffraction efficiency in a case where the infrared laser beam is incident on the diffraction grating can substantially be equalized. Then, because the wavelength of the red laser beam is not n times (n is a natural number) the respective wavelengths of the blue-violet laser beam and the infrared laser beam, the optical axis correction element 908 allows a diffraction efficiency different from those for the blue-violet laser beam to be given for the red laser beam.

Here, the height of the diffraction grating is determined such that the first-order diffracted light beams of the blue-violet semiconductor laser beam and the infrared semiconductor laser beam are weakened and such that the zeroth-order diffracted light beams of the blue-violet semiconductor laser beam and the infrared semiconductor laser beam is enhanced. As a result, the position of a focusing spot of the blue-violet laser beam and the position of a focusing spot of the infrared laser beam cannot be matched with each other by diffraction.

In the present embodiment, therefore, the photodetectors 909a and 909b are respectively provided in correspondence with the blue-violet laser beam and the infrared laser beam that pass through the optical axis correction element 908.

Here, the height of the diffraction grating is determined such that the zeroth-order diffracted light beam of the red semiconductor laser beam are weakened and such that the first-order diffracted light beam of the red semiconductor laser beam is enhanced. Thus, the optical axis correction element 908 allows the position of a focusing spot of the red laser beam to be easily matched with the respective positions of the focusing spots of the blue-violet laser beam and the infrared laser beam. As a result, the blue-violet laser beam and the red laser beam can be received by the common photodetector 909a.

In the optical pickup apparatus 900 according to the present embodiment, therefore, the photodetector 909a that is common between the blue-violet laser beam and the red laser beam is used. This eliminates the necessity of providing three photodetectors respectively corresponding to the blue-violet laser beam, the red laser beam, and the infrared laser beam, thereby realizing miniaturization of the optical pickup apparatus 900.

In the semiconductor laser apparatus 1000A according to the present embodiment, the blue-violet emission point 11, the infrared emission point 31, and the red emission point 21 are arranged so as to lien up on an approximately straight line in the Y-direction, so that the distance between the blue-violet emission point 11 and the infrared emission point 31 is shortened.

In a case where the semiconductor laser apparatus 1000A is contained in the optical pickup apparatus 900, the distance between an optical path of the blue-violet laser beam and an optical path of the infrared laser beam within the optical pickup apparatus 900 is reduced. As a result, the two photodetectors 909a and 909b respectively corresponding to the blue-violet laser beam and the infrared laser beam can be arranged in close proximity to each other. As a result, an arrangement space of the two photodetectors 909a and 909b in the optical pickup apparatus 900 is reduced, thereby realizing miniaturization of the optical pickup apparatus 900.

Furthermore, in the semiconductor laser apparatus 1000A, the blue-violet emission point 11, the infrared emission point 31, and the red emission point 21 line up in this order on the substantially straight line along the Y-direction. In a case where the semiconductor laser apparatus 1000A is used for the optical pickup apparatus 900, therefore, the optical pickup apparatus 900 is easy to design.

(k) Another Example of Configuration of Optical Pickup Apparatus

In the optical pickup apparatus 900 according to the present embodiment, a focusing error signal is generated using an astigmatism method. Further, a tracking error signal is generated using a differential phase detection (DPD) method, for example.

In the foregoing, the position of the focusing spot formed in the photodetector 909a by the blue-violet laser beam and the position of the focusing spot formed in the photodetector 909a by the red laser beam are matched with each other by the optical axis correction element 908 arranged between the cylindrical lens 907 and the photodetectors 909a and 909b.

Here, the optical axis correction element 908 may be provided in the optical system from the PBS 902 to the objective lens 906. For example, the optical axis correction element 908 is arranged between the semiconductor laser apparatus 1000A and the PBS 902. In this case, the position of a focusing spot formed in the photodetector 909a by the blue-violet laser beam and the position of a focusing spot formed on the photodetector 909a by the red laser beam can be also matched with each other.

Furthermore, although in this example, the position of the focusing spot formed in the photodetector 909a by the blue-violet laser beam and the position of a focusing spot formed in the photodetector 909a by the red laser beam are matched with each other, the red laser beam may be introduced into the photodetector 909b so that the position of the focusing spot formed in the photodetector 909b by the infrared laser beam and the position of the focusing spot formed in the photodetector 909b by the red laser beam are matched with each other. In this case, the photodetector 909b serves as an photodetector that is common between the infrared laser beam and the red laser beam.

(2) Second Embodiment

A semiconductor laser apparatus according to a second embodiment has the same configuration as the semiconductor laser apparatus 1000A according to the first embodiment except for the following points.

(a) Configuration of Semiconductor Laser Apparatus

Figure 13:
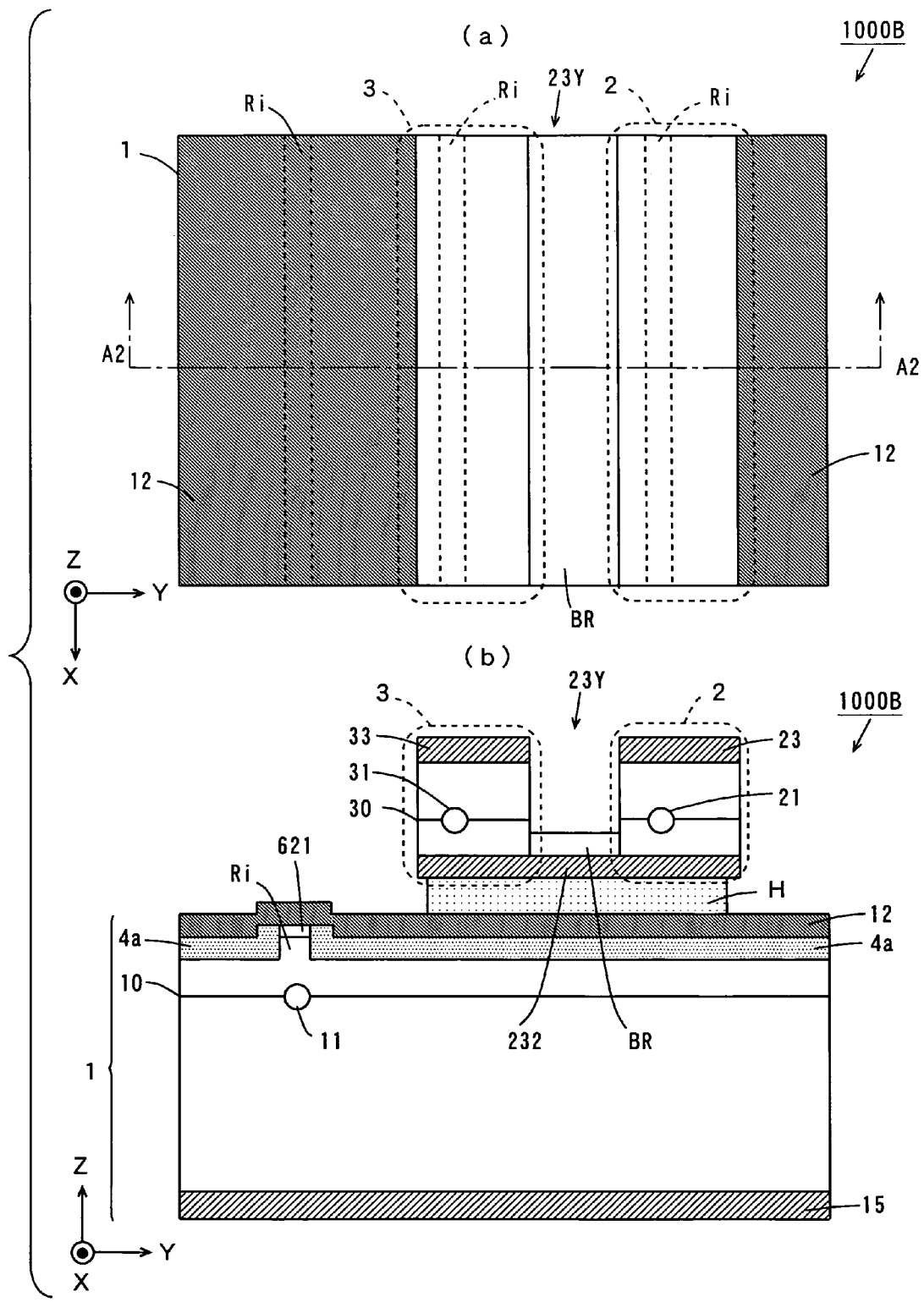
FIG. 13 is a schematic view for explaining the configuration of a semiconductor laser apparatus according to a second embodiment.

FIG. 13 is a schematic view for explaining the configuration of a semiconductor laser apparatus according to a second embodiment. FIG. 13 (a) is a top view showing an example of the semiconductor laser apparatus according to the second embodiment, and FIG. 13 (b) is a cross-sectional view taken along a line A2-A2 shown in FIG. 13 (a). In FIG. 13, an X-direction, a Y-direction, and a Z-direction are also defined, as in FIG. 1.

As shown in FIGS. 13 (a) and 13 (b), in a blue-violet semiconductor laser device 1 in a semiconductor laser apparatus 1000B according to the present embodiment, a p-side pad electrode 12 is formed so as to cover the whole of respective upper surfaces of a p-type ohmic electrode 621 and an insulating film 4a. A solder film H is formed in a predetermined region on the p-side pad electrode 12. Further, a monolithic red/infrared semiconductor laser device 23Y having a red semiconductor laser device 2 and an infrared semiconductor laser device 3 integrally formed therein is joined to the solder film H.

Here, the monolithic red/infrared semiconductor laser device 23Y shown in FIG. 13 has a different configuration from the monolithic red/infrared semiconductor laser device 23X shown in FIG. 1. In the monolithic red/infrared semiconductor laser device 23Y shown in FIG. 13, a semiconductor layer 2t in a red semiconductor laser device 2 (see FIG. 10) and a semiconductor layer 3t in an infrared semiconductor laser device 3 (see FIG. 11) are connected to each other by a connecting portion BR.

The connecting portion BR may comprise a part of the semiconductor layer 2t in the red semiconductor laser device 2 or the semiconductor layer 3t in the infrared semiconductor laser device 3. For example, the connecting portion BR may be a current blocking layer (e.g., insulating films 210 and 310 shown in FIGS. 10 and 11) for limiting the flow of a current in the red semiconductor laser device 2 and the infrared semiconductor laser device 3 or may be a p-type contact layer.

Thus, the semiconductor layer 2t in the red semiconductor laser device 2, the semiconductor layer 3t in the infrared semiconductor laser device 3, and the connecting portion BR respectively have continuous planes. In the monolithic red/infrared semiconductor laser device 23Y, a common p-side pad electrode 232 is formed on the continuous planes.

The common p-side pad electrode 232 in the monolithic red/infrared semiconductor laser device 23Y is joined to the solder film H on the blue-violet semiconductor laser device 1. Here, the blue-violet semiconductor laser device 1 and the monolithic red/infrared semiconductor laser device 23Y are joined to each other such that the infrared semiconductor laser device 3 comes closer to a ridge Ri in the blue-violet semiconductor laser device 1 than the red semiconductor laser device 2 in the Y-direction.

In the red semiconductor laser device 2 in the monolithic red/infrared semiconductor laser device 23Y, an n-electrode 23 is formed on a surface opposite to the common p-side pad electrode 232. In the infrared semiconductor laser device 3, an n-electrode 33 is formed on a surface opposite to the common p-side pad electrode 232.

(b) State where Semiconductor Laser Apparatus is Mounted on Package for Laser Devices FIG. 14 is a schematic front view showing a state where the semiconductor laser apparatus 1000B shown in FIG. 13 is mounted within the substantially round-shaped can package for laser devices 500 shown in FIG. 3 to remove the cover 504. In FIG. 14, an X-direction, a Y-direction, and a Z-direction are also defined, as in FIG. 1.

In the present embodiment, an insulating submount 505Z is formed on a supporting member 505 in the substantially round-shaped can package for laser devices 500.

As shown in FIG. 14, the semiconductor laser apparatus 1000B shown in FIG. 13 is made to adhere on an insulating submount 505Z with an adhesion layer 505H sandwiched therebetween.

A power feed pin 501a is connected to an n-electrode 23 (an n-electrode 23 in the red semiconductor laser device 2) in the semiconductor laser apparatus 1000B through a wire W1. A power feed pin 501b is connected to the exposed adhesion layer 505H on the submount 505Z through a wire W2. A power feed pin 501c is connected to an n-electrode 33 (an n-electrode 33 in the infrared semiconductor laser device 3) in the semiconductor laser apparatus 1000B through a wire W3.

On the other hand, the p-side pad electrode 12 and the supporting member 505 that are exposed on the blue-violet semiconductor laser device 1 are electrically connected to each other through a wire W4.

Here, the p-side pad electrode 12 on the blue-violet semiconductor laser device 1 is electrically connected to the common p-side pad electrode 232 in the monolithic red/infrared semiconductor laser device 23Y. Thus, common anode wire connection of the blue-violet semiconductor laser device 1, the red semiconductor laser device 2, and the infrared semiconductor laser device 3 is implemented.

The red semiconductor laser device 2 can be driven by applying a voltage between the power feed pin 501a and a power feed pin 502. The blue-violet semiconductor laser device 1 can be driven by applying a voltage between the power feed pin 501b and the power feed pin 502. The infrared semiconductor laser device 3 can be driven by applying a voltage between the power feed pin 501c and the power feed pin 502. The blue-violet semiconductor laser device 1, the red semiconductor laser device 2, and the infrared semiconductor laser device 3 can be thus independently driven.

In the present embodiment, the distance between a blue-violet emission point 11 and an infrared emission point 31 in the Y-direction is adjusted to approximately 110 μm, for example. Further, the distance between a red emission point 21 and the infrared emission point 31 in the Y-direction is adjusted to approximately 40 μm, for example.

The width of the blue-violet semiconductor laser device 1 in the Y-direction is approximately 400 μm, for example. The width of the monolithic red/infrared semiconductor laser device 23Y in the Y-direction is approximately 200 μm, for example.

(c) Effect in State where Semiconductor Laser Apparatus is Mounted on Package for Laser Devices In the present embodiment, the semiconductor laser apparatus 1000B is also made to adhere to the submount 505Z such that the blue-violet emission point 11 in the blue-violet semiconductor laser apparatus 1 is positioned at the center of the extraction window 504a in the cover 504 (see FIG. 3). Thus, the same effect as that in the first embodiment can be obtained.

In the present embodiment, when the semiconductor laser apparatus 1000B is mounted on the substantially round-shaped can package for laser devices 500, the power feed pins 501a, 501c, and 501b are respectively connected to the n-electrodes 23 and 33 that are exposed on the top of the semiconductor laser apparatus 1000B and the exposed adhesion layer 505H by the wires W1, W3, and W2. This makes it easy to connect the wires W1 to W3 with respect to the semiconductor laser apparatus 1000B.

The semiconductor laser apparatus 1000B according to the present embodiment can be used for the optical pickup apparatus 900 shown in FIG. 12. This allows the same effect as that in the first embodiment to be obtained.

Striped ridges extending in the X-direction are also respectively formed in areas, where the common p-side pad electrode 232 is formed, in the red semiconductor laser device 2 and the infrared semiconductor laser 3, which are not illustrated in FIGS. 13 (b) and 14. Consequently, a p-type ohmic electrode (not shown) is formed on each of the ridges.

In the present embodiment, chips of the blue-violet semiconductor laser device 1 and chips of the monolithic red/infrared semiconductor laser device 23Y may be previously individually formed, and the chips may be affixed to one another to manufacture the semiconductor laser apparatus 1000B.

(3) Third Embodiment

A semiconductor laser apparatus according to a third embodiment has the same configuration as the semiconductor laser apparatus 1000A according to the first embodiment except for the following points.

(a) Configuration of Semiconductor Laser Apparatus

Figure 15:
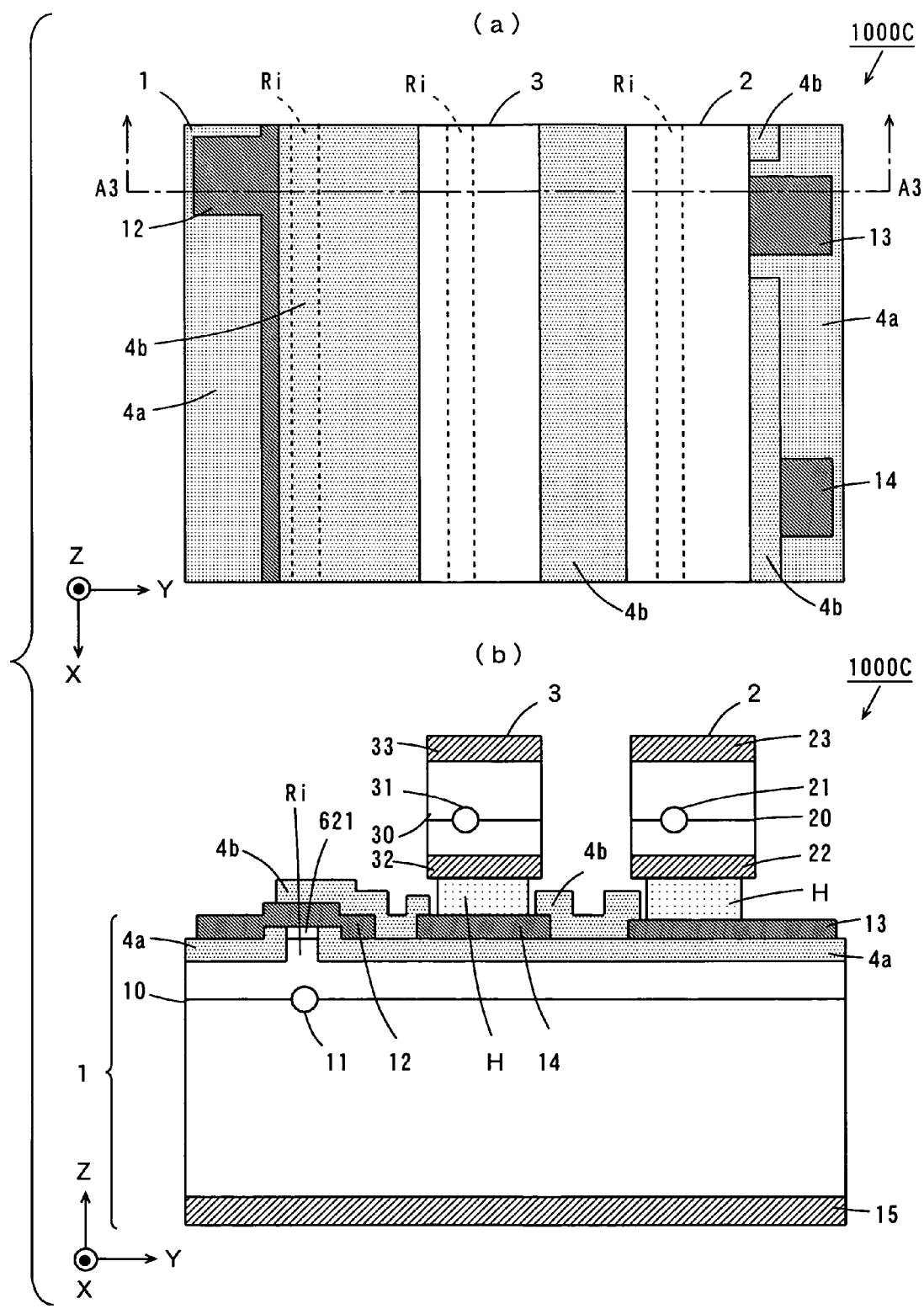
FIG. 15 is a schematic view for explaining the configuration of a semiconductor laser apparatus according to a third embodiment.
Figure 16:
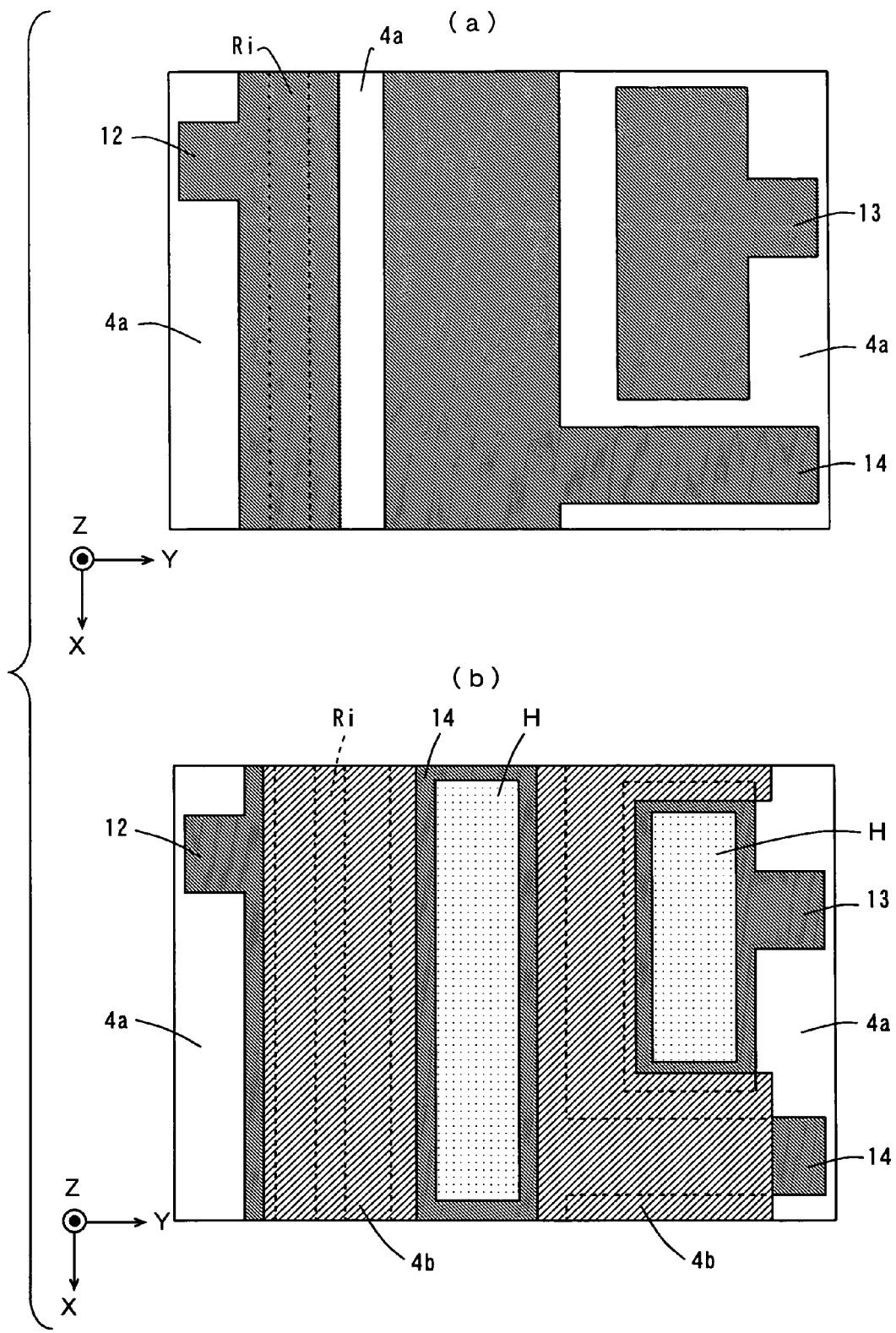
FIG. 16 is a schematic view of a junction plane of a blue-violet semiconductor laser device, a red semiconductor laser device, and an infrared semiconductor laser device in the semiconductor laser apparatus shown in FIG. 15.

FIG. 15 is a schematic view for explaining the configuration of a semiconductor laser apparatus according to a third embodiment. FIG. 15 (a) is a top view showing an example of the semiconductor laser apparatus according to the third embodiment, and FIG. 15 (b) is a cross-sectional view taken along a line A3-A3 shown in FIG. 15 (a). FIG. 16 is a schematic view of a junction plane of a blue-violet semiconductor laser device 1, a red semiconductor laser device 2, and an infrared semiconductor laser device 3 in the semiconductor laser apparatus shown in FIG. 15. In FIGS. 15 and 16, an X-direction, a Y-direction, and a Z-direction are also defined, as in FIG. 1.

As shown in FIGS. 15 (a) and 15 (b), a ridge Ri in the blue-violet semiconductor laser device 1 is positioned in an area offset from the center of the blue-violet semiconductor laser device 1 in the Y-direction. The red semiconductor laser device 2 and the infrared semiconductor laser device 3 are individually joined to the blue-violet semiconductor laser device 1.

In the Y-direction, the red semiconductor laser device 2 and the infrared semiconductor laser device 3 are joined to the blue-violet semiconductor laser device 1 such that the infrared semiconductor laser device 3 is positioned in a substantially central portion of the blue-violet semiconductor laser device 1 and the red semiconductor laser device 2 is positioned on the opposite side of the ridge Ri in the blue-violet semiconductor laser device 1 with the infrared semiconductor laser device 3 used as its bases.

A junction of the blue-violet semiconductor laser device 1, the red semiconductor laser device 2, and the infrared semiconductor laser device 3 will be described.

As shown in FIG. 16 (a), p-side pad electrodes 12, 13, and 14 are respectively formed in correspondence with the blue-violet semiconductor laser device 1, the red semiconductor laser device 2, and the infrared semiconductor laser device 3 on an insulating film 4a in the blue-violet semiconductor laser device 1.

The p-side pad electrode 12 extends in the X-direction along the ridge Ri in the blue-violet semiconductor laser device 1, and its part extends in the Y-direction.

The p-side pad electrode 14 is formed so as to be adjacent to the p-side pad electrode 12. The p-side pad electrode 14 extends in the X-direction in a substantially central portion of the blue-violet semiconductor laser device 1, and its part extends in the Y-direction opposite to the direction in which the p-side pad electrode 12 extends.

The p-side pad electrode 13 is formed so as to be adjacent to the p-side pad electrode 14. The p-side pad electrode 13 extends in the X-direction in the vicinity of a corner of the blue-violet semiconductor laser device 1, and its part extends in the Y-direction opposite to the direction in which the p-side pad electrode 12 extends.

The p-side pad electrodes 12, 13, and 14 are formed so as to be spaced apart one another on the insulating film 4a. Thus, the p-side pad electrodes 12, 13, and 14 are electrically isolated from one another.

As shown in FIG. 16 (b), an insulating film 4b is formed in a predetermined pattern on the insulating film 4a and the p-side pad electrodes 12, 13 and 14. The insulating film 4b is formed such that respective one ends of the p-side pad electrodes 12, 13, and 14 extending in the Y-direction are exposed.

Here, the p-side pad electrode 12 extends in the Y-direction opposite to the direction in which the p-side pad electrodes 13 and 14 extend, and the p-side pad electrodes 14 and 13 extend in the Y-direction opposite to the direction in which the p-side pad electrode 12 extends. Consequently, an exposed portion of the p-side pad electrode 12 is positioned on one side surface of the blue-violet semiconductor laser device 1 in the Y-direction, and respective exposed portions of the p-side pad electrodes 13 and 14 are positioned on the other side surface of the blue-violet semiconductor laser device 1 in the Y-direction.

Wires for driving the semiconductor laser devices are bonded to respective one ends of the exposed p-side pad electrodes 12, 13, and 14. A region having a width of approximately 100 μm and having a length of approximately 100 μm at the one end of each of the p-side pad electrodes 12, 13, and 14 extending in the Y-direction is exposed.

The insulating film 4b is formed such that a portion of the p-side pad electrode 14 is exposed along the X-direction in the substantially central portion of the blue-violet semiconductor laser device 1. A solder film H composed of Au—Sn is also formed in the exposed portion of the p-side pad electrode 14.

Furthermore, the insulating film 4b is formed such that a substantially central portion of the p-side pad electrode 13 is exposed. A solder film H composed of Au—Sn is also formed in the exposed portion of the p-side pad electrode 13.

Therefore, a p-side pad electrode 22 in the red semiconductor laser device 2 is joined to the p-side pad electrode 13 with the solder film H sandwiched therebetween, and the p-side pad electrode 32 in the infrared semiconductor laser device 3 is joined to the p-side pad electrode 14 with the solder film H sandwiched therebetween.

Thus, the p-side pad electrode 22 in the red semiconductor laser device 2 is electrically connected to the p-side pad electrode 13, and the p-side pad electrode 32 in the infrared semiconductor laser device 3 is electrically connected to the p-side pad electrode 14.

In the foregoing, the red semiconductor laser device 2 and the infrared semiconductor laser device 3 are joined to the patterned insulating film 4b, the p-side pad electrode 32 in the infrared semiconductor laser device 3 and the p-side pad electrodes 12 and 13 are prevented from coming into contact with each other, and the p-side pad electrode 32 in the red semiconductor laser device 2 and the p-side pad electrode 14 are prevented from coming into contact with each other.

Figure 17:
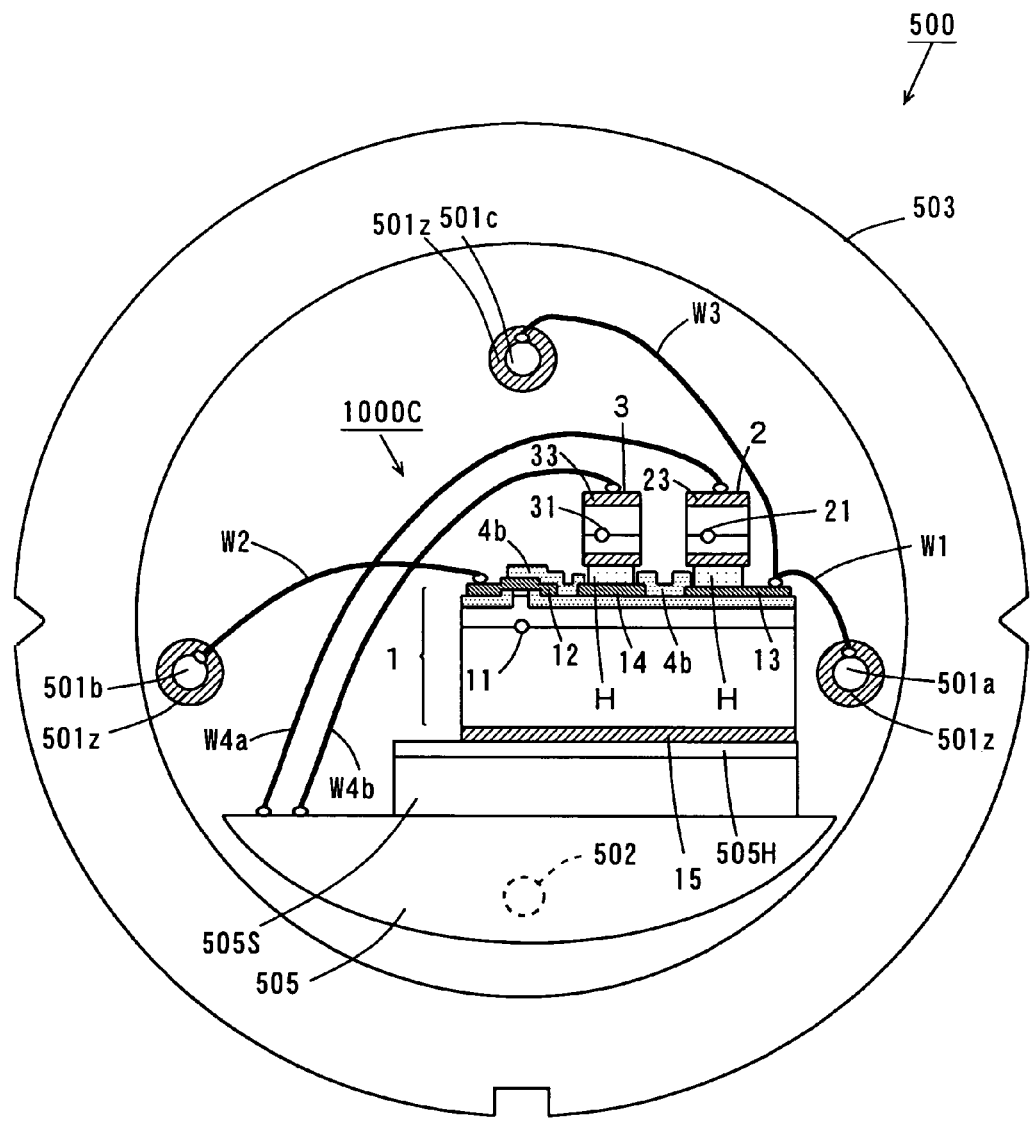
FIG. 17 is a schematic front view showing a state where the semiconductor laser apparatus shown in FIG. 15 is mounted within the substantially round-shaped can package for laser devices shown in FIG. 3 to remove the cover.
Figure 18:
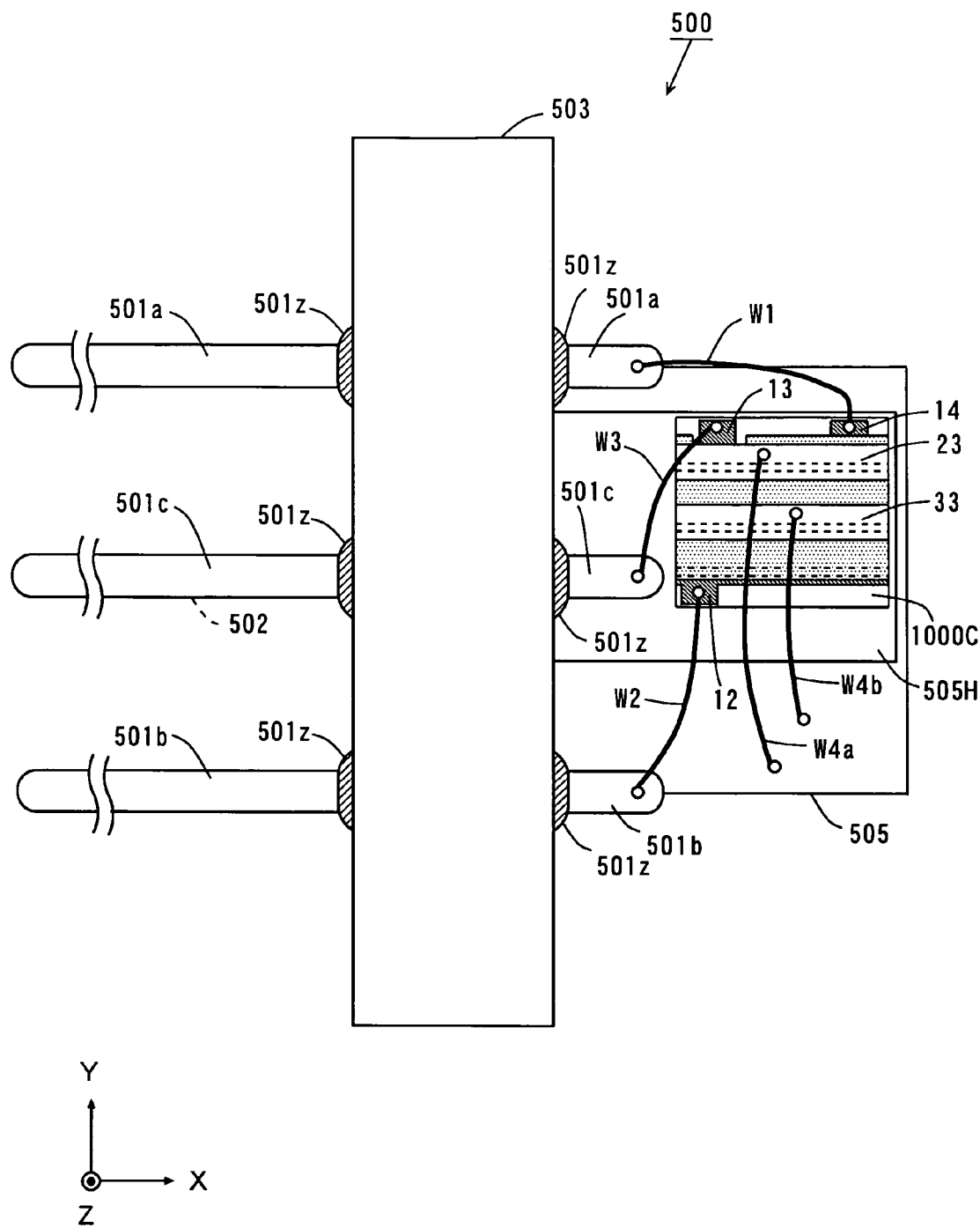
FIG. 18 is a schematic top view showing a state where the semiconductor laser apparatus shown in FIG. 15 is mounted within the substantially round-shaped can package for laser devices shown in FIG. 3 to remove the cover.

(b) State where Semiconductor Laser apparatus is Mounted on Package for Laser Devices FIG. 17 is a schematic front view showing a state where the semiconductor laser apparatus 1000C shown in FIG. 15 is mounted within the substantially round-shaped can package for laser devices 500 shown in FIG. 3 to remove the cover 504, and FIG. 18 is a schematic top view showing a state where the semiconductor laser apparatus 1000C shown in FIG. 15 is mounted within the substantially round-shaped can package for laser devices 500 shown in FIG. 3 to remove the cover 504. In FIG. 17, the semiconductor laser apparatus 1000C provided in the substantially round-shaped can package for laser devices 500 is indicated by a cross section taken along a line A3-A3 in FIG. 15 (a). In FIGS. 17 and 18, an X-direction, a Y-direction, and a Z-direction are also defined, as in FIG. 1.

As shown in FIGS. 17 and 18, a submount 505S having electrically conductive properties similar to that in the first embodiment is provided on a supporting member 505 having electrically conductive properties integrated with a substantially round-shaped can package main body 503.

The semiconductor laser apparatus 1000C shown in FIG. 15 is made to adhere on the submount 505S with an adhesion layer 505H sandwiched therebetween. In the present embodiment, the semiconductor laser apparatus 1000C is made to adhere to the submount 505S such that a blue-violet emission point 11 in the blue-violet semiconductor laser apparatus 1 is positioned at the center of the extraction window 504a in the cover 504 (see FIG. 3).

A power feed pin 501a is connected to one end of the p-side pad electrode 14 in the semiconductor laser apparatus 1000C through a wire W1. A power feed pin 501b is connected to one end of the p-side pad electrode 12 in the semiconductor laser apparatus 1000C through a wire W2. A power feed pin 501c is connected to one end of the p-side pad electrode 13 in the semiconductor laser apparatus 1000C through a wire W3.

On the other hand, an exposed upper surface of the supporting member 505 and n-electrodes 23 and 33 in the semiconductor laser apparatus 1000C are electrically connected to each other through wires W4a and W4b.

The supporting member 505 is electrically connected to the semiconductor laser apparatus 1000C with the submount 505S and the adhesion layer 505H sandwiched therebetween. Thus, a power feed pin 502 is electrically connected to an n-electrode 15 in the blue-violet semiconductor laser device 1 and the respective n-electrodes 23 and 33 in the red semiconductor laser device 2 and the infrared semiconductor laser device 3. That is, common cathode wire connection of the blue-violet semiconductor laser device 1, the red semiconductor laser device 2, and the infrared semiconductor laser device 3 is implemented.

The infrared semiconductor laser device 3 can be driven by applying a voltage between the power feed pin 501a and the power feed pin 502. The blue-violet semiconductor laser device 1 can be driven by applying a voltage between the power feed pin 501*b* and the power feed pin 502. The red semiconductor laser device 2 can be driven by applying a voltage between the power feedpin 501*c* and the power feed pin 502. The blue-violet semiconductor laser device 1, the red semiconductor laser device 2, and the infrared semiconductor laser device 3 can be thus independently driven.

In the semiconductor laser apparatus 1000C according to the present embodiment, the p-side pad electrodes 12, 13, and 14 are electrically isolated from one another, as described above. Thus, arbitrary voltages can be respectively applied to the p-side pad electrodes 12, 13, and 14 in the blue-violet semiconductor laser device 1, the red semiconductor laser device 2, and the infrared semiconductor laser device 3. Consequently, a system for driving the blue-violet semiconductor laser device 1, the red semiconductor laser device 2, and the infrared semiconductor laser device 3 can be arbitrary selected.

In the present embodiment, the distance between the blue-violet emission point 11 and the infrared emission point 31 in the Y-direction is adjusted to approximately 110 μm, for example. Further, the distance between the red emission point 21 and the infrared emission point 31 in the Y-direction is adjusted to approximately 190 μm, for example.

The width of the blue-violet semiconductor laser device 1 in the Y-direction is approximately 700 μm, for example. The width of each of the red semiconductor laser device 2 and the infrared semiconductor laser device 3 in the Y-direction is approximately 200 μm, for example.

(c) Effect in State where Semiconductor Laser Apparatus is Mounted on Package for Laser Devices In the present embodiment, the semiconductor laser apparatus 1000C is made to adhere to the submount 505S (the adhesion layer 505H) such that the blue-violet emission point 11 in the blue-violet semiconductor laser apparatus 1 is positioned at the center of the extraction window 504*a* in the cover 504 (see FIG. 3). Thus, the same effect as that in the first embodiment can be obtained.

As shown in FIG. 15 (*a*), in the semiconductor laser apparatus 1000C according to the present embodiment, respective one ends of the p-side pad electrodes 13 and 14 extending in the Y-direction project from a side surface of the red semiconductor laser device 2 in the Y-direction through areas among the blue-violet semiconductor laser device 1, the red semiconductor laser device 2, and the infrared semiconductor laser device 3 on the insulating film 4*a* in the blue-violet semiconductor laser device 1. Thus, the respective exposed portions of the p-side pads 13 and 14 extending in the Y-direction are arranged on a substantially straight line in the X-direction, so that the width in the Y-direction of the blue-violet semiconductor laser device 1 can be reduced.

The respective exposed portions of the p-side pad electrodes 13 and 14 extending in the Y-direction are arranged on the substantially straight line in the X-direction, so that an arrangement space of the red semiconductor laser device 2 and the infrared semiconductor laser device 3 on the blue-violet semiconductor laser device 1 in the Y-direction can be increased. Consequently, the respective widths of the red semiconductor laser device 2 and the infrared semiconductor laser device 3 in the Y-direction can be increased.

Furthermore, in the present embodiment, the p-side pad electrode 12 extends in the Y-direction opposite to the direction in which the p-side pad electrodes 13 and 14 extend. The p-side pad electrode 12 is exposed in an area on the opposite side of the red semiconductor laser device 2 and the infrared semiconductor laser device 3 with respect to the ridge Ri in the blue-violet semiconductor laser device 1 in the Y-direction.

Consequently, the blue-violet emission point 11, the red emission point 21, and the infrared emission point 31 are positioned among the exposed portions of the p-side pad electrodes 12, 13, and 14 in the Y-direction. Thus, an area where a wire is bonded is not positioned between the emission points in the Y-direction. Therefore, the respective positions where the red semiconductor laser device 2 and the infrared semiconductor laser device 3 are arranged can be brought near the ridge Ri in the blue-violet semiconductor laser device 1. In this case, the distance between the blue-violet emission point 11 and the infrared emission point 31 can be reduced.

The exposed portions of the p-side pad electrodes 12, 13, and 14 are respectively required to have predetermined sizes for bonding wires. In a case where the respective exposed portions of the p-side pad electrodes 12, 13, and 14 are arranged among the ridge Ri in the blue-violet semiconductor laser device 1 and the infrared semiconductor laser device 3, therefore, the distance between the blue-violet emission point 11 and the infrared emission point 31 cannot be reduced.

In the semiconductor laser apparatus 1000C according to the present embodiment, the p-side pad electrodes 12, 13, and 14 do not cross one another on the insulating film 4*a* in the blue-violet semiconductor laser device 1. Consequently, the p-side pad electrodes 12, 13, and 14 can be simultaneously formed on the insulating film 4*a*. As a result, the manufacturing processes are simplified, and the configuration is simplified.

In the present embodiment, the p-side pad electrode 13 positioned in an area farther from a laser beam emission facet of the semiconductor laser apparatus 1000C than the p-side pad electrode 14 is connected to the power feed pin 501*c* opposed to the supporting member 505 through the wire W3, as shown in FIG. 18. In other words, the p-side pad electrode 13 close to the substantially round-shaped can package main body 503 out of the exposed portions of the p-side pad electrodes 13 and 14 arranged in the X-direction and the power feed pin 501*c* are connected to each other through the wire W3. Thus, the wires W3 and W1 respectively connected between the p-side pad electrodes 13 and 14 and the power feed pins 501*c* and 501*a* are prevented from crossing one another.

The respective arrangements of the exposed portions of the p-side pad electrodes 13 and 14 in the X-direction may be exchanged. In this case, the p-side pad electrode 14 in the infrared semiconductor laser device 3 and the power feed pin 501*c* are connected to each other through a wire. Further, the p-side pad electrode 13 in the red semiconductor laser device 2 and the power feed pin 501*a* are connected to each other through a wire.

The semiconductor laser apparatus 1000C according to the present embodiment can be used for the optical pickup apparatus 900 shown in FIG. 12. This allows the same effect as that in the first embodiment to be obtained.

Striped ridges extending in the X-direction are also formed in respective areas where the p-side pad electrodes 22 and 32 are formed in the red semiconductor laser device 2 and the infrared semiconductor laser 3, which are not illustrated in FIGS. 15(*b*) and 17. Consequently, a p-type ohmic electrode (not shown) is formed on each of the ridges.

In the present embodiment, respective chips of the blue-violet semiconductor laser device 1, the red semiconductor laser device 2, and the infrared semiconductor laser device 3 may be previously individually formed, and the chips may be affixed to one another to manufacture the semiconductor laser apparatus 1000C.

(4) Fourth Embodiment

A semiconductor laser apparatus according to a fourth embodiment has the same configuration as the semiconductor laser apparatus 1000A according to the first embodiment except for the following points.

(a) Configuration of Semiconductor Laser Apparatus

Figure 19:
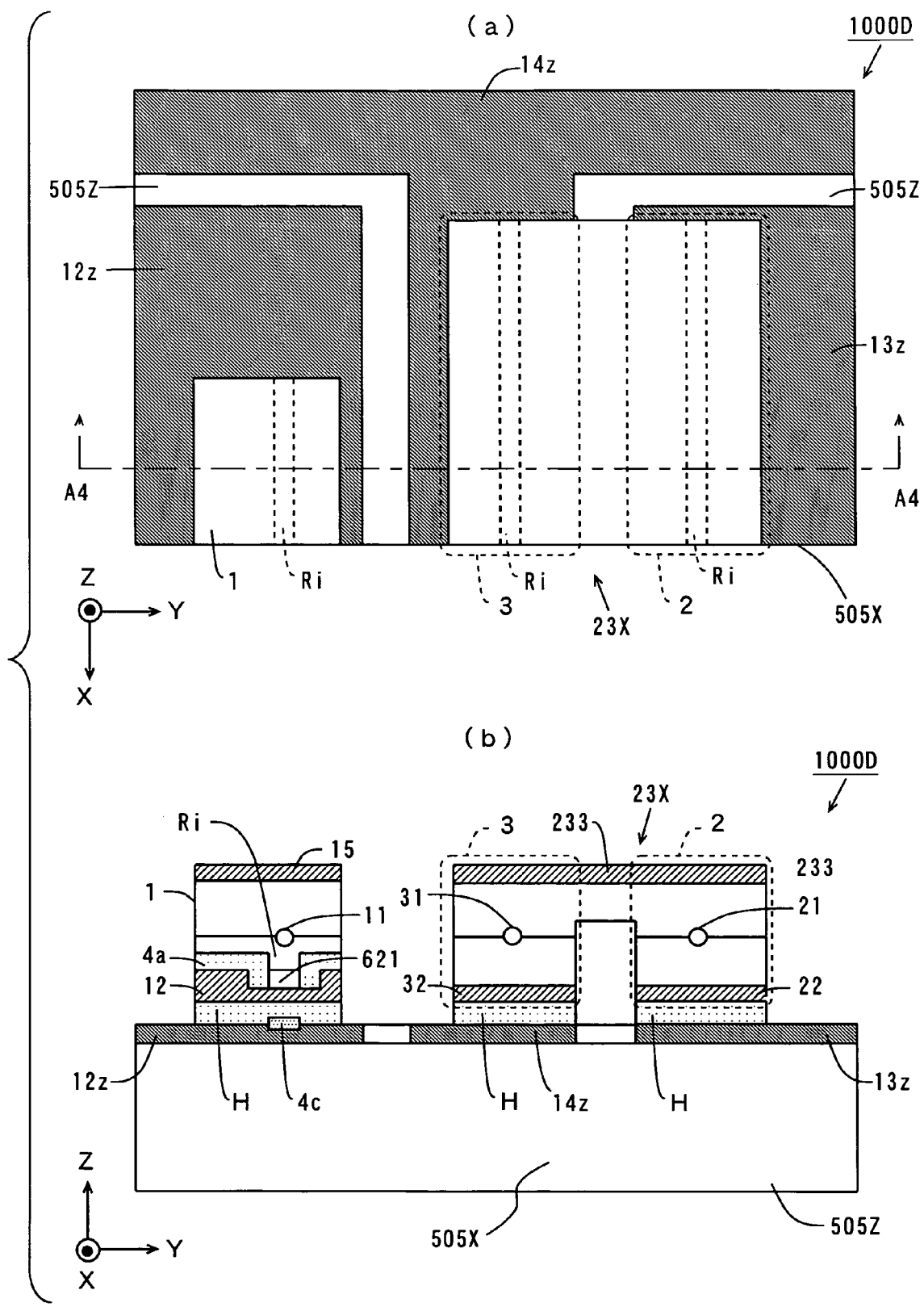
FIG. 19 is a schematic view for explaining the configuration of a semiconductor laser apparatus according to a fourth embodiment.
Figure 20:
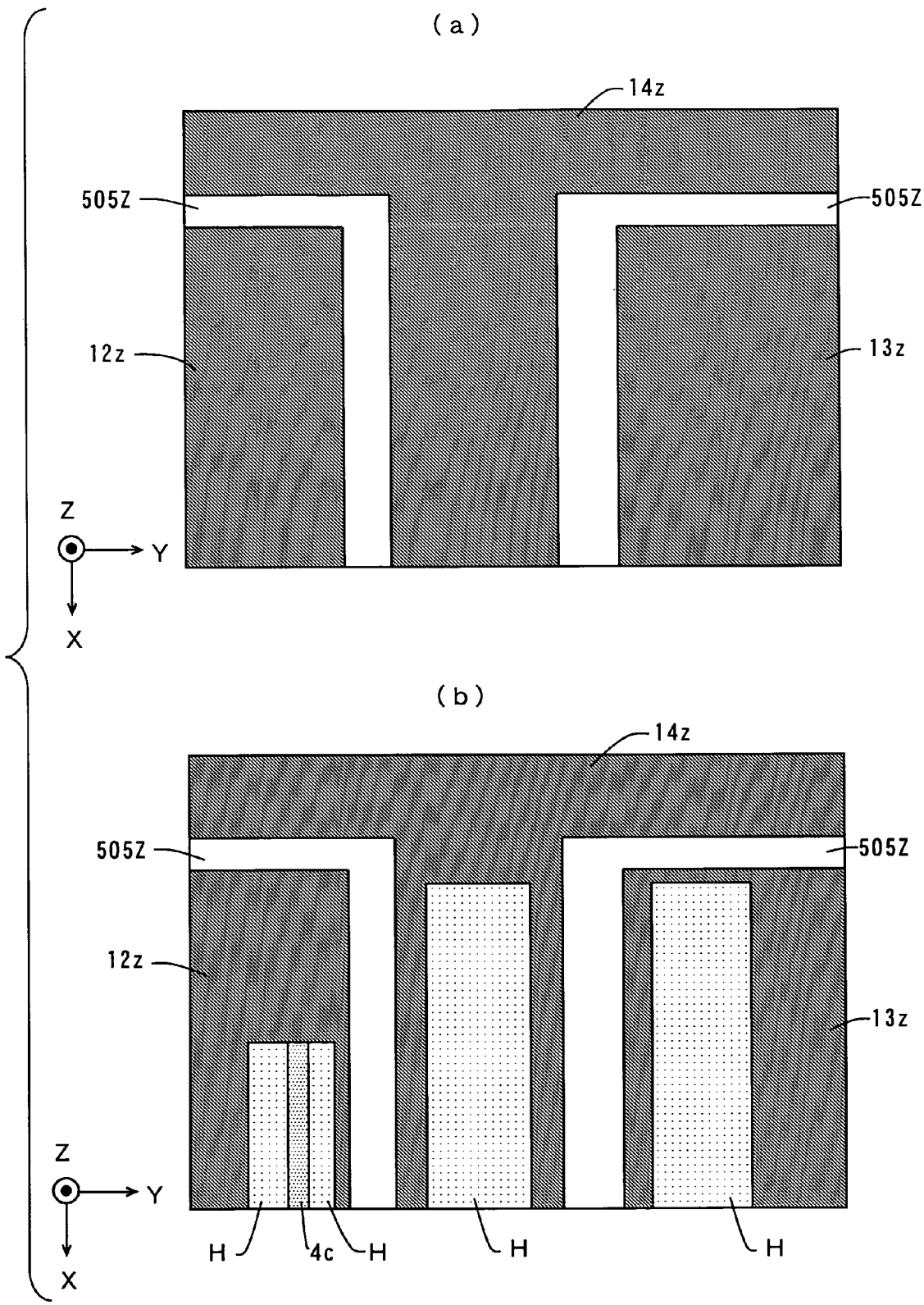
FIG. 20 is a schematic view of a junction of a blue-violet semiconductor laser device, a monolithic red/infrared semiconductor laser device, and a submount in the semiconductor laser apparatus shown in FIG. 19.

FIG. 19 is a schematic view for explaining the configuration of a semiconductor laser apparatus according to a fourth embodiment. FIG. 19 (a) is a top view showing an example of the semiconductor laser apparatus according to the fourth embodiment, and FIG. 19 (b) is a cross-sectional view taken along a line A4-A4 shown in FIG. 19 (a). FIG. 20 is a schematic view of respective junctions between a blue-violet semiconductor laser device and a monolithic red/infrared semiconductor laser device and a submount in the semiconductor laser apparatus shown in FIG. 19. In FIGS. 19 and 20, an X-direction, a Y-direction, and a Z-direction are also defined, as in FIG. 1.

As shown in FIGS. 19 (a) and 19 (b), a semiconductor laser apparatus 1000D according to the present embodiment comprises a blue-violet semiconductor laser device 1, a monolithic red/infrared semiconductor laser device 23X, a solder film H, three p-side pad electrodes 12z, 13z, and 14z, an insulating film 4c, and a submount 505Z having insulating properties.

In the present embodiment, the submount 505Z is a plate-shaped member having a rectangular shape, and is arranged parallel to an X-Y plane. In the following description, one facet of the submount 505Z in the X-direction is referred to as a laser facet 505X, as shown in FIGS. 19 (a) and 19 (b).

As shown in FIG. 19 (b), a p-side pad electrode 12 in the blue-violet semiconductor laser device 1 is joined to the submount 505Z having insulating properties. P-side pad electrodes 22 and 32 in the monolithic red/infrared semiconductor laser device 23X are joined to the submount 505Z having insulating properties and beside the blue-violet semiconductor laser device 1 in the Y-direction.

That is, in the present embodiment, the semiconductor laser apparatus 1000D has a junction-down structure in which respective p-side pad electrodes in the blue-violet semiconductor laser device 1 and the monolithic red/infrared semiconductor laser device 23X are joined to the submount 505Z.

Although a ridge Ri is illustrated in only the blue-violet semiconductor laser device 1 in FIG. 19(b), ridges (not shown) are also similarly respectively formed in a red semiconductor laser device 2 and an infrared semiconductor laser device 3 in the monolithic red/infrared semiconductor laser device 23X.

The respective junctions of the submount 505Z with the blue-violet semiconductor laser device 1 and the monolithic red/infrared semiconductor laser device 23X will be described.

As shown in FIG. 20 (a), p-side pad electrodes 12z, 13z, and 14z are respectively formed in correspondence with the blue-violet semiconductor laser device 1, the red semiconductor laser device 2, and the infrared semiconductor laser device 3 on an insulating film 4a in the blue-violet semiconductor laser device 1.

The p-side pad electrode 12z is formed so as to extend in the X-direction on one side of the submount 505Z in the Y-direction. The p-side pad electrodes 13z is formed so as to extend in the X-direction on the other side of the submount 505Z in the Y-direction.

The p-side pad electrode 14z is formed so as to extend in the X-direction in a substantially central portion of the submount 505Z in the Y-direction and extend in the Y-direction at one end of the submount 505Z in the X-direction.

The p-side pad electrodes 12z, 13z, and 14z are spaced apart from one another on the submount 505z having insulating properties. Thus, the p-side pad electrodes 12z, 13z, and 14z are electrically isolated from one another.

As shown in FIG. 20 (b), the solder film H is formed in a predetermined region on the p-side pad electrodes 12z, 13z, and 14z. An insulating film 4c extending in the X-direction is further formed on the solder film H on the p-side pad electrode 12z. The solder film H is formed depending on a junction area of each of the semiconductor laser devices previously set on the p-side pad electrodes 12z, 13z, and 14z.

When the blue-violet semiconductor laser device 1 is joined to the submount 505Z, the blue-violet semiconductor laser device 1 is aligned with the solder film H on the p-side pad electrode 12z, and the ridge Ri in the blue-violet semiconductor laser device 1 is aligned with the insulating film 4c.

When the monolithic red/infrared semiconductor laser device 23X is joined to the submount 505Z, the red semiconductor laser device 2 is aligned with the solder film H on the p-side pad electrode 13Z, and the infrared semiconductor laser device 3 is aligned with the solder film H on the p-side pad electrode 14z.

As a result, the blue-violet semiconductor laser device 1, the infrared semiconductor laser device 3, and the red semiconductor laser device 2 are arranged so as to line up in this order in the Y-direction on the side of the laser facet 505X on the submount 505Z. The p-side pad electrodes 12 and 12z, the p-side pad electrodes 22 and 13z, and the p-side pad electrodes 32 and 14z are respectively electrically connected to each other.

The respective p-side pad electrodes 12, 22, and 32 in the blue-violet semiconductor laser device 1, the red semiconductor laser device 2, and the infrared semiconductor laser device 3 are electrically isolated from one another on the submount 505Z having insulating properties.

Here, the ridge Ri in the blue-violet semiconductor laser device 1 is positioned on the insulating film 4c, as described above. The insulating film 4c is arranged between the p-side pad electrode 12 and a p-type ohmic electrode 621, which are positioned in a region where the ridge Ri is formed, and the solder film H, so that the solder film H, the p-side pad electrode 12 and the p-type ohmic electrode 621 are prevented from being alloyed. As a result, a contact resistance in the semiconductor layer it (see FIG. 11) in the blue-violet semiconductor laser device 1 is prevented from being increased. The insulating film 4c is composed of $SiO_2$, for example.

In the present embodiment, the distance between a blue-violet emission point 11 and an infrared emission point 31 in the Y-direction is adjusted to approximately 110 μm, for example. Further, the distance between a red emission point 21 and the infrared emission point 31 in the Y-direction is adjusted to approximately 190 μm, for example.

As shown in FIG. 19 (b), the blue-violet emission point 11 is formed so as to be positioned nearer the infrared emission point 31 than the center of the blue-violet semiconductor laser device 1. The blue-violet emission point 11 is thus formed so that the distance between the blue-violet emission point 11 and the infrared emission point 31 can be reduced.

In the present embodiment, the cavity length of the blue-violet semiconductor laser device 1 extending in the X-direction is approximately 600 µm, for example. The cavity length of the monolithic red/infrared semiconductor laser device 23X extending in the X-direction is approximately 1200 µm, for example.

Figure 21:
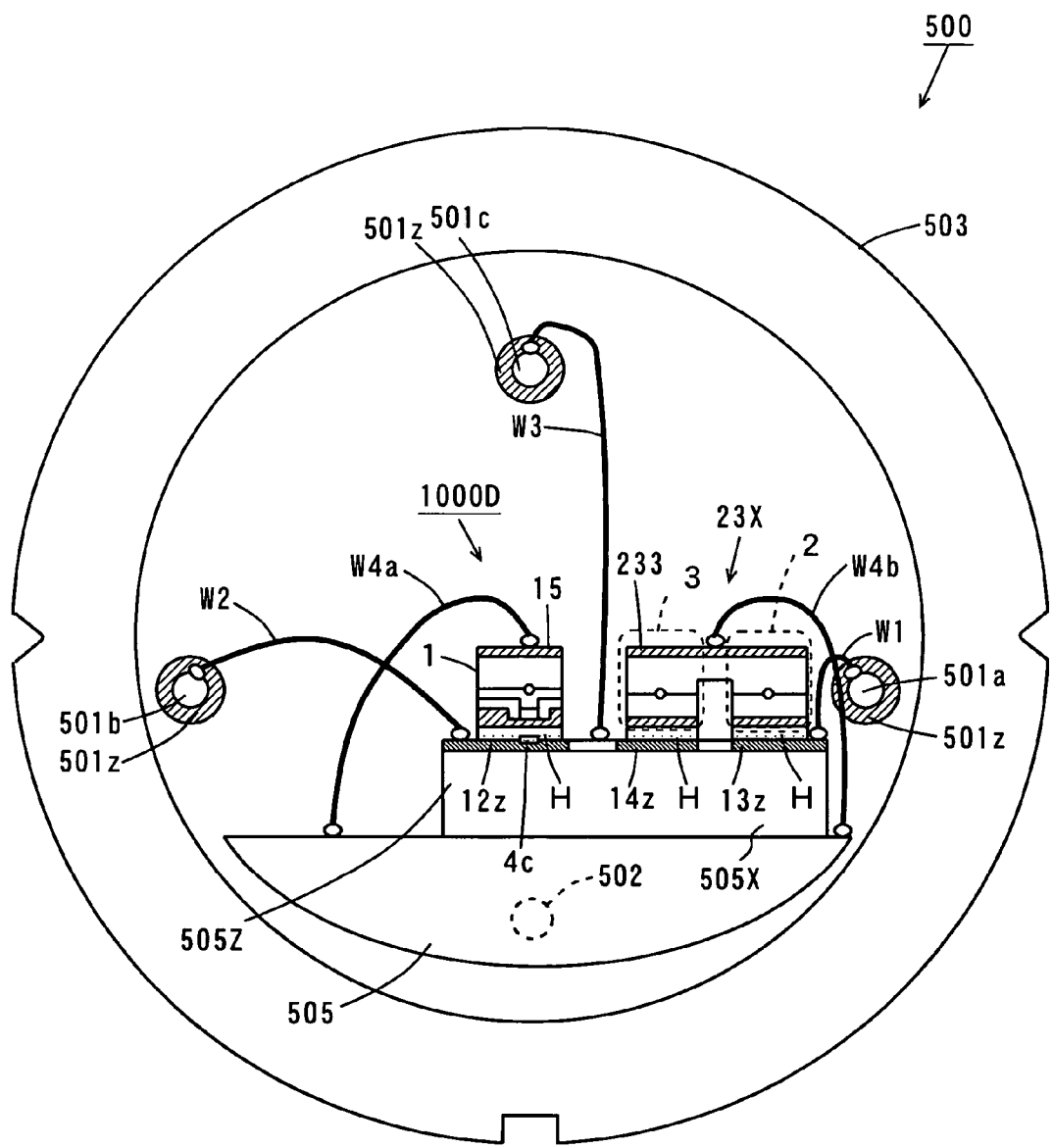
FIG. 21 is a schematic front view showing a state where the semiconductor laser apparatus shown in FIG. 19 is mounted within the substantially round-shaped can package for laser devices shown in FIG. 3 to remove the cover.

(b) State where Semiconductor Laser Apparatus is Mounted on Package for Laser Devices FIG. 21 is a schematic front view showing a state where the semiconductor laser apparatus 1000D shown in FIG. 19 is mounted within the substantially round-shaped can package for laser devices 500 shown in FIG. 3 to remove the cover 504. In FIG. 21, an X-direction, a Y-direction, and a Z-direction are also defined, as in FIG. 1.

As shown in FIG. 21, a submount 505Z in the semiconductor laser apparatus 1000D shown in FIG. 19 is provided on the supporting member 505 in the substantially round-shaped can package for laser devices 500.

The p-side pad electrodes 12z, 13z, and 14z are formed on the submount 505Z, and the blue-violet semiconductor laser device 1 and the monolithic red/infrared semiconductor laser device 23X are jointed to the p-side pad electrodes 12z, 13z, and 14z such that the blue-violet emission point 11 in the blue-violet semiconductor laser apparatus 1 is positioned at the center of the extraction window 504a in the cover 504 (see FIG. 3).

Furthermore, the semiconductor laser apparatus 1000D is arranged on the supporting member 505 such that the laser facet 505X of the submount 505Z is positioned on the side of a light emission facet (on the side of the extraction window 504a in the cover 504) in the substantially round-shaped can package for laser devices 500.

In the semiconductor laser apparatus 1000D, a wire is bonded to an exposed portion of the p-side pad electrode 12z beside the blue-violet semiconductor laser device 1 in the Y-direction, as shown in FIG. 19. A wire is bonded to an exposed portion of the p-side pad electrode 13z beside the monolithic red/infrared semiconductor laser device 23X in the Y-direction. Further, a wire is bonded to an exposed portion of the p-side pad electrode 14z at one end of the monolithic red/infrared semiconductor laser device 23X in the X-direction.

A power feed pin 501a is connected to the p-side pad electrode 13z in the semiconductor laser apparatus 1000D through a wire W1. A power feed pin 501b is connected to the p-side pad electrode 12z in the semiconductor laser apparatus 1000D through a wire W2. A power feed pin 501c is connected to the p-side pad electrode 14z in the semiconductor laser apparatus 1000D through a wire W3.

On the other hand, an exposed upper surface of the supporting member 505 is electrically connected to an n-electrode 15 and a common n-electrode 233 in the semiconductor laser apparatus 1000D, respectively, through wires W4a and W4b.

The supporting member 505 having electrically conductive properties is electrically isolated from the p-side pad electrodes 12z, 13z, and 14z in the semiconductor laser apparatus 1000D.

On the other hand, the supporting member 505 is electrically connected to the n-electrode 15 and the common n-electrode 233 in the semiconductor laser apparatus 1000D, respectively, by the wires W4a and W4b, so that a power feed pin 502 is electrically connected to the n-electrode 15 in the blue-violet semiconductor laser device 1 and the common n-electrode 233 in the monolithic red/infrared semiconductor laser device 23X. That is, common cathode wire connection of the blue-violet semiconductor laser device 1, the red semiconductor laser device 2, and the infrared semiconductor laser device 3 is implemented.

The red semiconductor laser device 2 can be driven by applying a voltage between the power feed pin 501a and the power feed pin 502. The blue-violet semiconductor laser device 1 can be driven by applying a voltage between the power feed pin 501b and the power feed pin 502. The infrared semiconductor laser device 3 can be driven by applying a voltage between the power feed pin 501c and the power feed pin 502. The blue-violet semiconductor laser device 1, the red semiconductor laser device 2, and the infrared semiconductor laser device 3 can be thus independently driven.

(c) Effect in State where Semiconductor Laser Apparatus is Mounted on Package for Laser Devices In the present embodiment, the semiconductor laser apparatus 1000D is also mounted on the substantially round-shaped can package for laser devices 500 such that the blue-violet emission point 11 in the blue-violet semiconductor laser apparatus 1 is positioned at the center of the extraction window 504a in the cover 504 (see FIG. 3). Thus, the same effect as that in the first embodiment can be obtained.

In the present embodiment, the p-side pad electrodes 12z, 13z, and 14z formed on the submount 505z do not cross one another. Consequently, the p-side pad electrodes 12z, 13z, and 14z can be simultaneously formed on the submount 505Z. As a result, the manufacturing processes are simplified, and the configuration is simplified.

The semiconductor laser apparatus 1000D according to the present embodiment can be used for the optical pickup apparatus 900 shown in FIG. 12. This allows the same effect as that in the first embodiment to be obtained.

In the present embodiment, the semiconductor laser apparatus 1000D has a junction-down structure on the submount 505Z. However, the semiconductor laser apparatus 1000D may have a junction-up structure in which the respective thicknesses of substrates in the blue-violet semiconductor laser device 1 and the monolithic red/infrared semiconductor laser device 23X are made nearly identical, and the n-electrode 15 in the blue-violet semiconductor laser device 1 and the common n-electrode 233 in the monolithic red/infrared semiconductor laser device 23X are joined to the submount 505Z.

(5) Fifth Embodiment

A semiconductor laser apparatus according to a fifth embodiment has the same configuration as the semiconductor laser apparatus 1000A according to the first embodiment except for the following points.

(a) Configuration of Semiconductor Laser Apparatus

Figure 22:
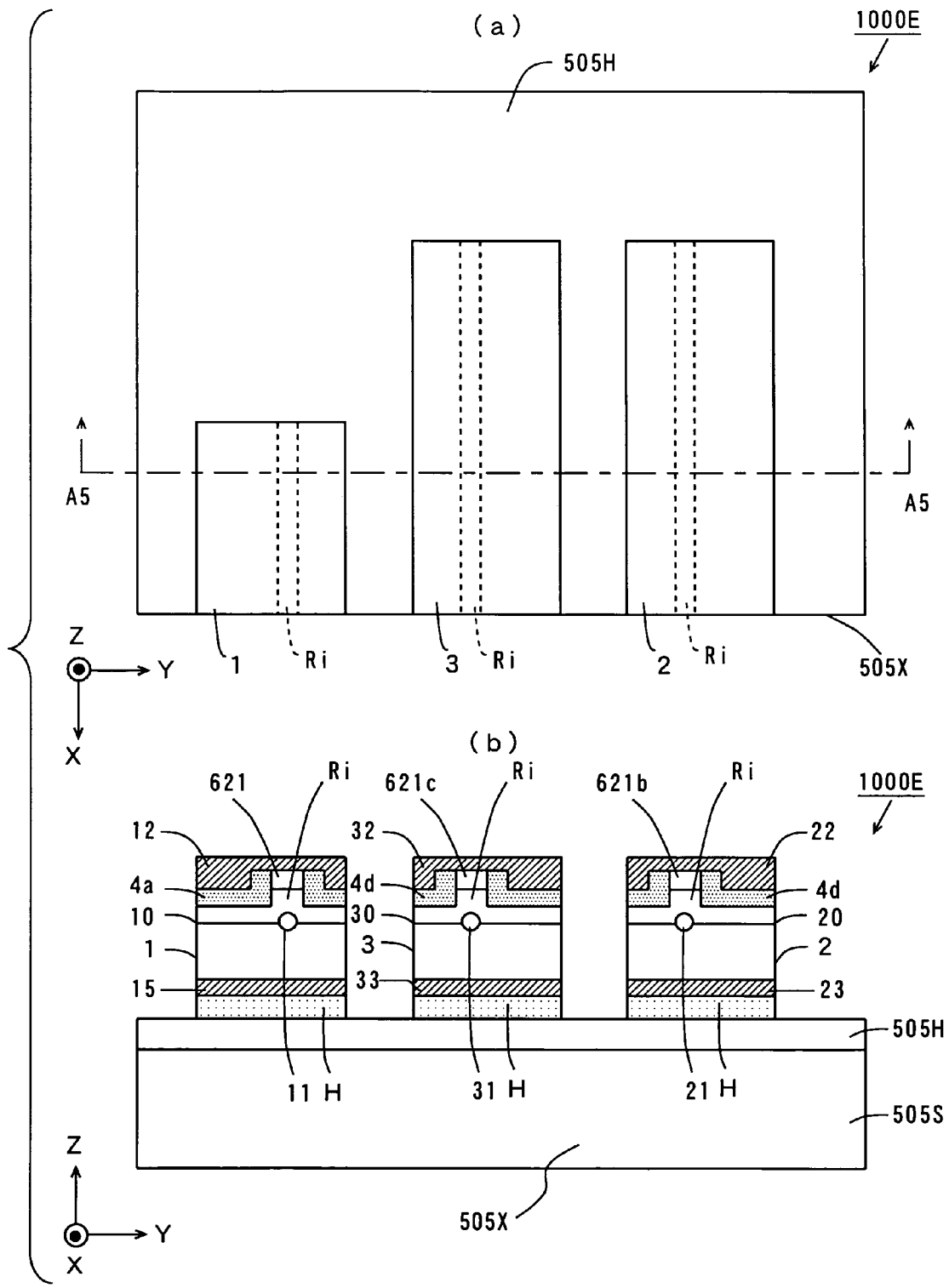
FIG. 22 is a schematic view for explaining the configuration of a semiconductor laser apparatus according to a fifth embodiment.

FIG. 22 is a schematic view for explaining the configuration of a semiconductor laser apparatus according to a fifth embodiment. FIG. 22 (*a*) is a top view showing an example of the semiconductor laser apparatus according to the fifth embodiment, and FIG. 22 (*b*) is a cross-sectional view taken along a line A5-A5 shown in FIG. 22 (*a*).

As shown in FIGS. 22 (*a*) and 22 (*b*), a semiconductor laser apparatus 1000E according to the present embodiment comprises a blue-violet semiconductor laser device 1, a red semiconductor laser device 2, an infrared semiconductor laser device 3, a solder film H, an adhesion layer 505H, and a submount 505S having electrically conductive properties.

In the present embodiment, the submount 505S is a plate-shaped member having a rectangular shape, and is arranged parallel to an X-Y plane. In the following description, one facet of the submount 505S in the X-direction is referred to as a laser facet 505X, as shown in FIGS. 22 (*a*) and 22 (*b*).

As shown in FIG. 19 (*b*), respective n-electrodes 15, 23, 33 in the blue-violet semiconductor laser device 1, the red semiconductor laser device 2, and the infrared semiconductor laser device 3 are joined to the submount 505S having electrically conductive properties (the adhesion layer 505H).

That is, in the present embodiment, the semiconductor laser apparatus 1000E has a junction-up structure in which respective n-electrodes in the blue-violet semiconductor laser device 1, the red semiconductor laser device 2, and the infrared semiconductor laser device 3 are joined to the submount 505S.

The basic configuration of the blue-violet semiconductor laser device 1 is the same as that of the blue-violet semiconductor laser device 1 used in the first embodiment. In FIG. 22, the red semiconductor laser device 2 and the infrared semiconductor laser device 3 have the following configuration.

As shown in FIGS. 22 (*a*) and 22 (*b*), a striped ridge Ri extending in the X-direction is formed on an upper surface of the red semiconductor laser device 2. An insulating film 4*d* is formed so as to cover the upper surface of the red semiconductor laser device 2 on a side surface of the ridge Ri and on both sides of the ridge Ri. A p-type ohmic electrode 621*b* is formed on the upper surface of the ridge Ri. A p-side pad electrode 22 is formed so as to cover an upper surface of the p-type ohmic electrode 621*b* and the insulating film 4*d* in the vicinity of the ridge Ri.

The infrared semiconductor laser device 3 includes an insulating film 4*d*, similarly to the red semiconductor laser device 2. A p-type ohmic electrode 621*c* is formed on an upper surface of the ridge Ri in the infrared semiconductor laser device 3.

The solder film H is formed in each of junctions of the blue-violet semiconductor laser device 1, the red semiconductor laser device 2, and the infrared semiconductor laser device 3 with the submount 505S (the adhesion layer 505H). Thus, respective n-electrodes in the semiconductor laser devices are electrically connected to one another.

Here, the blue-violet semiconductor laser device 1, the infrared semiconductor laser device 3, and the red semiconductor laser device 2 are arranged so as to line up in this order in the Y-direction on the side of the laser facet 505X on the adhesion layer 505H.

In the present embodiment, the distance between a blue-violet emission point 11 and an infrared emission point 31 in the Y-direction is adjusted to approximately 110 μm, for example. Further, the distance between a red emission point 21 and the infrared emission point 31 in the Y-direction is adjusted to approximately 400 μm, for example.

Here, as shown in FIG. 22 (*b*), the blue-violet emission point 11 is formed so as to be positioned nearer the infrared emission point 31 than the center of the blue-violet semiconductor laser device 1 in the Y-direction. The infrared emission point 31 is formed so as to be positioned nearer the blue-violet emission point 11 than the center of the infrared semiconductor laser device 3. Further, the red emission point 21 is formed so as to be positioned nearer the infrared emission point 31 than the center of the red semiconductor laser device 2.

The blue-violet emission point 11 and the infrared emission point 31 are thus formed so that the distance between the blue-violet emission point 11 and the infrared emission point 31 can be reduced.

In the present embodiment, the cavity length of the blue-violet semiconductor laser device 1 extending in the X-direction is approximately 800 μm, for example. The respective cavity lengths of the red semiconductor laser device 2 and the infrared semiconductor laser device 3 extending in the X-direction are approximately 1200 μm, for example.

Figure 23:
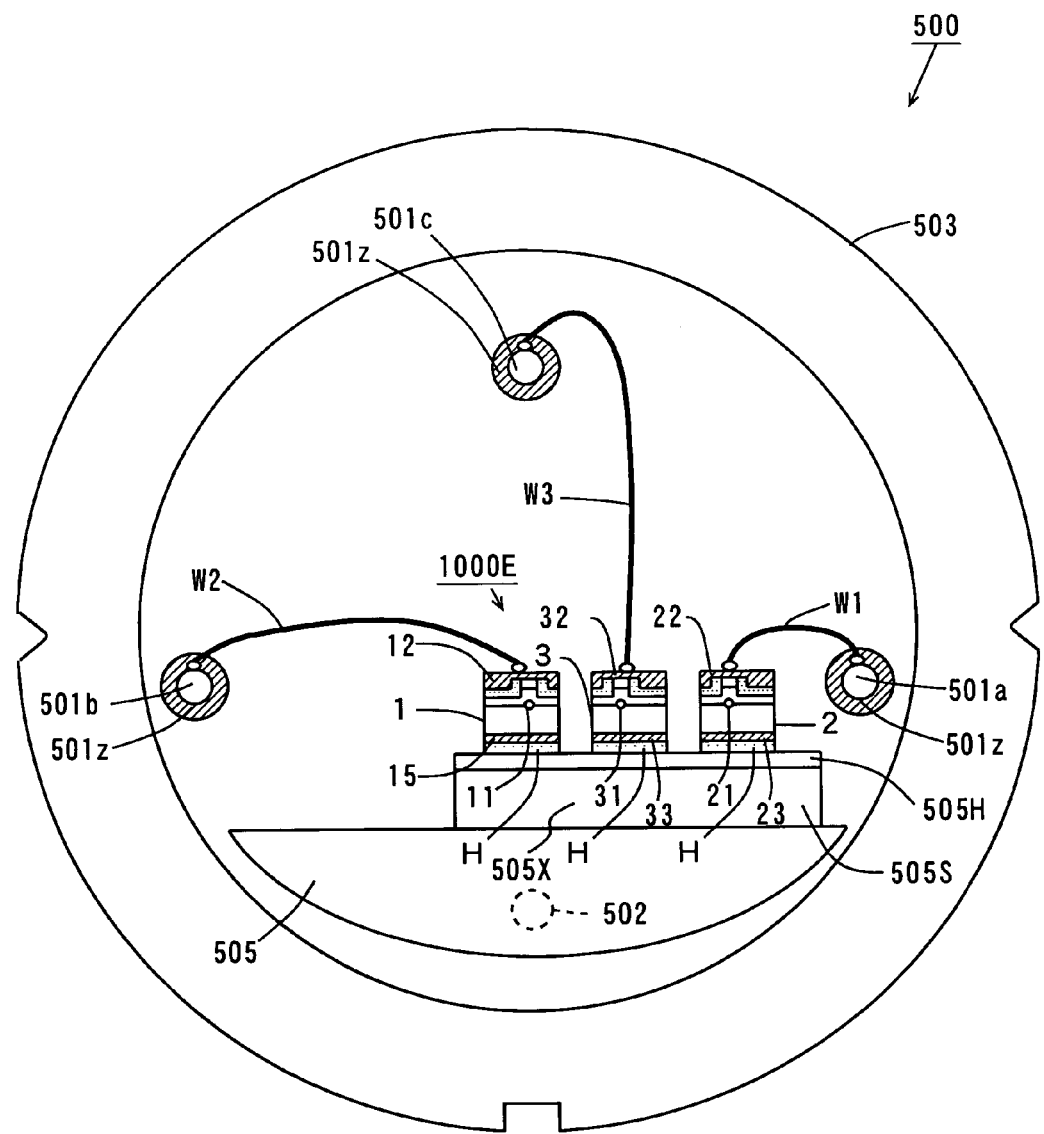
FIG. 23 is a schematic front view showing a state where the semiconductor laser apparatus shown in FIG. 22 is mounted within the substantially round-shaped can package for laser devices shown in FIG. 3 to remove the cover.

(b) State where Semiconductor Laser Apparatus is Mounted on Package for Laser Devices FIG. 23 is a schematic front view showing a state where the semiconductor laser apparatus 1000E shown in FIG. 22 is mounted within the substantially round-shaped can package for laser devices 500 shown in FIG. 3 to remove the cover 504. In FIG. 23, an X-direction, a Y-direction, and a Z-direction are also defined, as in FIG. 1.

As shown in FIG. 23, the submount 505S in the semiconductor laser apparatus 1000D is provided on a supporting member 505 in the substantially round-shaped can package for laser devices 500.

Here, the blue-violet semiconductor laser device 1, the red semiconductor laser device 2, and the infrared semiconductor laser device 3 are joined to the adhesion layer 505H on the submount 505S such that the blue-violet emission point 11 in the blue-violet semiconductor laser apparatus 1 is positioned at the center of the extraction window 504*a* in the cover 504 (see FIG. 3).

Furthermore, the semiconductor laser apparatus 1000E is arranged on the supporting member 505 such that the laser facet 505X of the submount 505S is positioned on the side of a light emission facet of the substantially round-shaped can package for laser devices 500 (on the side of the extraction window 504*a* in the cover 504).

A power feed pin 501*a* is connected to one end of the p-side pad electrode 22 in the semiconductor laser apparatus 1000E through a wire W1. A power feed pin 501*b* is connected to one end of the p-side pad electrode 12 in the semiconductor laser apparatus 1000E through a wire W2. A power feed pin 501*c* is connected to one end of a p-side pad electrode 32 in the semiconductor laser apparatus 1000E through a wire W3.

The supporting member 505 is electrically connected to the n-electrodes 15, 23, and 33 with the submount 505S, the adhesion layer 505H, and the solder film H sandwiched therebetween. Thus, a power feed pin 502 is electrically connected to the respective n-electrodes 15, 23, and 33 in the blue-violet semiconductor laser device 1, the red semiconductor laser device 2, and the infrared semiconductor laser device 3. That is, common cathode wire connection of the blue-violet semiconductor laser device 1, the red semiconductor laser device 2, and the infrared semiconductor laser device 3 is implemented.

The red semiconductor laser device 2 can be driven by applying a voltage between the power feed pin 501*a* and the power feed pin 502. The blue-violet semiconductor laser device 1 can be driven by applying a voltage between the power feed pin 501*b* and the power feed pin 502. The infrared semiconductor laser device 3 can be driven by applying a voltage between the power feed pin 501*c* and the power feed pin 502. The blue-violet semiconductor laser device 1, the red semiconductor laser device 2, and the infrared semiconductor laser device 3 can be thus independently driven.

(c) Effect in State where Semiconductor Laser Apparatus is Mounted on Package for Laser Devices In the present embodiment, the semiconductor laser apparatus 1000E is also mounted on the substantially round-shaped can package for laser devices 500 such that the blue-violet emission point 11 in the blue-violet semiconductor laser apparatus 1 is positioned at the center of the extraction window 504a in the cover 504 (see FIG. 3). Thus, the same effect as that in the first embodiment can be obtained.

The semiconductor laser apparatus 1000E according to the present embodiment can be used for the optical pickup apparatus 900 shown in FIG. 12. This allows the same effect as that in the first embodiment to be obtained.

In the present embodiment, the semiconductor laser apparatus 1000E has a junction-up structure on the submount 505S. However, the semiconductor laser apparatus 1000E may have a junction-down structure in which the respective thicknesses of substrates in the blue-violet semiconductor laser device 1, the red semiconductor laser device 2, and the infrared semiconductor laser device 3 are made nearly identical, and the respective p-side pad electrodes 12, 22, and 32 in the blue-violet semiconductor laser device 1, the red semiconductor laser device 2, and the infrared semiconductor laser device 3 are joined to the submount 505S.

(6) Correspondence to Claims

In the following two paragraphs, non-limiting examples of correspondences between various elements recited in the claims below and those described above with respect to various preferred embodiments of the present invention are explained. In the first to fifth embodiments described above, the X-direction corresponds to a first direction, the laser beam having a wavelength of 405 nm and the blue-violet laser beam correspond to a light beam having a first wavelength, the blue-violet emission point 11 corresponds to a first emission point, the blue-violet semiconductor laser device 1 corresponds to a first semiconductor laser device, the laser beam having a wavelength of approximately 650 nm and the red laser beam correspond to a light beam having a second wavelength, the red emission point 21 corresponds to a second emission point, the red semiconductor laser device 2 corresponds to a second semiconductor laser device, the laser beam having a wavelength of approximately 780 nm and the infrared laser beam correspond to a light beam having a third wavelength, the infrared emission point 31 corresponds to a third emission point, the infrared semiconductor laser device 3 corresponds to a third semiconductor laser device, and the Y-Z plane corresponds to a first surface perpendicular to the first direction.

The Y-direction corresponds to a second direction, the n-GaN substrate is corresponds to a first substrate, the semiconductor layer it corresponds to a first semiconductor layer, the p-side pad electrode 12 corresponds to a first electrode, the semiconductor layer 2t corresponds to a second semiconductor layer, the p-side pad electrode 22 corresponds to a second electrode, the semiconductor layer 3t corresponds to a third semiconductor laser, the p-side pad electrode 32 corresponds to a third electrode, and the insulating film 4a corresponds to an insulating layer.

Furthermore, the optical disk DI corresponds to an optical recording medium, the photodetector 909a corresponds to a first photodetector, the photodetector 909b corresponds to a second photodetector, the PBS 902, the collimator lens 903, the beam expander 904, the λ/4 plate 905, the objective lens 906, the cylindrical lens 907, and the optical axis correction element 908 correspond to an optical system, and the optical axis correction element 908 corresponds to a diffraction grating.

Although in the first to fifth embodiments, described above, the example in which the semiconductor laser apparatus is mounted on the substantially round-shaped can package for laser devices was illustrated, the present invention is not limited to the same. For example, the present invention is also applicable to a case where the semiconductor laser apparatus is mounted on another package such as a frame-type package for laser devices.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A semiconductor laser apparatus comprising:
   a first semiconductor laser device having a first emission point emitting a light beam having a first wavelength in a direction substantially parallel to a first direction;
   a second semiconductor laser device having a second emission point emitting a light beam having a second wavelength different from a natural number times said first wavelength in the direction substantially parallel to the first direction; and
   a third semiconductor laser device having a third emission point emitting a light beam having a third wavelength substantially equal to a natural number times said first wavelength in the direction substantially parallel to the first direction,
   the distance between said first emission point and said third emission point being shorter than at least one of the distance between said first emission point and said second emission point and the distance between said second emission point and said third emission point on a first plane perpendicular to said first direction, and
   wherein said second and third semiconductor laser devices are joined to said first semiconductor laser device,
   said first semiconductor laser device comprises a nitride based semiconductor layer,
   said second semiconductor laser device comprises a gallium indium phosphide based semiconductor layer, and
   said third semiconductor laser device comprises a gallium arsenide based semiconductor layer.

2. The semiconductor laser apparatus according to claim 1, wherein
   said first, second, and third emission points are arranged along a second direction crossing said first direction, and
   said third emission point is positioned between said first emission point and said second emission point.

3. The semiconductor laser apparatus according to claim 2, wherein
   said first semiconductor laser device comprises a first substrate, and
   said second direction is substantially parallel to one surface of said first substrate.

4. The semiconductor laser apparatus according to claim 1, further comprising a connecting portion that connects said second semiconductor laser device and said third semiconductor laser device to each other.

5. The semiconductor laser apparatus according to claim 1, wherein
   the light beam having said first wavelength is a blue-violet light beam,
   the light beam having said second wavelength is a red light beam, and
   the light beam having said third wavelength is an infrared light beam.

6. A semiconductor laser apparatus comprising:
a first semiconductor laser device having a first emission point emitting a light beam having a first wavelength in a direction substantially parallel to a first direction;
a second semiconductor laser device having a second emission point emitting a light beam having a second wavelength different from a natural number times said first wavelength in the direction substantially parallel to the first direction; and
a third semiconductor laser device having a third emission point emitting a light beam having a third wavelength substantially equal to a natural number times said first wavelength in the direction substantially parallel to the first direction,
the distance between said first emission point and said third emission point being shorter than at least one of the distance between said first emission point and said second emission point and the distance between said second emission point and said third emission point on a first plane perpendicular to said first direction,
wherein said second and third semiconductor laser devices are joined to said first semiconductor laser device, and wherein
said first semiconductor laser device comprises a first semiconductor layer having said first emission point and a first electrode formed on said first semiconductor layer,
said second semiconductor laser device comprises a second semiconductor layer having said second emission point and a second electrode formed on said second semiconductor layer,
said third semiconductor laser device comprises a third semiconductor layer having said third emission point and a third electrode formed on said third semiconductor layer, and
said second and third electrodes are joined to said first electrode, and
wherein said second and third electrodes are joined to said first semiconductor electrode with an insulating layer sandwiched therebetween.

7. An optical pickup apparatus that irradiates a light beam onto an optical recording medium and detects the light beam returned from the optical recording medium, comprising
a semiconductor laser apparatus,
said semiconductor laser apparatus comprising
a first semiconductor laser device having a first emission point emitting a light beam having a first wavelength in a direction substantially parallel to a first direction,
a second semiconductor laser device having a second emission point emitting a light beam having a second wavelength different from a natural number times said first wavelength in the direction substantially parallel to the first direction, and
a third semiconductor laser device having a third emission point emitting a light beam having a third wavelength substantially equal to a natural number times said first wavelength in the direction substantially parallel to the first direction,
the distance between said first emission point and said third emission point being shorter than at least one of the distance between said first emission point and said second emission point and the distance between said second emission point and said third emission point on a first plane perpendicular to said first direction, and
wherein said second and third semiconductor laser devices are joined to said first semiconductor laser device, and further comprising
first and second photodetectors, and
an optical system that introduces the light beam having said first, second, or third wavelength emitted from said semiconductor laser apparatus to said optical recording medium and introduces the light beam having said first, second, or third wavelength returned from said optical recording medium to said first or second photodetector.

8. The optical pickup apparatus according to claim 7, wherein
said optical system comprises
a diffraction grating that transmits the light beams respectively having said first, second, and third wavelengths so as to introduce the light beams having said first and third wavelengths to said first and second photodetectors respectively and introduce the light beam having said second wavelength to one of said first and second photodetectors.

9. The optical pickup apparatus according to claim 7, wherein said semiconductor laser apparatus is arranged such that the axis of the light beam having said first wavelength emitted from said first semiconductor laser device coincides with the optical axis of said optical system.

10. An optical pickup apparatus that irradiates a light beam onto an optical recording medium and detects the light beam returned from the optical recording medium, comprising
a semiconductor laser apparatus,
said semiconductor laser apparatus comprising
a first semiconductor laser device having a first emission point emitting a light beam having a first wavelength in a direction substantially parallel to a first direction,
a second semiconductor laser device having a second emission point emitting a light beam having a second wavelength different from a natural number times said first wavelength in the direction substantially parallel to the first direction, and
a third semiconductor laser device having a third emission point emitting a light beam having a third wavelength substantially equal to a natural number times said first wavelength in the direction substantially parallel to the first direction,
the distance between said first emission point and said third emission point being shorter than at least one of the distance between said first emission point and said second emission point and the distance between said second emission point and said third emission point on a first plane perpendicular to said first direction, and
wherein said second and third semiconductor laser devices are joined to said first semiconductor laser device, and further comprising
a diffraction grating that transmits the light beams respectively having said first, second and third wavelengths so as to pass the light beams of given wavelengths selectively.

11. An optical pickup apparatus that irradiates a light beam onto an optical recording medium and detects the light beam returned from the optical recording medium, comprising
a semiconductor laser apparatus,
said semiconductor laser apparatus comprising
a first semiconductor laser device having a first emission point emitting a light beam having a first wavelength in a direction substantially parallel to a first direction, a second semiconductor laser device having a second emission point emitting a light beam having a second wavelength different from a natural number times said first wavelength in the direction substantially parallel to the first direction, and a third semiconductor laser device having a third emission point emitting a light beam having a third wavelength substantially equal to a natural number times said first wavelength in the direction substantially parallel to the first direction, the distance between said first emission point and said third emission point being shorter than at least one of the distance between said first emission point and said second emission point and the distance between said second emission point and said third emission point on a first plane perpendicular to said first direction, further comprising first and second photodetectors, and an optical system that introduces the light beam having said first, second, or third wavelength emitted from said semiconductor laser apparatus to said optical recording medium and introduces the light beam having said first, second, or third wavelength returned from said optical recording medium to said first or second photodetector.

* * * * *